(12) United States Patent
Tanabe et al.

(10) Patent No.: US 9,224,730 B2
(45) Date of Patent: *Dec. 29, 2015

(54) SEMICONDUCTOR DEVICE

(71) Applicant: DENSO CORPORATION, Kariya, Aichi-pref. (JP)

(72) Inventors: Hiromitsu Tanabe, Nukata-gun (JP); Kenji Kouno, Gifu (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/468,602

(22) Filed: Aug. 26, 2014

(65) Prior Publication Data
US 2014/0361334 A1   Dec. 11, 2014

Related U.S. Application Data

(63) Continuation of application No. 13/805,740, filed as application No. PCT/JP2011/003718 on Jun. 29, 2011, now Pat. No. 8,847,276.

(30) Foreign Application Priority Data

Jul. 1, 2010   (JP) .................................. 2010-151235
Jun. 23, 2011  (JP) .................................. 2011-139567

(51) Int. Cl.
  *H01L 27/06*   (2006.01)
  *H01L 29/739*  (2006.01)
  (Continued)

(52) U.S. Cl.
  CPC ........ *H01L 27/0664* (2013.01); *H01L 27/0722* (2013.01); *H01L 29/4236* (2013.01);
  (Continued)

(58) Field of Classification Search
  CPC ....... H01L 27/06; H01L 27/07; H01L 29/739; H01L 29/423; H01L 29/66; H01L 27/082; H01L 29/74; H01L 29/7395; H01L 29/4236; H01L 27/0664
  USPC ......... 257/140, 143, 133, 139, 577, 328, 107, 257/368, 369, 256, 423, 427
  See application file for complete search history.

(56) References Cited

U.S. PATENT DOCUMENTS 6,204,717 B1   3/2001   Nagasu et al.
6,552,413 B1   4/2003   Hirano et al.
(Continued)

FOREIGN PATENT DOCUMENTS

JP   06-196705 A   7/1994
JP   08-102536 A   4/1996
(Continued)

OTHER PUBLICATIONS

International Search Report of the International Searching Authority mailed Oct. 11, 2011 for the corresponding international application No. PCT/J132011/003718 (with English translation).
(Continued)

*Primary Examiner* — Chuong A Luu
(74) *Attorney, Agent, or Firm* — Posz Law Group, PLC

(57)   ABSTRACT

In a semiconductor device including an IGBT and a freewheeling diode W≥2×L1/K$^{1/2}$, where K≥2.5, W denotes a distance between the divided first regions, L1 denotes a thickness of the drift layer, k1 denotes a parameter that depends on structures of the insulated gate bipolar transistor and the freewheeling diode, and K denotes a value calculated by multiplying the parameter k1 by a ratio of a snapback voltage to a built-in potential between the deep well layer and the drift layer.

9 Claims, 38 Drawing Sheets

(51) Int. Cl.
  *H01L 29/66* (2006.01)
  *H01L 29/861* (2006.01)
  *H01L 27/07* (2006.01)
  *H01L 29/423* (2006.01)
  *H01L 29/06* (2006.01)

(52) U.S. Cl.
  CPC ...... *H01L29/66348* (2013.01); *H01L 29/7395* (2013.01); *H01L 29/7397* (2013.01); *H01L 29/861* (2013.01); *H01L 29/0696* (2013.01)

(56) References Cited

U.S. PATENT DOCUMENTS

| | | | | |
|---|---|---|---|---|
| 8,847,276 | B2* | 9/2014 | Tanabe et al. | 257/140 |
| 2005/0045960 | A1* | 3/2005 | Takahashi | 257/368 |
| 2007/0200138 | A1 | 8/2007 | Ozeki et al. | |
| 2008/0048295 | A1 | 2/2008 | Takahashi | |
| 2008/0315248 | A1 | 12/2008 | Tokura et al. | |
| 2009/0057832 | A1 | 3/2009 | Kouno | |
| 2009/0242931 | A1 | 10/2009 | Tsuzuki et al. | |
| 2009/0289276 | A1 | 11/2009 | Yoshiura et al. | |
| 2010/0156506 | A1 | 6/2010 | Tsuzuki et al. | |

FOREIGN PATENT DOCUMENTS

| | | |
|---|---|---|
| JP | 8-274310 A | 10/1996 |
| JP | 11-097715 A | 4/1999 |
| JP | 2007-258363 A | 10/2007 |
| JP | 2010-186805 A | 8/2010 |

OTHER PUBLICATIONS

Written Opinion of the International Searching Authority mailed Oct. 11, 2011 for the corresponding international application No. PCT/JP20111003718 (with English translation).

Office Action mailed May 19, 2015 in the corresponding JP application No. 2014-146907 (and English translation).

* cited by examiner

FIRST REGION
SECOND REGION
THIRD REGION

FIRST REGION
SECOND REGION
THIRD REGION (a)　　　　　　(b)　　　　　　(c)

(a)

(b)

(c)

SEMICONDUCTOR DEVICE

CROSS REFERENCE TO RELATED APPLICATIONS

This application is a continuation of application Ser. No. 13/805,740 filed on Dec. 20, 2012 now U.S. Pat. No. 8,847,276 which is a U.S. national stage application of PCT/JP2011/003718 filed on Jun. 29, 2011 and is based on Japanese Patent Application No. 2010-151235 filed on Jul. 1, 2010 and Japanese Patent Application No. 2011-139567 filed on Jun. 23, 2011, the contents of which are incorporated herein by reference.

TECHNICAL FIELD

The present invention relates to a semiconductor device having an insulated gate bipolar transistor (hereinafter referred to as the IGBT), which function as a switching element, and a freewheeling diode (hereinafter referred to as the FWD) integrated into one chip.

BACKGROUND

In the past, a semiconductor device having an IGBT, which functions as a switching element, and a FWD integrated into one chip has been employed in an inverter circuit or the like that performs direct-to-alternating current conversion. The direct-to-alternating current conversion is performed by turning ON and OFF the IGBT. In addition, when the IGBT is turned OFF, a current flowing into a load (for example, a motor) is circulated through the FWD.

In a FWD employed in such a semiconductor device, a characteristic of a forward current If with respect to a forward voltage Vf (hereinafter referred to as the Vf-If characteristic) at the time the IGBT remains OFF is linear. However, the Vf-If characteristic at the time the IGBT is turned ON has a nonlinear domain due to an effect of a snapback voltage. FIG. 6 is a diagram showing the Vf-If characteristic of the FWD. As shown in the drawing, when the IGBT is turned ON, compared with when the IGBT is OFF, the forward voltage Vf fluctuates. In addition, there is a domain in which the snapback voltage is generated. Therefore, linearity is not attained.

Specifically, assuming that a semiconductor device has an IGBT and a FWD that are formed into one chip, an equivalent circuit attained when the IGBT is turned ON can be illustrated as shown in FIG. 7. That is, a channel resistor Ra of an IGBT 100 and an internal resistor Rb from a channel to a pn junction (an under part of a p-type deep well layer 13) of a FWD 200, which is constructed with the p-type deep well layer 13 and a n$^-$-type drift layer 1, are connected in parallel with the FWD 200. Further, an internal resistor Rc of the n$^-$-type drift layer 1 in the under part of the p-type deep well layer 13 and an internal resistor Rd of a field stop (hereinafter referred to as the FS) layer 1a are connected in series with the channel resistor Ra and internal resistor Rb. In this type of circuit, when the IGBT 100 is turned on, a current flows to the channel side of the IGBT 100 rather than to the diode side due to the small internal resistor Rb. Therefore, conductivity modulation does not occur so that the forward voltage Vf can increase.

Therefore, in the semiconductor device including the IGBT 100 and the FWD 200, gate control is performed in such a manner that a gate voltage is not applied to the IGBT 100 during operation of the FWD 200. In order to determine the operation of the FWD 200, diode sensing is performed. For accurate sensing, a linear Vf-If characteristic is required.

Therefore, there is need to perform the diode sensing by avoiding the nonlinear domain susceptible to the snapback voltage. That is, the sensing can be applied only in a domain where the forward voltage Vf is large.

The patent document 1 proposed a method of reducing an increase in Vf by increasing the width of a p-type base region 4 that does not have a gate structure.

PRIOR ART DOCUMENT

Patent Document

Patent document 1: JP-A-2008-53648

SUMMARY

However, when a region that acts as the FWD 200 is widened, the region of the IGBT 100 is reduced. This causes a problem in that an ON loss of the IGBT 100 increases.

In view of the above, it is an object of the present invention to provide a semiconductor device for reducing an ON loss of an IGBT while improving a linearity of a Vf-If characteristic of a FWD.

In order to achieve the above object, according to an aspect of the present invention, a semiconductor device includes a cell region and a peripheral region. The cell region has a freewheeling diode and a vertical insulated gate bipolar transistor surrounded by the freewheeling diode, and the peripheral region has a peripheral dielectric-strength structure that surrounds the cell region.

The semiconductor device includes a first conductivity type drift layer, a second conductivity type collector region located on a back side of the drift layer in the cell region and peripheral region, a first conductivity type cathode region located on the back side of the drift layer in the cell region at a position where the collector region is not located, a second conductivity type base region located in a superficial part of a front side of the drift layer in the cell region at positions where the insulated gate bipolar transistor and the freewheeling diode are located, a first conductivity type emitter region located in a superficial part of the base region, a gate insulating film located on a surface of the base region between the emitter region and the drift layer, a gate electrode located on the gate insulating film, a second conductivity type deep well layer located in the superficial part of the front side of the drift layer in the cell region at the position where the freewheeling diode is located, the deep well layer located to surround a periphery of the base region and connected to the base region, the deep well layer being deeper than the base region and having an impurity concentration greater than that of the base region, an upper electrode electrically connected to the emitter region, the base region, and the deep well layer, and a lower electrode electrically connected to the collector region and the cathode region.

The gate structure comprises a plurality of gate structures. The emitter region is not formed in at least one region between the plurality of gate structures to define a first region and a second region. The emitter region is formed in the first region so that the first region acts as the insulated gate bipolar transistor. The emitter region is not formed in the second region so that the second region acts as the freewheeling diode. A portion located to surround the insulated gate bipolar transistor is defined as a third region acting as the freewheeling diode. Each of the first region and the second region has a longitudinal direction parallel to the longitudinal direction of the gate structure.

The first region is divided in the longitudinal direction. The second region is located between the divided first regions. $W \geq 2 \times L1/K^{1/2}$, where $K \geq 2.5$. W denotes a distance between the divided first regions. L1 denotes a thickness of the drift layer. k1 denotes a parameter that depends on structures of the insulated gate bipolar transistor and the freewheeling diode. K denotes a value calculated by multiplying the parameter k1 by a ratio of a snapback voltage to a built-in potential between the deep well layer and the drift layer.

BRIEF DESCRIPTION OF THE DRAWINGS

FIG. 13 is a graph showing a relationship between a width W4 of a FWD 200 in a second region and a voltage VF (corresponding to a snapback voltage VSB) at which the FWD 200 starts to be turned ON;

DESCRIPTION OF THE EMBODIMENTS

Referring to the diagrams, embodiments of the present invention will be described below.

First Embodiment

Figure 1:
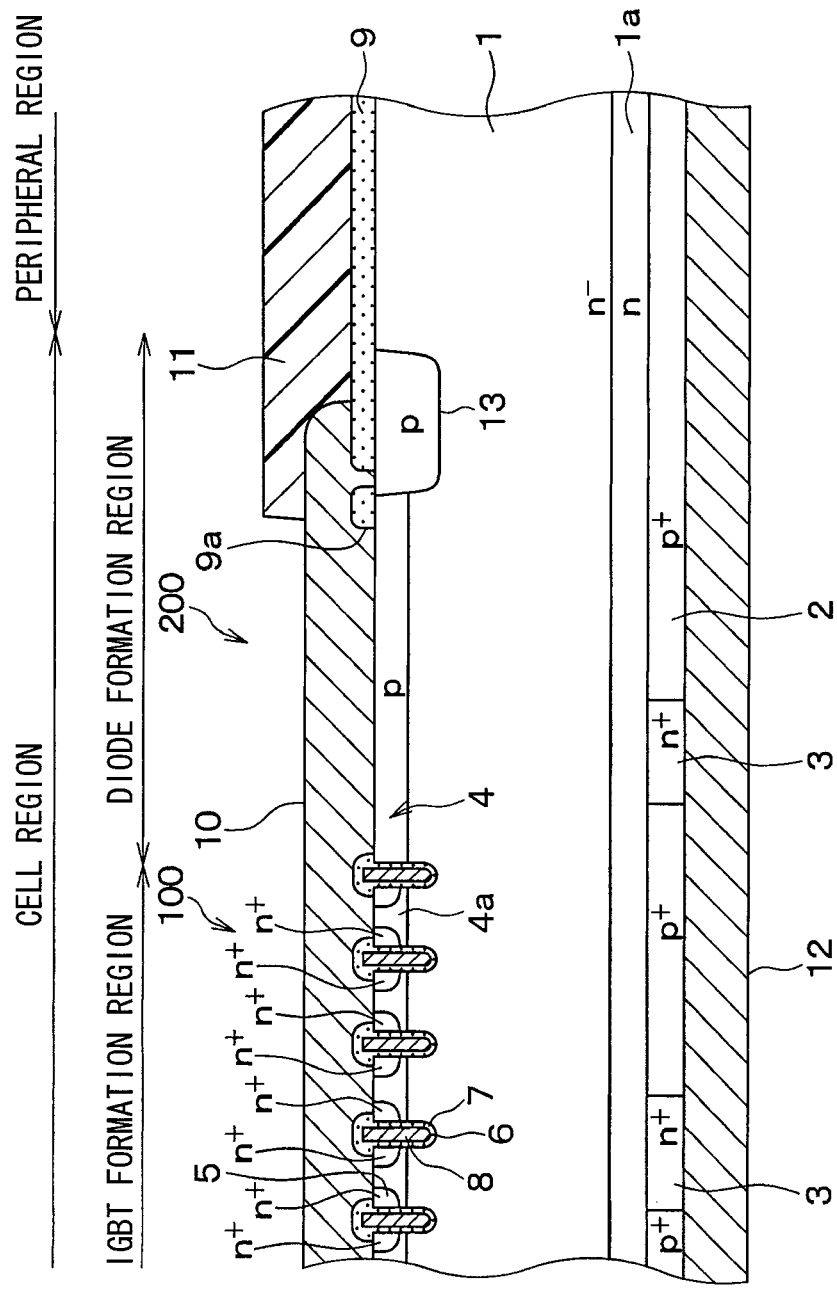
FIG. 1 is a cross-sectional diagram of a semiconductor device in accordance with a first embodiment of the present invention.
Figure 2:
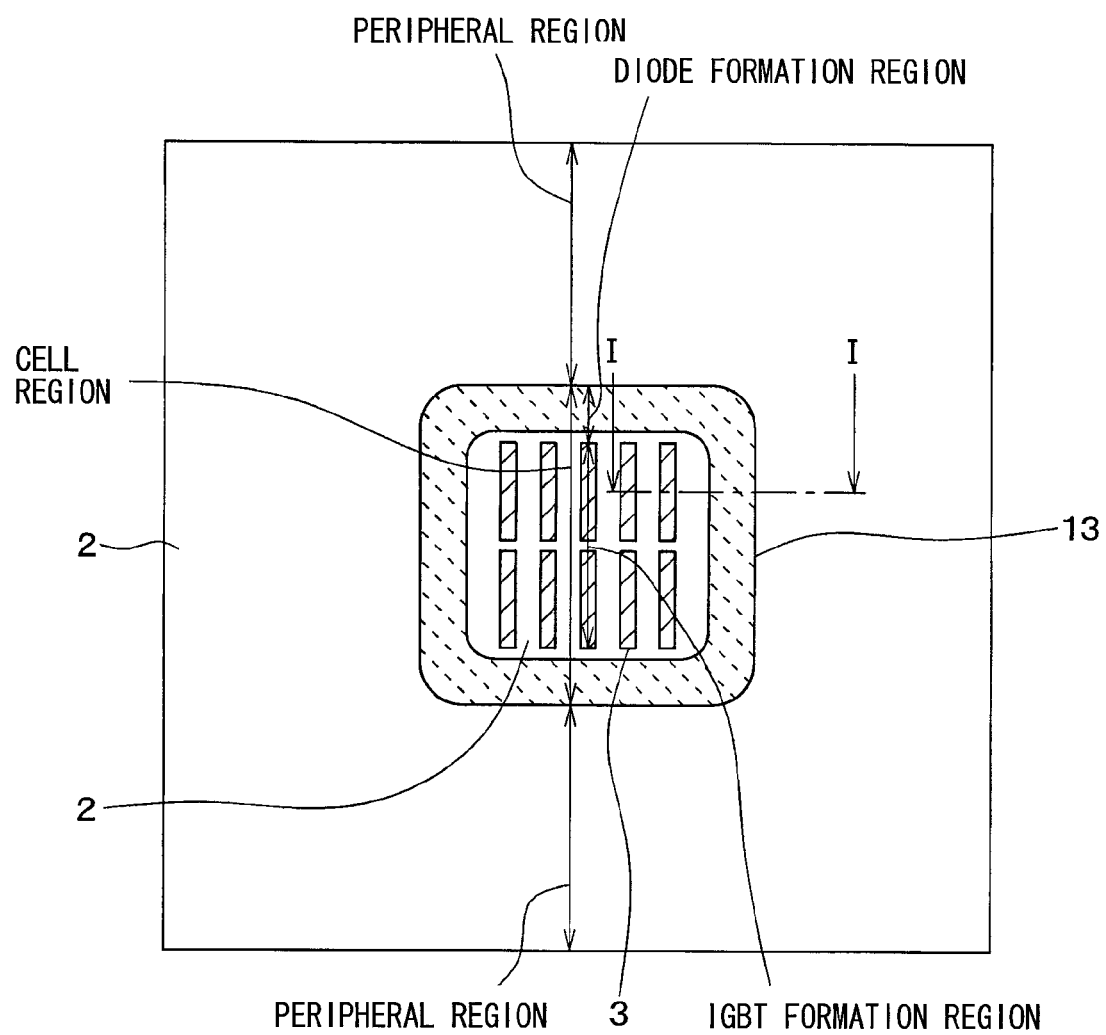
FIG. 2 is a top layout diagram of the semiconductor device shown in FIG. 1.

A first embodiment of the present invention will be described below. FIG. 1 is a cross-sectional diagram of a semiconductor device in accordance with the present embodiment, and FIG. 2 is a top layout diagram of the semiconductor device shown in FIG. 1. FIG. 1 corresponds to a cross-sectional diagram taken along the line I-I in FIG. 2. Referring to these diagrams, the semiconductor device of the present embodiment will be described below.

As shown in FIG. 1, in the semiconductor device of the present embodiment, an IGBT 100 and a FWD 200 are formed in a semiconductor substrate that provides a n$^-$-type drift layer 1 having an impurity concentration of, for example, from $1 \times 10^{13}$ to $1 \times 10^{14}$ cm$^{-3}$. As shown in FIG. 1 and FIG. 2, an IGBT formation region where the IGBT 100 is formed and a diode formation region where the FWD 200 is formed are included in a cell region, and a peripheral region is located on the periphery of the cell region. As shown in FIG. 2, the IGBT formation region is located in the center of a chip as the semiconductor device, and the diode formation region is located to surround the IGBT formation region so that the cell region can be structured. The peripheral region is located to surround the periphery of the cell region.

In the IGBT formation region and the diode formation region in the cell region, a FS layer 1a is formed in a superficial part of a n$^-$-type drift layer 1 on the back side of the n$^-$-type drift layer 1. The FS layer 1a is a n-type layer and has an impurity concentration higher than that of the n$^-$-type drift layer 1. The FS layer 1 improves performance concerning dielectric strength and a steady-state loss by preventing spread of a depletion layer and also controls the amount of holes injected from the bask side of the substrate.

Further, in the IGBT formation region and diode formation region in the cell region, a p$^+$-type impurity region 2 corresponding to a collector region and a n$^+$-type impurity regions 3 corresponding to a cathode region are formed in the superficial part of the FS layer 1a on the back side of the n$^-$-type drift layer 1. A p-type impurity such as boron is injected in the p$^+$-type impurity region 2. For example, the p$^+$-type impurity region 2 has an impurity concentration of from $1 \times 10^{17}$ to $1 \times 10^{20}$ cm$^{-3}$. A n-type impurity such as phosphorus is injected in the n$^+$-type impurity region 3. For example, the n$^+$-type impurity region 3 has an impurity concentration of from $1 \times 10^{19}$ to $1 \times 10^{21}$ cm$^{-3}$. The back side of the n$^-$-type drift layer 1 is almost entirely occupied by the p$^+$-type impurity region 2 and partially occupied by the n$^+$-type impurity region 3.

A region in FIG. 2 hatched with a solid line represents a region where the n$^+$-type impurity region 3 is formed. The other region represents a region where the p$^+$-type impurity region 2 is formed. A region in FIG. 2 hatched with a dashed line represents a region where a p-type deep well layer 13 is formed.

As shown in FIG. 2, the back side of the n$^-$-type drift layer 1 is almost entirely occupied by the p$^+$-type impurity region 2 and partially occupied by the n$^+$-type impurity region 3. According to the present embodiment, multiple n$^+$-type impurity regions 3, each of which has a shape like a strip, are arranged in the cell region in a stripe pattern. FIG. 2 shows five n$^+$-type impurity regions 3, each of which is divided in two in a vertical direction. However, in practice, more n$^+$-type impurity regions 3 are formed.

In the IGBT formation region in the cell region, a p-type base region 4 having a predetermined thickness is formed in the superficial part of the n$^-$-type drift layer 1. Multiple trenches 6 penetrate the p-type base region 4 and reach the n$^-$-type drift layer 1 so that the p-type base region 4 can be divided in multiple portions by the trenches 6. Specifically, the trenches 6 are formed at a predetermined pitch (interval). The trenches 6 are extended in parallel with one another in a depth direction in FIG. 1 (a direction perpendicular to the paper) to form a stripe structure. Ends of the extended trenches 6 may be joined together to form a ring structure. In the case of the ring structure, several ring structures formed by the trenches 6 are grouped as a set to form a multiple-ring structure. Adjacent multiple-ring structures are arranged in parallel with each other in their longitudinal direction.

The p-type base region 4 is divided into multiple portions by adjacent trenches 6. At least a part of the divided portions serves as a p-channel layer 4a that provides a channel region. A n$^+$-type impurity region 5 corresponding to an emitter region is formed in the superficial part of the p-channel layer 4a. According to the present embodiment, each of the divided portions of the p-type base region 4 serves as the p-channel layer 4a. Alternatively, a structure (hereinafter referred to as the spaced structure), where portions serving IGBTs are reduced, can be achieved by not forming the n$^+$-type impurity region 5 in some of the divided portions of the p-type base region 4.

The n$^+$-type impurity region 5 has a higher impurity concentration than the n$^-$-type drift layer 1 and is terminated inside the p-type base region 4. Further, the n$^+$-type impurity region 5 is in contact with a side surface of the trench 6.

Each trench 6 is filled with a gate insulating film 7 and a gate electrode 8. The gate insulating film 7 is formed on an inner wall surface of the trench 6. The gate electrode 8 is formed on a surface of the gate insulating film 7 and made of doped polysilicon or the like. The gate electrodes 8 are electrically connected to each other at a cross section different from that shown in FIG. 1 so that the same gate voltage can be applied to the gate electrodes 8. In this way, a trench gate structure is formed.

Further, the n$^+$-type impurity region 5 and the p-channel layer 4a are electrically connected to an upper electrode 10 through a contact hole 9a formed in an interlayer insulating film 9. The upper electrode 10 corresponds to an emitter electrode. The upper electrode 10 and a wiring are protected by a protection film 11. A lower electrode 12 is formed on the back side of the p$^+$-type impurity region 2 so that the IGBT 100 can be structured.

Like in the IGBT formation region, in the diode formation region in the cell region, the p-type base region 4 having a predetermined thickness is formed in the superficial part of the n$^-$-type drift layer 1. Further, a p-type deep well layer 13 whose junction depth is larger than that of the p-type base region 4 is formed so that the periphery of the p-type base region 4 can be surrounded by the p-type base region 4. The p-type deep well layer 13 has a higher impurity concentration than the p-type base region 4. For example, the impurity concentration of the p-type deep well layer 13 ranges from $1 \times 10^{18}$ to $1 \times 10^{19}$ cm$^{-3}$.

The p-type base region 4 and the p-type deep well layer 13 provide an anode. The n-type drift layer 1 and n$^+$-type impurity region 3 provides a cathode that forms a PN junction with the anode. In this way, the FWD 200 having a diode structure is formed. In the FWD 200, the upper electrode 10 as an anode electrode is electrically connected to the p-type deep well layer 13, and the lower electrode 12 as a cathode electrode is electrically connected to the n$^+$-type impurity region 3.

Thus, the IGBT 100 and the FWD 200 are connected in parallel with each other in one chip in such a manner that the emitter is electrically connected to the anode and that the collector is electrically connected to the cathode.

In the peripheral region, although not shown in the drawings, a p-type diffusion layer that is deeper than the p-type base region 4 is formed in the superficial part of the n$^-$-type drift layer 1 to surround the periphery of the cell region. Further, a p-type guard ring layer is formed as a multiple-ring structure to surround the periphery of the p-type diffusion layer. Thus, a peripheral dielectric-strength structure is formed in the peripheral region. The peripheral dielectric-strength structure allows a uniform electric field so that the dielectric strength of the semiconductor device can be improved.

As described above, according to the present embodiment, the IGBT 100 and the FWD 200 are integrated in the semiconductor device. For example, the semiconductor device is employed in a switching circuit such as an inverter circuit that performs direct-to-alternating current conversion. The IGBT 100 functions as a switching element, and the FWD 200 functions as a circulating element that feeds a circulation current when the IGBT 100 is turned OFF.

The p-type base region 4 and p-type deep well layer 13 in the diode formation region function as an anode so that the FWD 200 can operate as a diode. However, since the deep p-type deep well layer 13 acting as the anode is deep, there is a possibility that the amount of holes injected from the p-type deep well layer 13 may be increased. As a result, the tolerance of the FWD 200 may be degraded.

Figure 3:
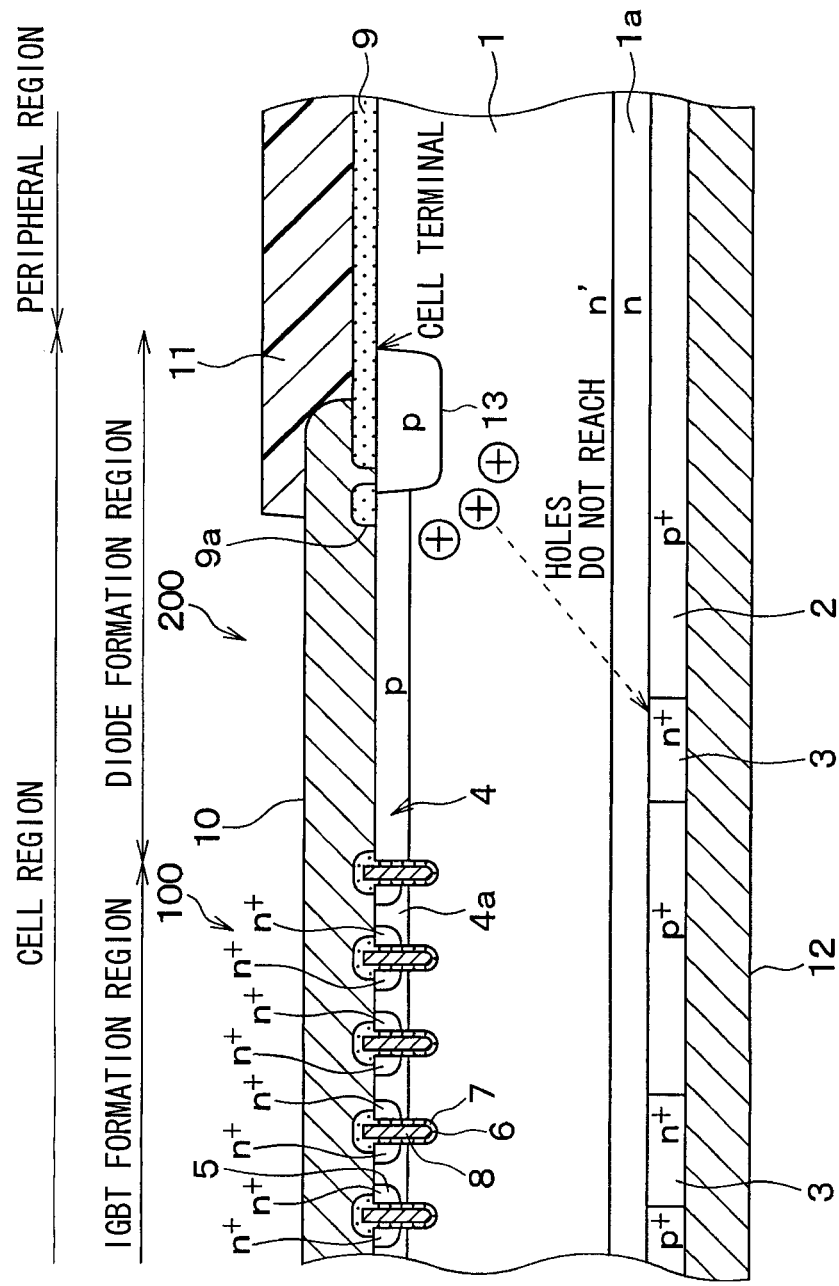
FIG. 3 is a cross-sectional diagram of a semiconductor device showing a relationship between a carrier lifetime τ and a distance from a p-type deep well layer 13 to a $n^+$-type impurity region 3.

As can be seen from the cross-sectional diagram of the semiconductor device shown in FIG. 3, if a distance from the p-type deep well layer 13 to the n$^+$-type impurity region 3 is long, holes injected from a cell terminal part, that is, holes injected from a portion of the p-type deep well layer 13 near the outer edge of the cell region cannot not reach in terms of a carrier lifetime $\tau$. As a result, the area, which substantially acts as an anode, is reduced. Therefore, components are designed so that the area substantially acting as the anode can be enlarged while maintaining the tolerance of the FWD 200 by limiting the amount of holes injected from the deep p-type deep well layer 13. The design will be described below.

Figure 4:
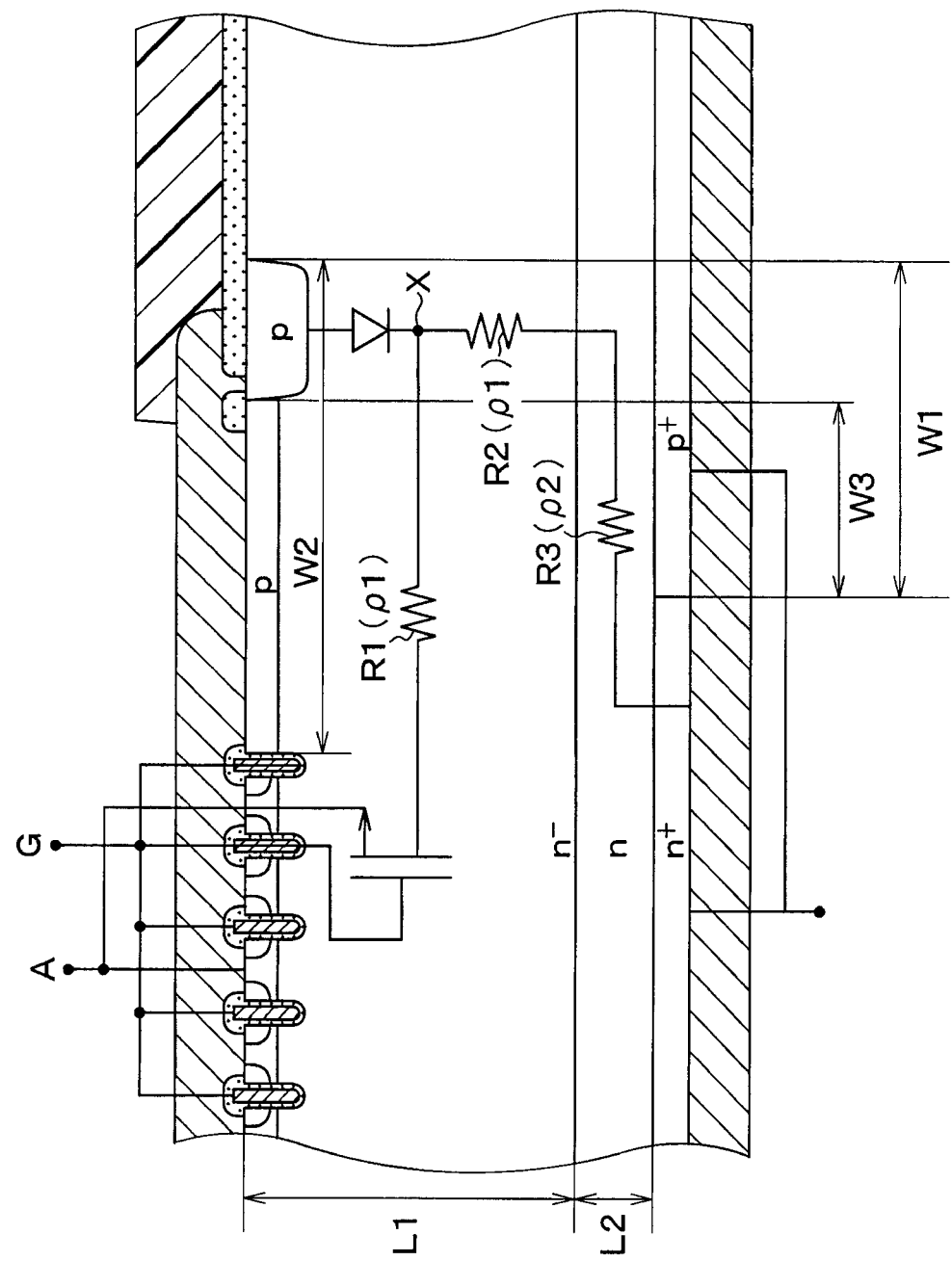
FIG. 4 is a cross-sectional diagram in which an equivalent circuit observed when a diode of the semiconductor device shown in FIG. 1 operates is schematically depicted.
Figure 5:
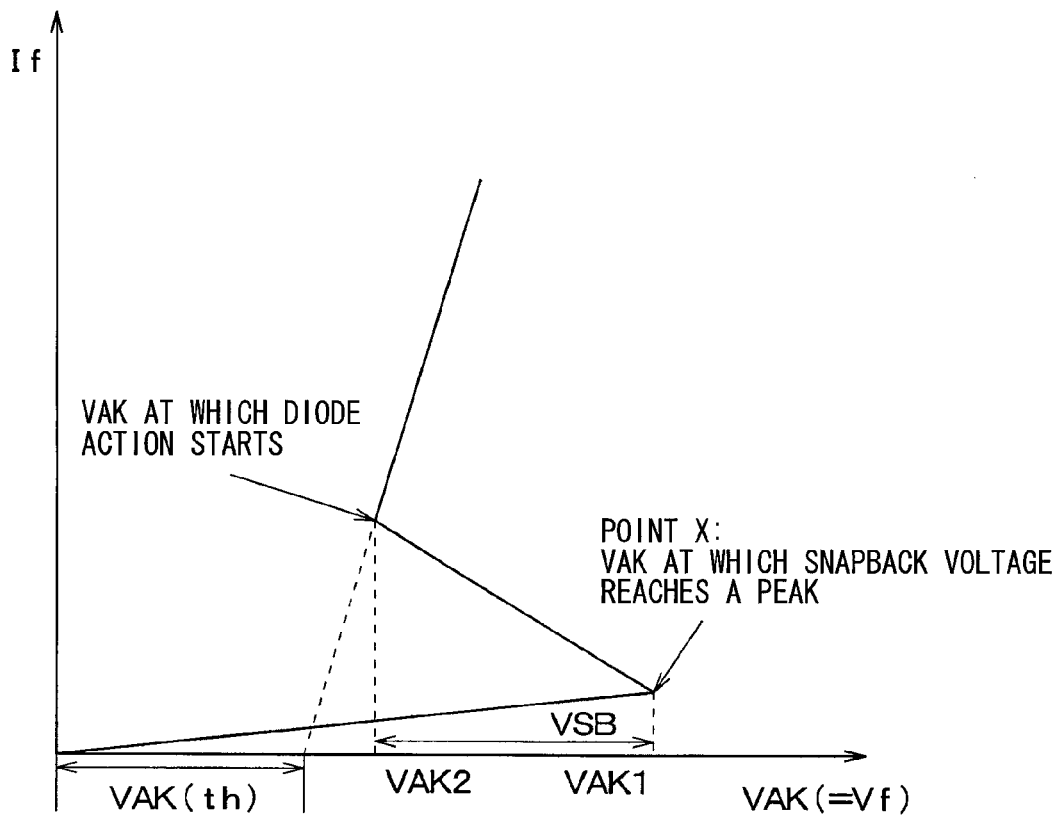
FIG. 5 is a diagram showing a characteristic of the semiconductor device shown in FIG. 1 concerning a forward current If with respect to an anode-cathode voltage VAK (hereinafter referred to as the VAK-If characteristic)
Figure 6:
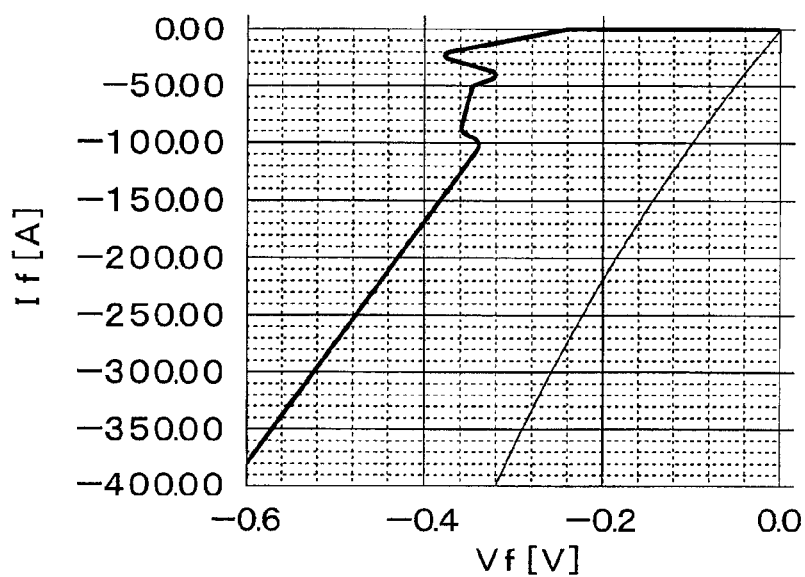
FIG. 6 is a diagram showing a Vf-If characteristic of a FWD.
Figure 7:
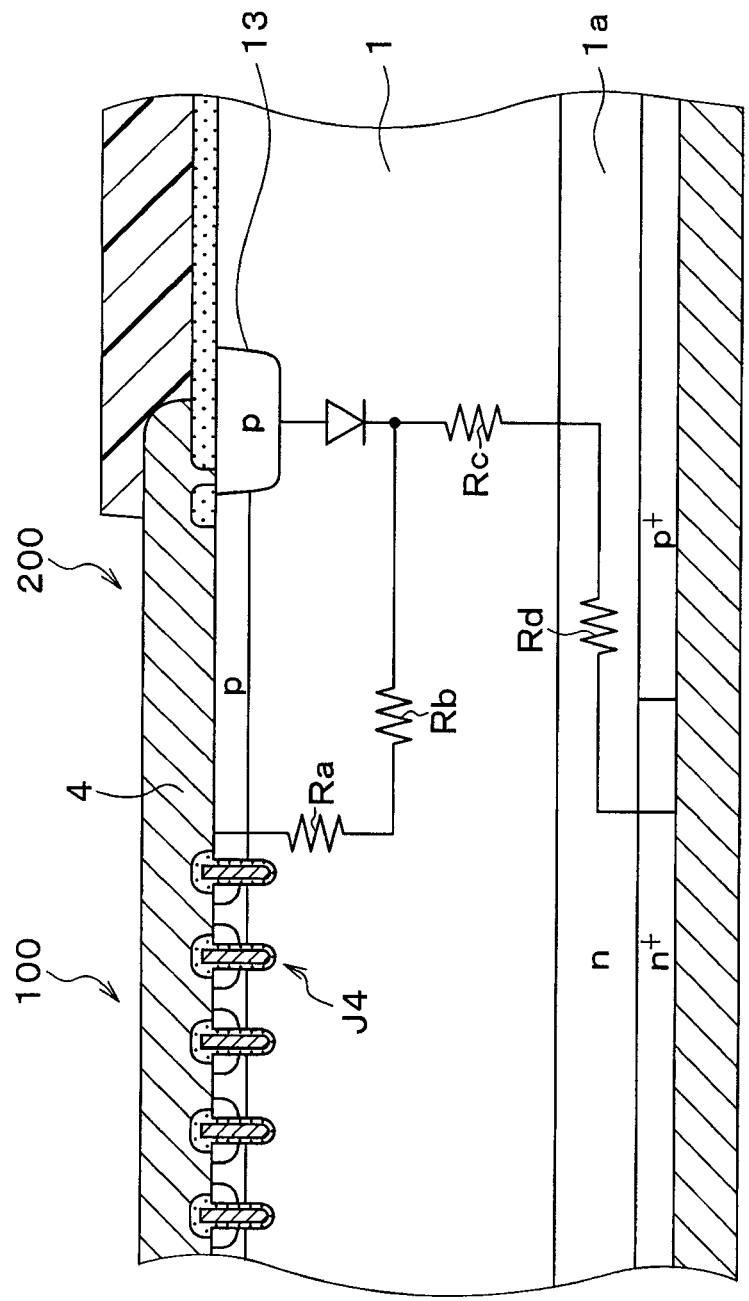
FIG. 7 is an equivalent circuit diagram observed when an IGBT is turned ON in a semiconductor device having the IGBT and a FWD that are formed in one chip.

FIG. 4 is a cross-sectional diagram in which an equivalent circuit observed when the semiconductor device shown in FIG. 1 performs a diode action is schematically depicted. FIG. 5 is a diagram showing a VAK-If characteristic of the semiconductor device shown in FIG. 1. An anode-cathode voltage VAK is equivalent to a forward voltage Vf of the FWD 200. Therefore, the characteristic shown in FIG. 5 corresponds to the Vf-If characteristic of the FWD 200.

The equivalent circuit for the IGBT 100 and the FWD 200 is shown in FIG. 4. Specifically, an internal resistor R1 (resistivity $\rho1$) of the n$^-$-type drift layer 1 in its lateral direction is connected to the collector of the IGBT 100. The internal resistor R1 and an node between the emitter and the collector of the IGBT 100 are connected in parallel with the FWD 200. Further, an internal resistor R2 (resistivity $\rho1$) of the n$^-$-type drift layer 1$a$ in its longitudinal direction and an internal resistor R3 (resistivity $\rho2$) of the FS layer 1$a$ in the lateral direction are connected in series with the FWD 200. W1 is defined as a distance from a boundary between the n$^+$-type impurity region 3 and the p$^+$-type impurity region 2 to a position, where a peripheral-region-side end of the deep well layer 13 is projected, on the back side of the n$^-$-type drift layer 1. W2 is defined as a distance from an end of the p-type base region 4 acting as the FWD 200 (a boundary between the IGBT 100 and the FWD 200 within the p-type base region 4 (the side wall of the outermost trench 5)) to the peripheral-region-side end of the deep well layer 13. W3 is defined as a distance from the boundary between the n$^+$-type impurity region 3 and the p$^+$-type impurity region 2 to a position, where a boundary between the p-type base region 4 and the p-type deep well layer 13 is projected, on the back side. L1 is a defined as a thickness of the n$^-$-type drift layer 1. L2 is defined as a thickness of the FS layer 1$a$.

From the VAK-If characteristic shown in FIG. 5, VAK1 is defined as the anode-cathode voltage VAK observed when a snapback voltage reaches a peak, and VAK2 is defined as the anode-cathode voltage VAK observed when the FWD 200 starts to perform a diode action. An intercept observed when a straight line is drawn from a point at which the VAK-If characteristic becomes linear indicates a built-in potential between the p-type deep well layer 13 and n$^-$-type drift layer 1, that is, indicates a theoretical voltage necessary for the diode action. VAK(th) is defined as the built-in potential.

Based on the above, the following relational expression is established. As indicated by a formula 1, the snapback voltage VSB is expressed as a difference between VAK1 and VAK2.

$$VSB=VAK1-VAK2 \quad \text{(Formula 1)}$$

As for VAK1 observed when the snapback voltage VSB reach a peak, it is necessary for the FWD 200 to perform a diode action. Therefore, the following formulas can be derived based on the potential at a point X in FIG. 4. In the formulas below, I denotes a current that flows from the IGBT 100 through the internal resistors R1 and R2 of the n$^-$-type drift layer 1 and the internal resistor R3 of the FS layer 1$a$. In the formulas below, a channel resistance of the IGBT 100 is ignored because it is very small.

$$Vth=I \cdot R1 \quad \text{(Formula 2)}$$

$$I=VAK1 \cdot (R1/(R1+R2+R3)) \quad \text{(Formula 3)}$$

$$VAK1=VAK(th) \cdot ((R1+R2+R3)/R1) \quad \text{(Formula 4)}$$

The built-in potential VAK(th) between the p-type deep well layer 13 and the n$^-$-type drift layer 1 is given by the following formula because it is nearly equal to the voltage VAK2 observed when the FWD 200 starts to perform a diode action.

$$VAK2 \approx VAK(th) \quad \text{(Formula 5)}$$

The following formula can be given by substituting the formula 5 and the formula 4 into the formula 1.

$$VSB \approx ((R2+R3)/R1) \cdot VAK(th). \quad \text{(Formula 6)}$$

Since R1 to R3 are respectively expressed as R1=W2·$\rho1$/L1, R2=$\rho1$·L1/W2, and R3=W1·$\rho2$/L2, the formula 6 can be rewritten into the following formula.

$$VSB \approx ((L1 \cdot \rho1/W2+W1 \cdot \rho2/L2)/(W2 \cdot \rho1/L1))VAK(th) \quad \text{(Formula 7)}$$

Here, assume that k1 denotes a first parameter depending on the structures of the IGBT 100 and FWD 200, such as, the shapes of the IGBT 100 and FWD 200 or concentrations with respect to VSB/VAK(th), and K denotes a value (=k1·VSB/VAK(th)) obtained by multiplying VSB/VAK(th), which is the ratio of the snapback voltage VSB to the built-in potential VAK(th), by the first parameter. The built-in potential VAK (th) is a constant value. As the snapback voltage VSB becomes smaller, the nonlinearity becomes smaller so that the linearity can be more improved. Therefore, as K becomes smaller, the linearity can be more improved. For this reason, when a relationship indicated by the following formula is satisfied, the linearity can be improved.

$$K \geq ((L1 \cdot \rho1/W2 + W1 \cdot \rho2/L2)/(W2 \cdot \rho1/L1)) \quad \text{(Formula 8)}$$

A condition for W2 required for the peripheral-region-side end of the p-type deep well layer 13 to act as a diode unsusceptible to a bias applied to the gate can be obtained according to the following formulas 9 and 10 on the basis of the formula 8. Since the resistivity ρ2 of the FS layer 1a is much smaller than the resistivity ρ1 of the n⁻-type drift layer 1, it is considered that $W1 \cdot \rho2 \approx 0$.

$$K \geq ((L1 \cdot \rho1/W2)/(W2 \cdot \rho1/L1)) = L1^2/W2^2 \quad \text{(Formula 9)}$$

$$W2 \geq L1/K^{1/2} \quad \text{(Formula 10)}$$

Figure 8:
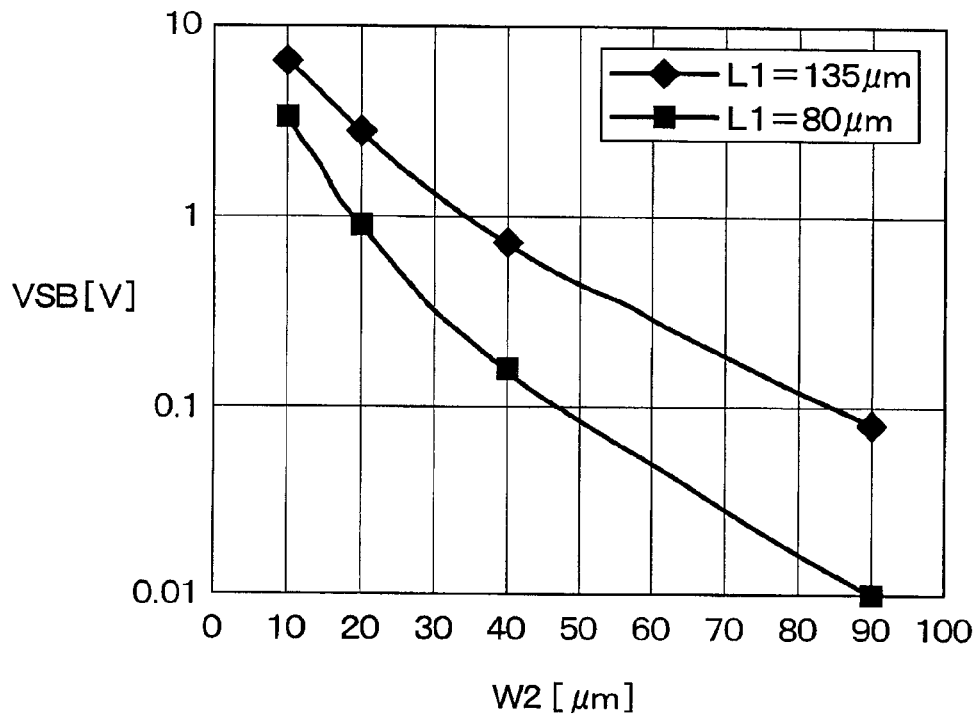
FIG. 8 is a diagram showing a result of a Sim analysis on a relationship between a snapback voltage VSB and a distance W2.

In order to make the snapback voltage at the peripheral-region-side end equal to or lower than 0.1V, which can be ignored with respect to VAK(th)=0.8V at −40° C., K≥2.5 is necessary based on FIG. 8 that shows the results of an experiment. Specifically, as shown in FIG. 8, assuming that L1=135 μm is adopted, the snapback voltage becomes 0.1V when W2=85 μm is established. When L1=135 μm and W2=85 μm are substituted into the formula 9, K≥2.5 is obtained. Likewise, assuming that L1=80 μm is adopted, the snapback voltage becomes 0.1V when W2=50 μm is established. When L1=80 μm and W2=50 μm are substituted into the formula 9, K≥2.56 is obtained. Thus, these results demonstrate that when K≥2.5 is satisfied, the snapback voltage can become 0.1V or less. The Sim analysis shown in FIG. 8 is performed under condition that W1=0 μm, L2>0, and W3 is set to an arbitrary value.

Figure 9:
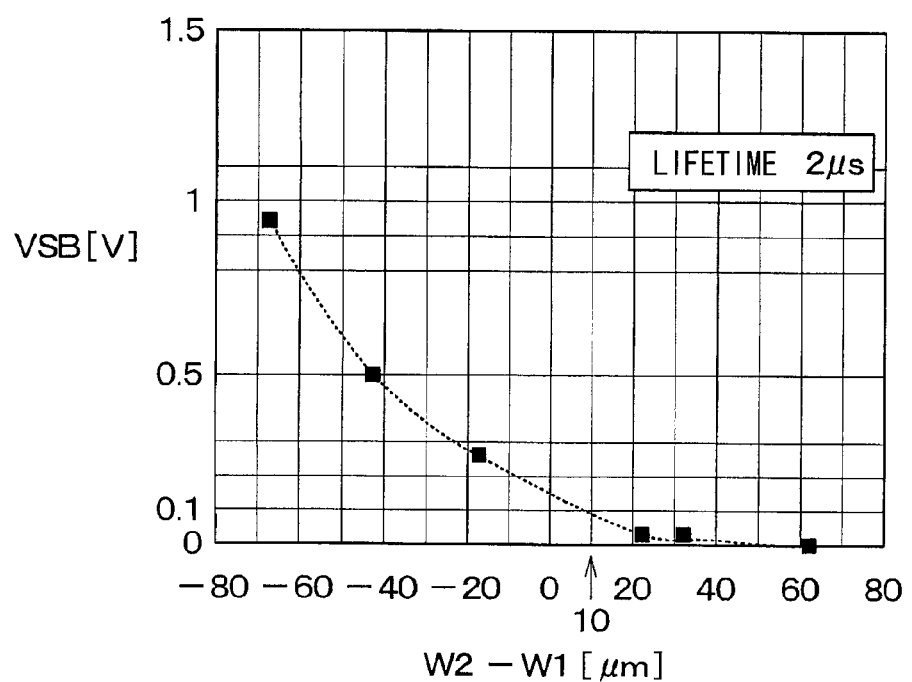
FIG. 9 is a diagram showing a result of a Sim analysis on a relationship between the snapback voltage VSB and a distance W2-W1.
Figure 10:
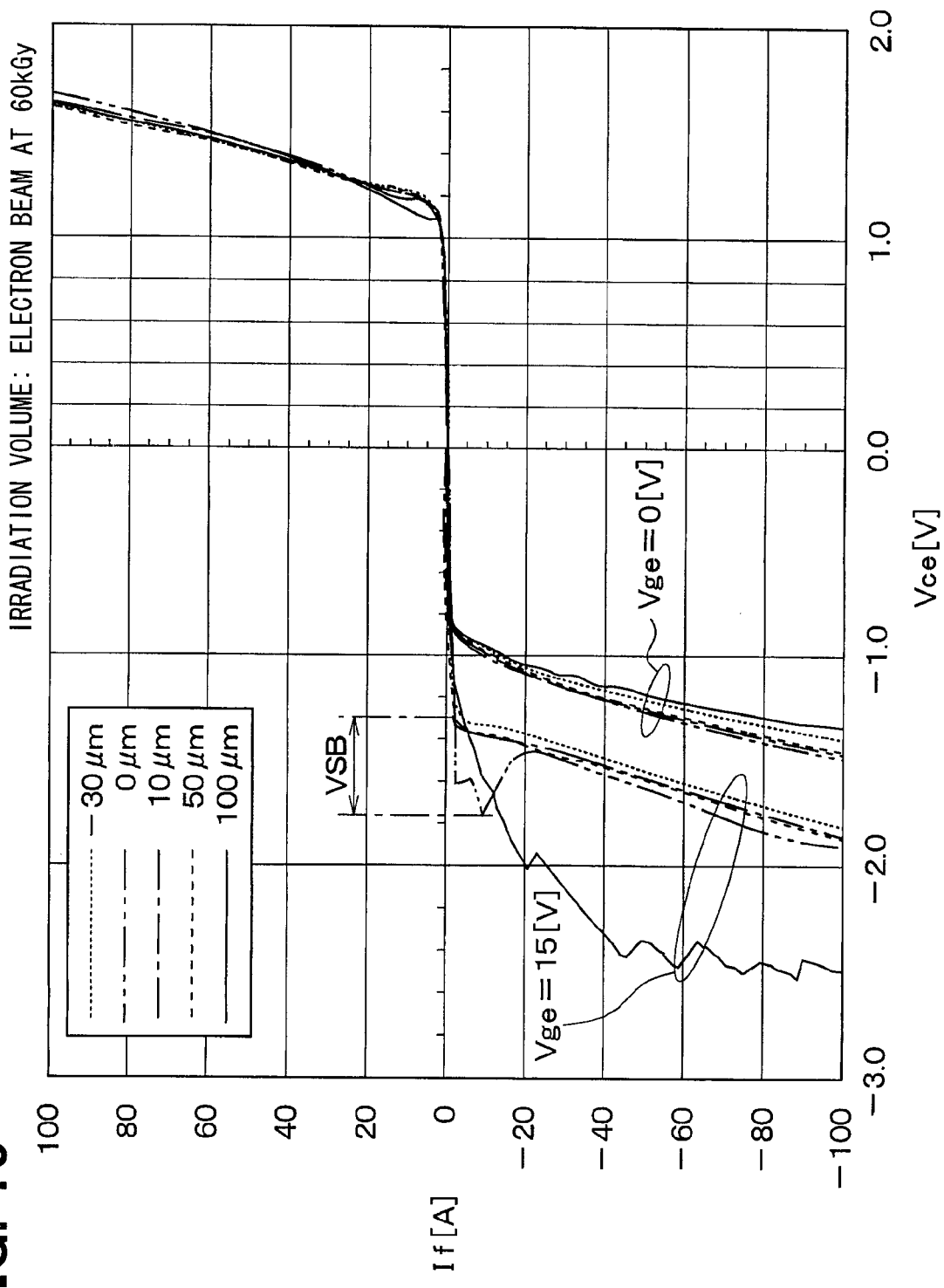
FIG. 10 is a diagram showing a result of a measurement in which a Vce-If characteristic of the semiconductor device shown in FIG. 1 is measured under a condition that electron beam is irradiated at 60 kGy.

Even when W2 satisfies the formula 10, if W1 is large or the lifetime is short, holes injected from the peripheral-region-side end of the deep well layer 13 do not reach the n⁺-type impurity regions 3 serving as a cathode. As a result, an effective W2 becomes short (R1 becomes small) so that a snapback can occur. A relationship between W1, W2, and the snapback voltage VSB has been investigated based on the assumption that the lifetime is 2 μs. FIG. 9 shows the results of the Sim analysis. FIG. 10 is a diagram showing a result of a measurement in which a Vce-If characteristic of the semiconductor device according to the present embodiment is measured under a condition that electron beam is irradiated at 60 kGy. In the drawing, a portion of Vce that juts out in a negative direction is referred to as the snapback voltage VSB. The snapback voltage VSB in the drawing is read out and plotted to draw FIG. 9.

In order to make the snapback voltage VSB equal to or lower than 0.1V, which can be ignored with respect to Vak(th) of 0.8V at −40° C., the following formula is derived from FIG. 9. The experiment shown in FIG. 9 is conducted under a condition that L1=125 μm, W2=85 μm, and L2=1 μm, and W3 is set to an arbitrary value.

$$W2 - W1 \geq 10 \mu m \quad \text{(Formula 11)}$$

As for the distance W3, as shown in FIG. 3, assuming that holes are injected in an oblique direction from the p-type deep well layer 13 toward the boundary position between the p⁺-type impurity region 2 and n⁺-type impurity region 3, the aforesaid shortest distance has to be much larger than a diffusion length so that even if an injection volume gets large, breakdown can be prevented. Therefore, the following formula 12 is established based on the Pythagorean theorem indicated with a triangle relationship shown in FIG. 3. A formula 13 can be obtained by rewriting the formula 12. D denotes a carrier diffusion coefficient in the n⁻-type drift layer 1, and k2 denotes a second parameter depending on the structure of the p-type deep well layer 13 such as the depth, the concentration, the tolerance, or the like.

$$W3^2 + L1^2 \geq k2 \cdot D\tau^{1/2} \quad \text{(Formula 12)}$$

$$W3 \geq ((k2 \cdot (D\tau)^{1/2})^2 - L1^2)^{(1/2)} \quad \text{(Formula 13)}$$

As for the distances W1 to W3, when consideration is taken into miniaturization of the semiconductor device, the smallest value that satisfies the above formula is preferred. W1-W3 is preferably a large value from the viewpoint of dielectric strength. Therefore, the distances should preferably have a relationship permitting establishment of formulas below.

$$W2 = L1/K^{1/2},$$

$$W2 - W1 = 10 \mu m, \text{ and}$$

$$W3 = ((k2 \cdot (D\tau)^{1/2})^2 - L1^2)^{(1/2)} \quad \text{(Formulas 14)}$$

In the semiconductor device of the present embodiment, the distances W1, W2, and W3 are set to satisfy the formulas 14.

As mentioned above, according to the present embodiment, in the semiconductor device having the IGBT 100 and the FWD 200, the p-type base region 4 and the p-type deep well layer 13 in the diode formation region serves an anode so that a diode action can be performed.

The distance W1, which is the distance from the boundary between the n⁺-type impurity region 3 and the p⁺-type impurity region 2 to the position, where the peripheral-region-side end of the deep well layer 13 is projected, on the back side of the n⁻-type drift layer 1, and the distance W3, which is the distance from the end of the p-type base region 4, which acts as the FWD 200, to the peripheral-region-side end of the p-type deep well layer 13, are set to satisfy the formulas 14.

Accordingly, while a decrease in the tolerance of the FWD 200 due to the increase in the amount of holes injected from the p-type deep well layer 13 occurring when the deep p-type deep well layer 13 acts as an anode is reduced, the holes injected from the portion of the p-type deep well layer 13 near the outer edge of the cell region can reach. Thus, a reduction in the area substantially serving as an anode can be reduced.

Second Embodiment

A second embodiment of the present invention will be described below. The present embodiment adopts a structure making it possible to improve the Vf-If characteristic of a FWD even in a place different from the place described in the first embodiment. The others are the same as those of the first embodiment. Only the difference from the first embodiment will be described below.

Figure 11:
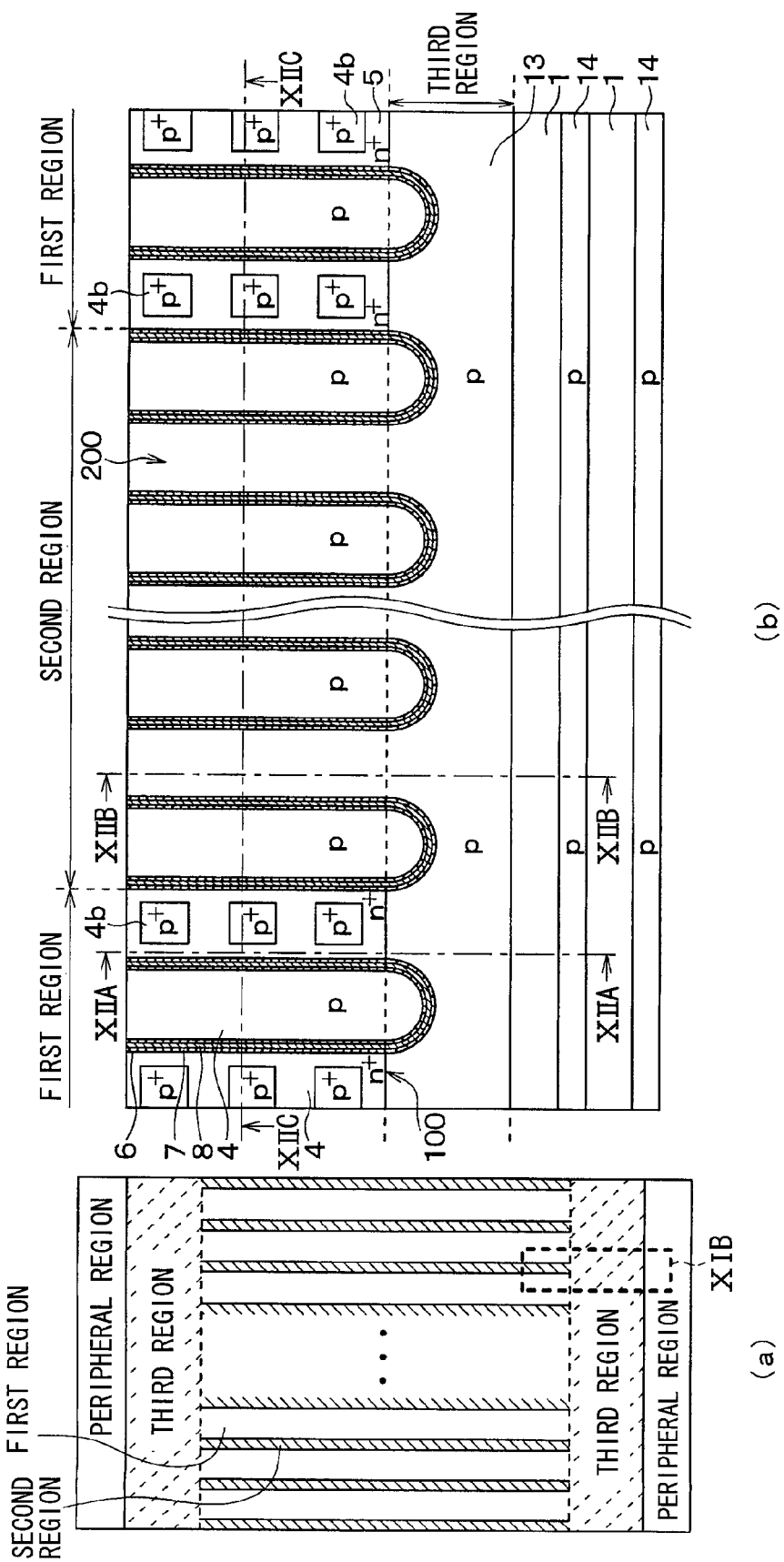
FIG. 11(a) is a top layout diagram of a semiconductor device in accordance with a second embodiment of the present invention.
FIG. 11(b) is a partial enlarged diagram of a region XIB in FIG. 11(a)
Figure 12:
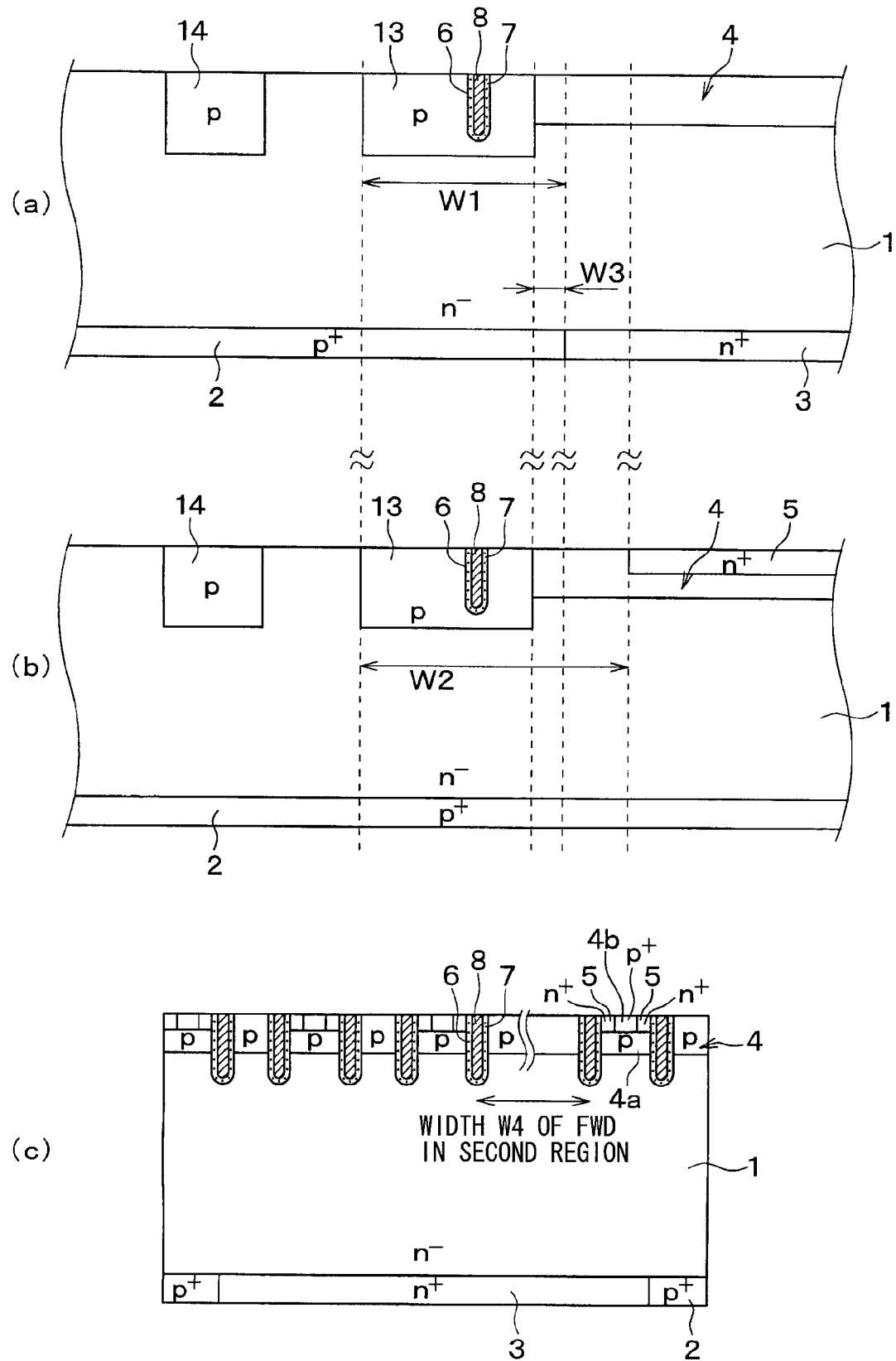
FIG. 12(a)-12(c) are cross-sectional diagrams taken along the lines XIIA-XIIA, XIIB-XIIB, and XIIC-XIIC shown in FIG. 11(b), respectively.

FIG. 11(a) is a top layout diagram of a semiconductor device in accordance with the present embodiment, and FIG. 11(b) is a partly enlarged diagram of a region XIB in FIG. 11(a). FIG. 11(a) and FIG. 11(b) are not cross-sectional diagrams, but are partly hatched for easy understanding. FIG. 12(a) to FIG. 12(c) are cross-sectional diagrams taken along the lines XIIA-XIIA, XIIB-XIIB, and XIIC-XIIC in FIG. 11(b), respectively. However, for clarification of the cross-sectional structures of regions, FIG. 12(c) is provided as a diagram in which the cross-section taken along the line XIIC-XIIC in FIG. 11(b) is further extended in order to include more cells. In the semiconductor device of the present embodiment, a contact region 4b is formed in the superficial part of a p-type channel region 4a, and electrical connection to the upper electrode 10 is made through the contact region 4b. The basic structure is the same as that of the first embodiment.

As shown in FIG. 11(a) and FIG. 11(b), the semiconductor device of the present embodiment includes first to the third regions in the peripheral region. The first region is defined as a region where the n$^+$-type impurity region 5 corresponding to an emitter region is formed on the side surface of the trench 6. Thus, the first region acts as the IGBT 100. The second region is defined as a region located adjacent to the first region. The n$^+$-type impurity region 5 corresponding to an emitter region is not formed in the second region so that the second region can act as the FWD 200. The third region is defined as a region, where the p$^+$-type impurity region 2 is formed, located at the end of the trench gate structure in the longitudinal direction (i.e., defined as a region in the outer edge of the cell region where the FWD 200 is formed). The third region is located closer to the end of the trench gate structure than the peripheral region where a p-type guard ring layer 14 is formed.

Even at the end of the gate electrode 8, an issue of the linearity of the Vf-If characteristic of FWD 200 takes place. Therefore, sizes of portions of the FWD 200 constructed with the p-type base region 4 and the p-type deep well layer 13 in the third region are specified in the same manner as described in the first embodiment.

Specifically, even in the present embodiment, as shown in FIGS. 12(a) and 12(b), W1 denotes the distance from the boundary between the n$^+$-type impurity region 3 and the p$^+$-type impurity region 2 to the position, where the peripheral-region-side end of the deep well layer 13 is projected, on the back side of the n$^-$-type drift layer 1. W2 denotes the distance from the end of the p-type base region 4 acting as the FWD 200 (the boundary between the IGBT 100 and the FWD 200 within the p-type base region 4 (the end of the n$^+$-type impurity region 5 corresponding to an emitter region)) to the peripheral-region-side end of the deep well layer 13. W3 denotes the distance from the boundary between the n$^+$-type impurity region 3, corresponding to a cathode region, and the p$^+$-type impurity region 2, corresponding to the collector region, to the position, where the boundary between the p-type base region 4 and the p-type deep well layer 13 is projected, on the back side. L1 denotes the thickness of the n$^-$-type drift layer 1.

Even at the end of the trench gate structure in the semiconductor device, the p-type base region 4 and p-type deep well layer 13 are hopefully made long in order to increase an internal resistance. However, if they are too long, holes injected from the p-type deep well layer 13 near the outer edge of the cell region cannot reach the n$^+$-type impurity region 3. Therefore, W1 to W3 are set to satisfy the relationship expressed by the formulas 10, 11, and 13 in the first embodiment, or preferably, to satisfy the formulas 14, so that the linearity of the Vf-If characteristic of FWD 200 can be improved.

As shown in FIG. 12(c), the first and second regions provide the spaced structure where the n$^+$-type impurity region 5 corresponding to an emitter region is not formed. Because of the spaced structure, the reduced portion is allowed to perform a diode action so that the FWD 200 can be formed between adjacent trench gate structures.

Figure 13:
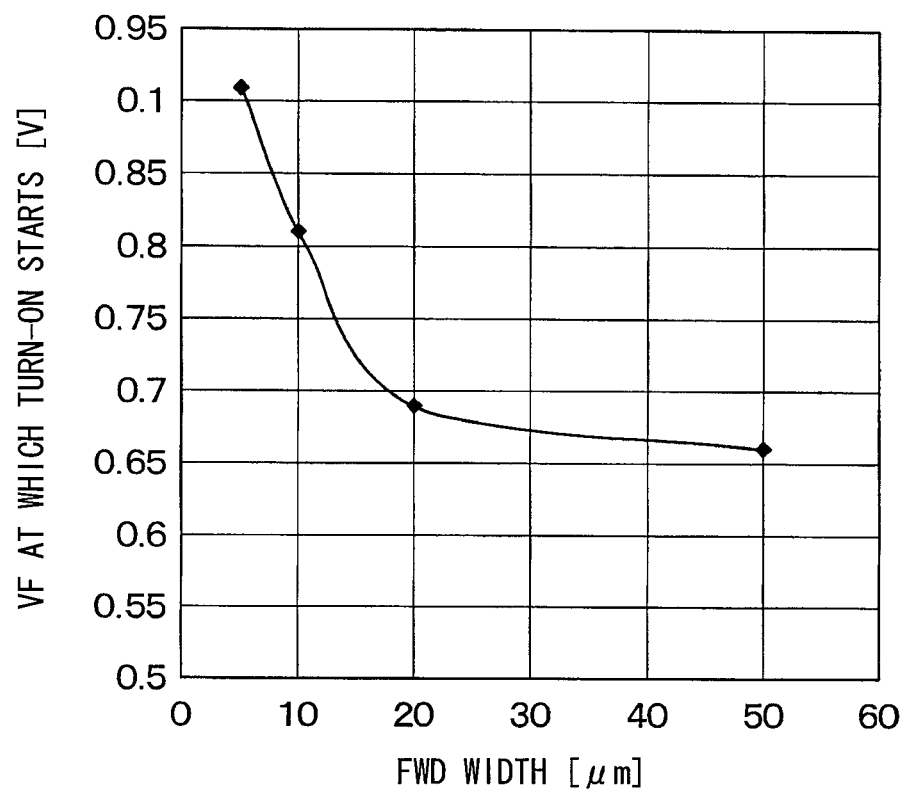

In the spaced structure, assuming that a width W4 of the FWD 200 in the second region is a distance between the outermost trench gate structures between which only the p-type base region 4 is formed without the n$^+$-type impurity region 5, the width W4 is set to satisfy W4≥20 μm. FIG. 13 is a graph indicating the relationship of the width W4 of the FWD 200 in the second region to a voltage VF (corresponding to a snapback voltage VSB) at which the FWD 200 starts to be turned ON. As shown in the drawing, if the width W4 of the FWD 200 in the second region exceeds 20 μm, the voltage VF at which the FWD 200 starts to be turned ON abruptly rises. Based on this result, the width W4 of the FWD 200 in the second region is set equal to or larger than 20 μm. Accordingly, the ON-voltage of the FWD 200 can be reduced. However, if control is implemented so that a voltage can be applied to a gate immediately before or during a SW action for the purpose of reducing a recovery (SW) loss of the FWD, the SW loss may be reduced by setting the width W4 to satisfy W4<20 μm. Even in this case, when W1 to W3 are set to satisfy the conditions of the present embodiment, the linearity of the FWD can be improved, and an abrupt rise in Vf due to a snapback can be reduced.

As mentioned above, even at the end of the trench gate structure, when W1 to W3 satisfy the relationship expressed by the formulas 10, 11, and 13 described in the first embodiment, or preferably, the formulas 14, the linearity of the Vf-If characteristic of FWD 200 can be improved. Further, by reducing the distance between the third region and second region, a current density, which is increased when the third region is turned ON, is efficiently transmitted to the second region so that the linearity can be improved. Further, when the width W4 of the FWD 200 in the second regions is equal to or larger than 20 μm, the ON-voltage of the FWD 200 can be reduced.

Third Embodiment

The third embodiment of the present invention will be described below. The present embodiment adopts a structure in which while the linearity of the Vf-If characteristic of the FWD can be improved in a place different from the place described in the second embodiment, an ON-loss of the IGBT can be reduced. The others are the same as those of the second embodiment. Only the difference from the second embodiment will be described below.

Figure 14:
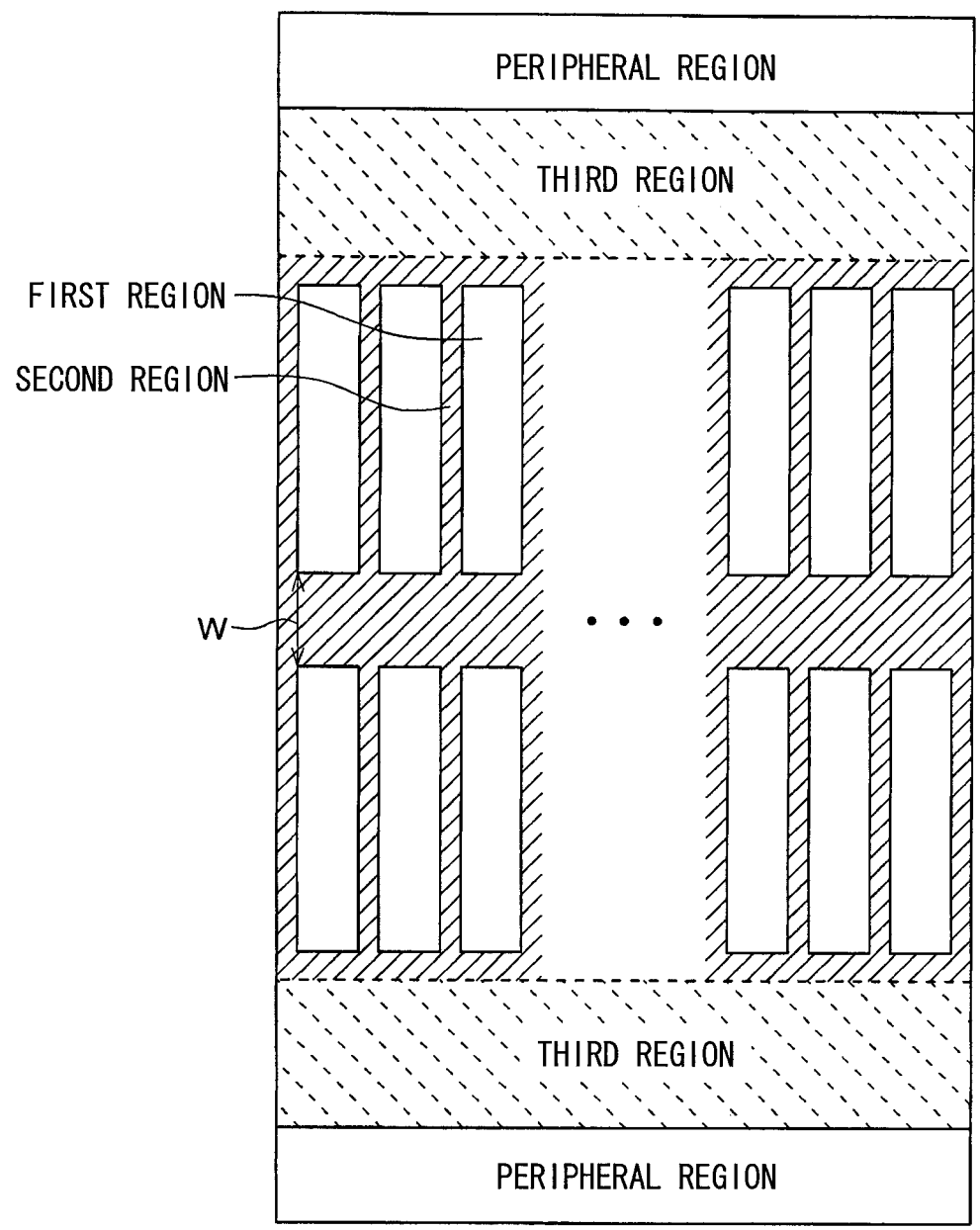
FIG. 14 is a top layout diagram of a semiconductor device in accordance with a third embodiment of the present invention.

FIG. 14 is a top layout diagram of a semiconductor device in accordance with the present embodiment. FIG. 14 is not a cross-sectional diagram, but is partly hatched for easy understanding. As shown in the drawing, the first region is divided into two in the longitudinal direction, that is, the n$^+$-type impurity region 5 corresponding to an emitter region is divided in two in the longitudinal direction. The n$^+$-type impurity region 5 is not formed between the divided first regions, and a region between adjacent trench gate structures is filled with the p-type base region 4 so that the FWD 200 can be formed.

As mentioned above, the first region can be divided in two in the longitudinal direction so that the FWD 200 may be formed between the divided first regions. In such an approach, the second region acting as a diode can be formed near the n$^+$-type impurity region 5 corresponding to an emitter region. Accordingly, the area of the FWD 200 increases, and this region plays an auxiliary role for the third region. Therefore, the current density of the FWD 200 can be efficiently improved. Eventually, a snapback voltage of the entire semiconductor device can be reduced.

When the first region is divided in the longitudinal direction, if the width W between the divided first regions is two or more times larger than W2 expressed by the formula 10, the region can be used instead of the third region at the end of the trench gate structure. In the present embodiment, the first region is divided in two in the longitudinal direction. Alternatively, the first region can be divided in three or more in the longitudinal direction.

Fourth Embodiment

The fourth embodiment of the present invention will be described below. The present embodiment is provided by modifying the layout of the first region and the second region in the second embodiment. The others are the same as those of the second embodiment. Only the difference from the second embodiment will be described below.

Figure 15:
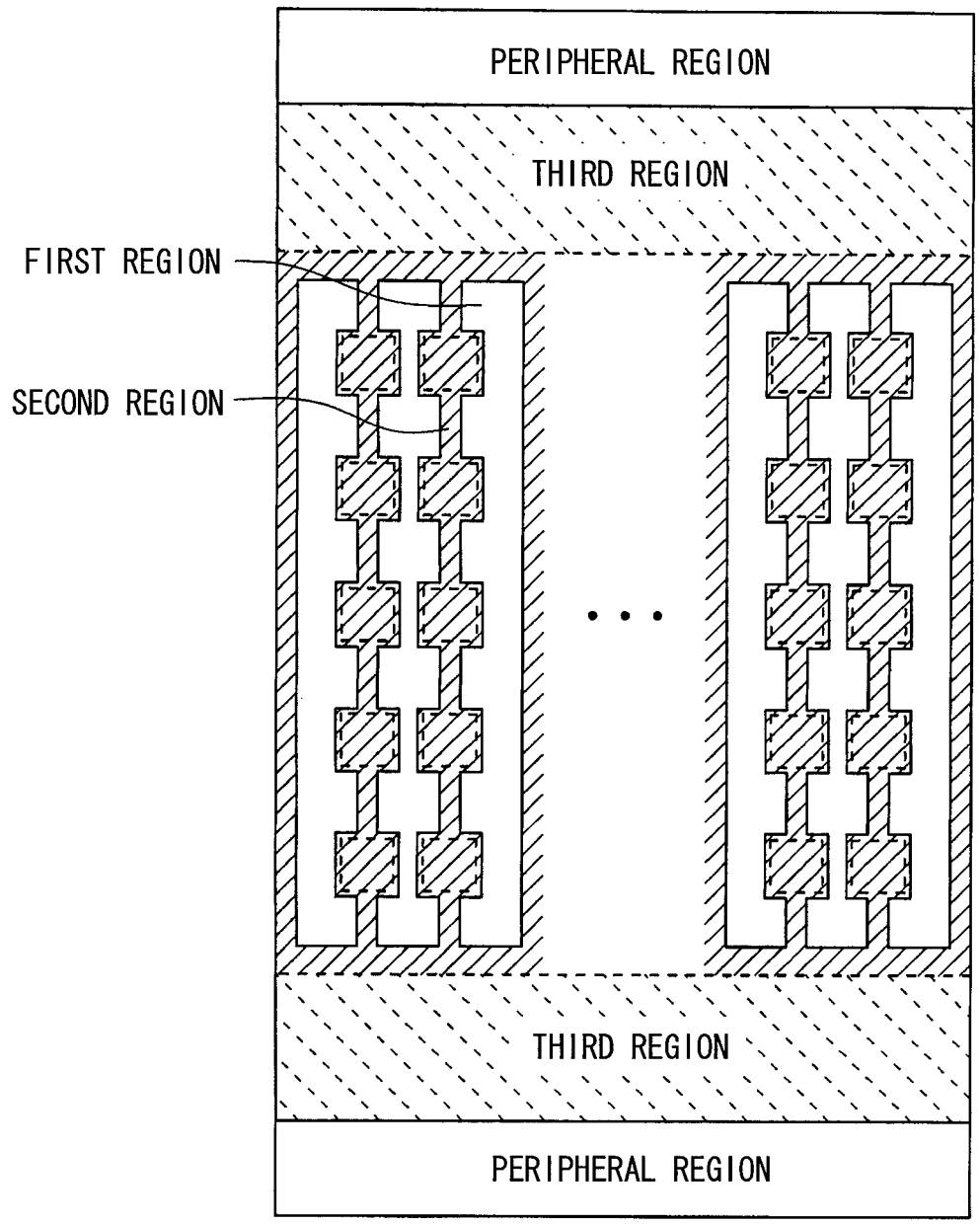
FIG. 15 is a top layout diagram of a semiconductor device in accordance with a fourth embodiment of the present invention.

FIG. 15 is a top layout diagram of a semiconductor device in accordance with the present embodiment. FIG. 14 is not a cross-sectional diagram, but is partly hatched for easy understanding. As shown in the drawing, part of the first regions that are arranged, specifically, the opposing sides of adjacent first regions are partially recessed to form a recess region enclosed by a broken line in the drawing. The $n^+$-type impurity region 5 corresponding to an emitter region is not formed in the recess region. In the present embodiment, the recess region is configured as the second region. That is, the width of the second region is partially enlarged between the first regions, unlike in the second embodiment where each first region has the same width and each second region has the same width.

Thus, since the width W4 of the second region is partially enlarged, the FWD 200 formed in the second region can easily perform a diode action. Thus, the area of the FWD 200 increases, and this region plays an auxiliary role for the third region, the current density of the FWD 200 can be more efficiently improved. Eventually, a snapback voltage of the entire semiconductor device can be reduced.

Fifth Embodiment

The fifth embodiment of the present invention will be described below. The present embodiment is also provided by modifying the layout of the first region and the second region in the second embodiment. The others are the same as those of the second embodiment. Only the difference from the second embodiment will be described below.

Figure 16:
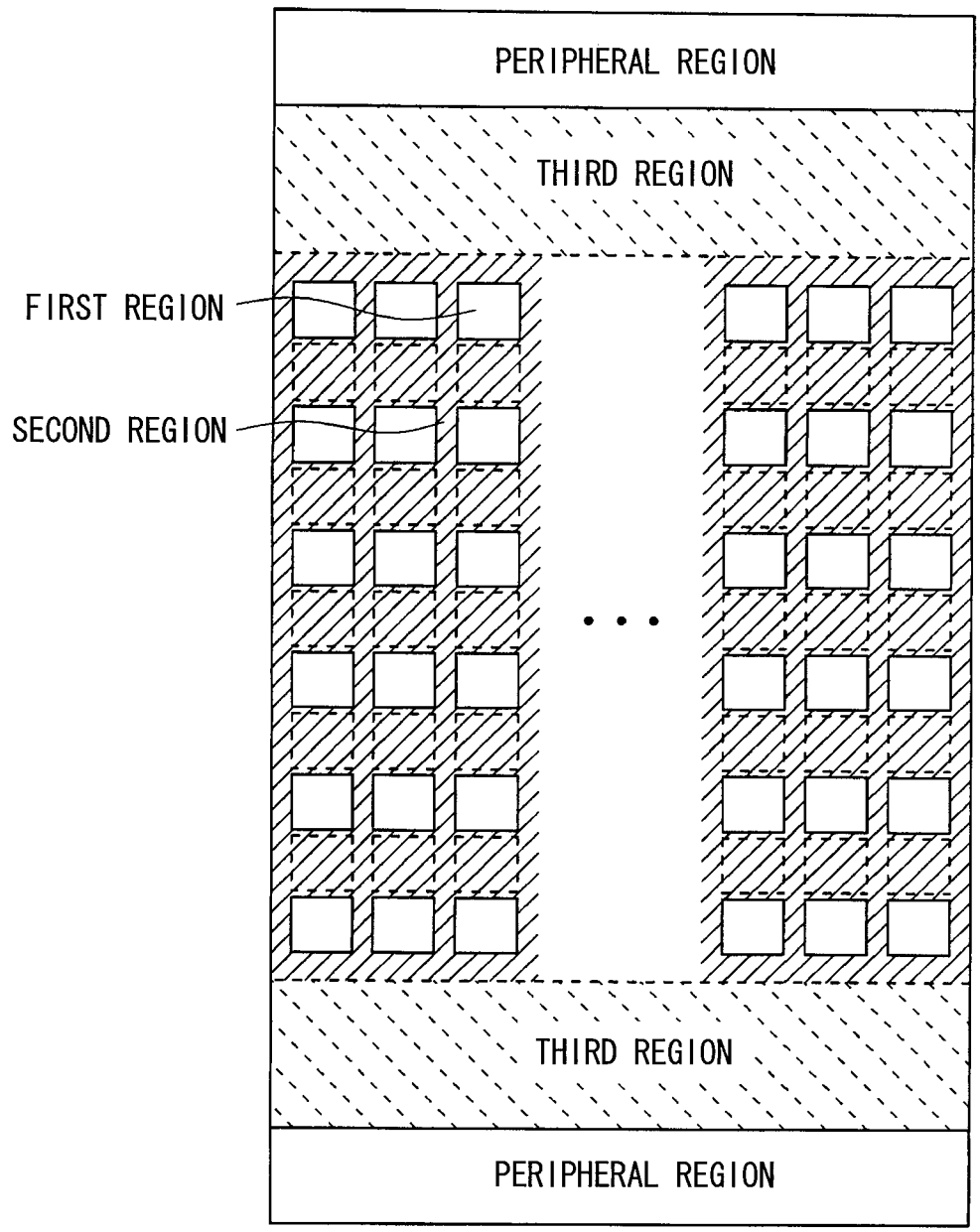
FIG. 16 is a top layout diagram of a semiconductor device in accordance with a fifth embodiment of the present invention.

FIG. 16 is a top layout diagram of a semiconductor device in accordance with the present embodiment. FIG. 16 is not a cross-sectional diagram, but is partly hatched for easy understanding. As shown in the drawing, a first region is divided into multiple portions in the up-and-down direction of the paper, that is, in the longitudinal direction of the trench gate structure. A region having almost the same dimension as the divided first region is located between the divided first regions and serves as the second region. Thus, the first regions are arranged in the form of a matrix. Specifically, assuming that the first regions arranged in the longitudinal direction of the trench gate structure is a column, multiple columns of the first regions are arranged in parallel. The first regions in adjacent columns are located to face each other. Even in this structure, the FWD 200 formed in the second region between the divided first regions can easily perform a diode action. Accordingly, since the area of the FWD 200 increases, and this region plays an auxiliary role for the third region, the current density of the FWD 200 can be more efficiently improved. Eventually, a snapback voltage of the entire semiconductor device can be reduced.

Sixth Embodiment

The sixth embodiment of the present invention will be described below. The present embodiment is provided by modifying the layout of the first region and the second region in the fifth embodiment. The others are the same as those of the fifth embodiment. Only the difference from the fifth embodiment will be described below.

Figure 17:
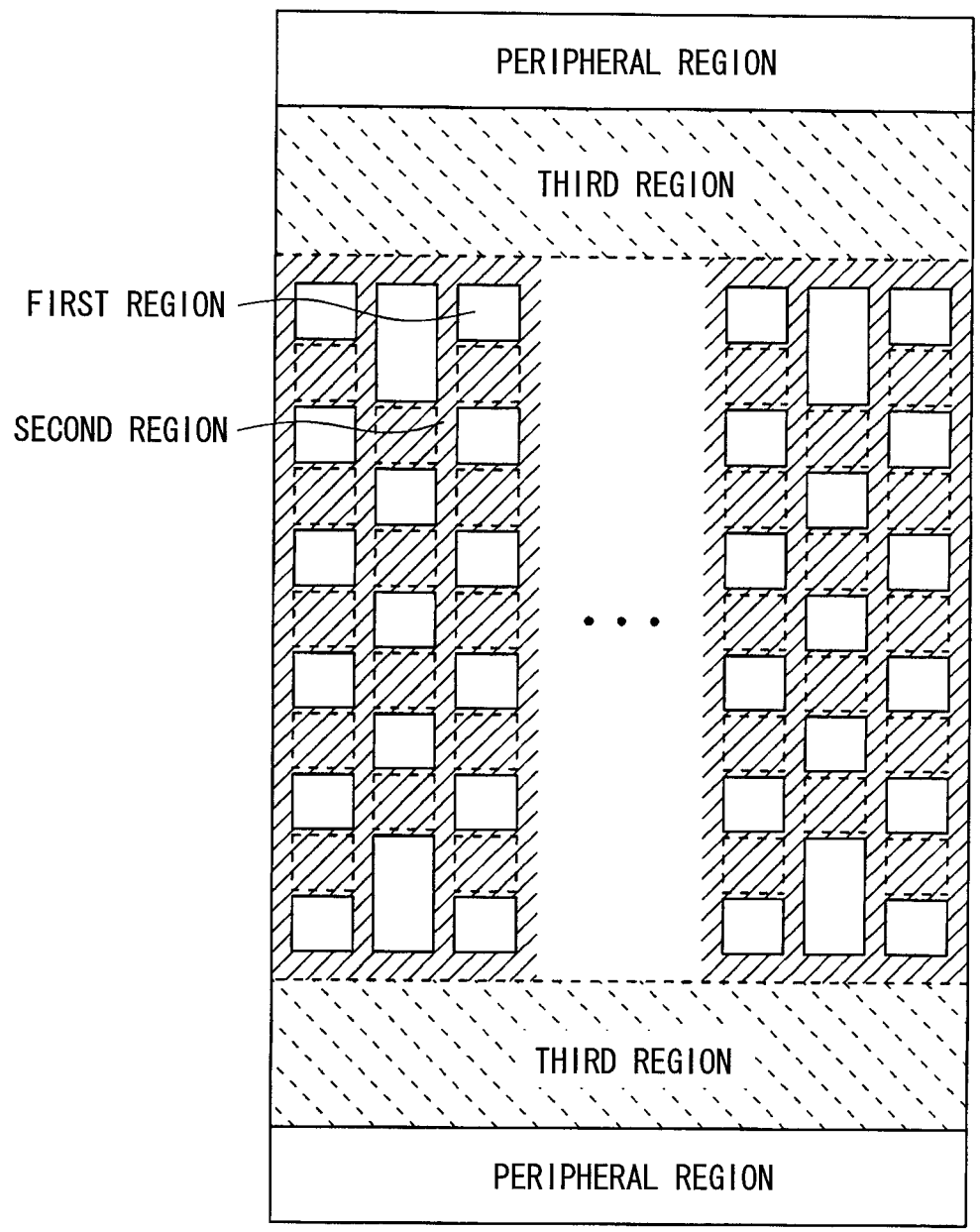
FIG. 17 is a top layout diagram of a semiconductor device in accordance with a sixth embodiment of the present invention.

FIG. 17 is a top layout diagram of a semiconductor device in accordance with the present embodiment. FIG. 17 is not a cross-sectional diagram, but is partly hatched for easy understanding. As shown in the drawing, even in the present embodiment, the first region is divided into multiple portions in the up-and-down direction of the paper, that is, in the longitudinal direction of the trench gate structure. A region having almost the same dimension as the divided first region is located between the divided first regions and serves as the second region. Assuming that the first regions arranged in the longitudinal direction of the trench gate structure is a column, multiple columns of the first regions are arranged in parallel. However, the first regions in adjacent columns are misaligned from each other. In other words, the first regions are arranged in a zigzag pattern. Even in this structure, the FWD 200 formed in the second region between the divided first regions can easily perform a diode action. Accordingly, since the area of the FWD 200 increases, and this region plays an auxiliary role for the third region, the current density of the FWD 200 can be efficiently improved. Eventually, a snapback voltage of the entire semiconductor device can be reduced.

Seventh Embodiment

The seventh embodiment of the present invention will be described below. The present embodiment is provided by modifying the layout of the first region and the second region in the sixth embodiment. The others are the same as those of the sixth embodiment. Only the difference from the sixth embodiment will be described below.

Figure 18:
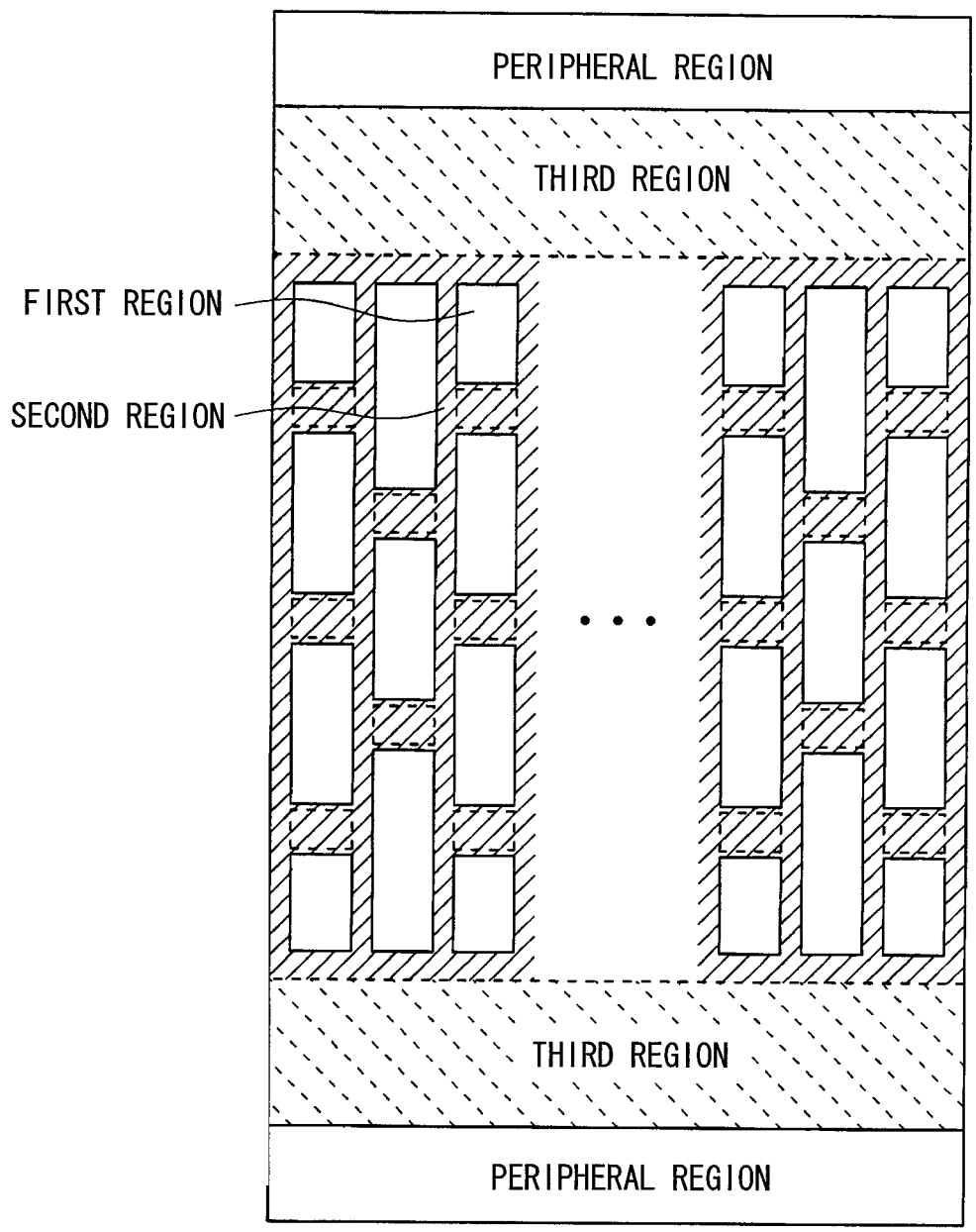
FIG. 18 is a top layout diagram of a semiconductor device in accordance with a seventh embodiment of the present invention.

FIG. 18 is a top layout diagram of a semiconductor device in accordance with the present embodiment. FIG. 18 is not a cross-sectional diagram but is partly hatched for easy understanding. As shown in the drawing, even in the present embodiment, the first region is divided into multiple portions in the up-and-down direction of the paper, that is, in the longitudinal direction of the trench gate structure. However, an interval at which the first region is divided is longer in the present embodiment than in the sixth embodiment. Even in this structure, the FWD 200 formed in the second regions between the divided first regions can easily perform a diode action. Accordingly, since the area of the FWD 200 increases, and this region plays an auxiliary role for the third region, the current density of the FWD 200 can be more efficiently improved. Eventually, a snapback voltage of the entire semiconductor device can be reduced.

Eighth Embodiment

The eighth embodiment of the present invention will be described below. The present embodiment is provided by modifying the layout of the first region and the second region in the fourth embodiment. The others are the same as those of the fourth embodiment. Only the difference from the fourth embodiment will be described below.

Figure 19:
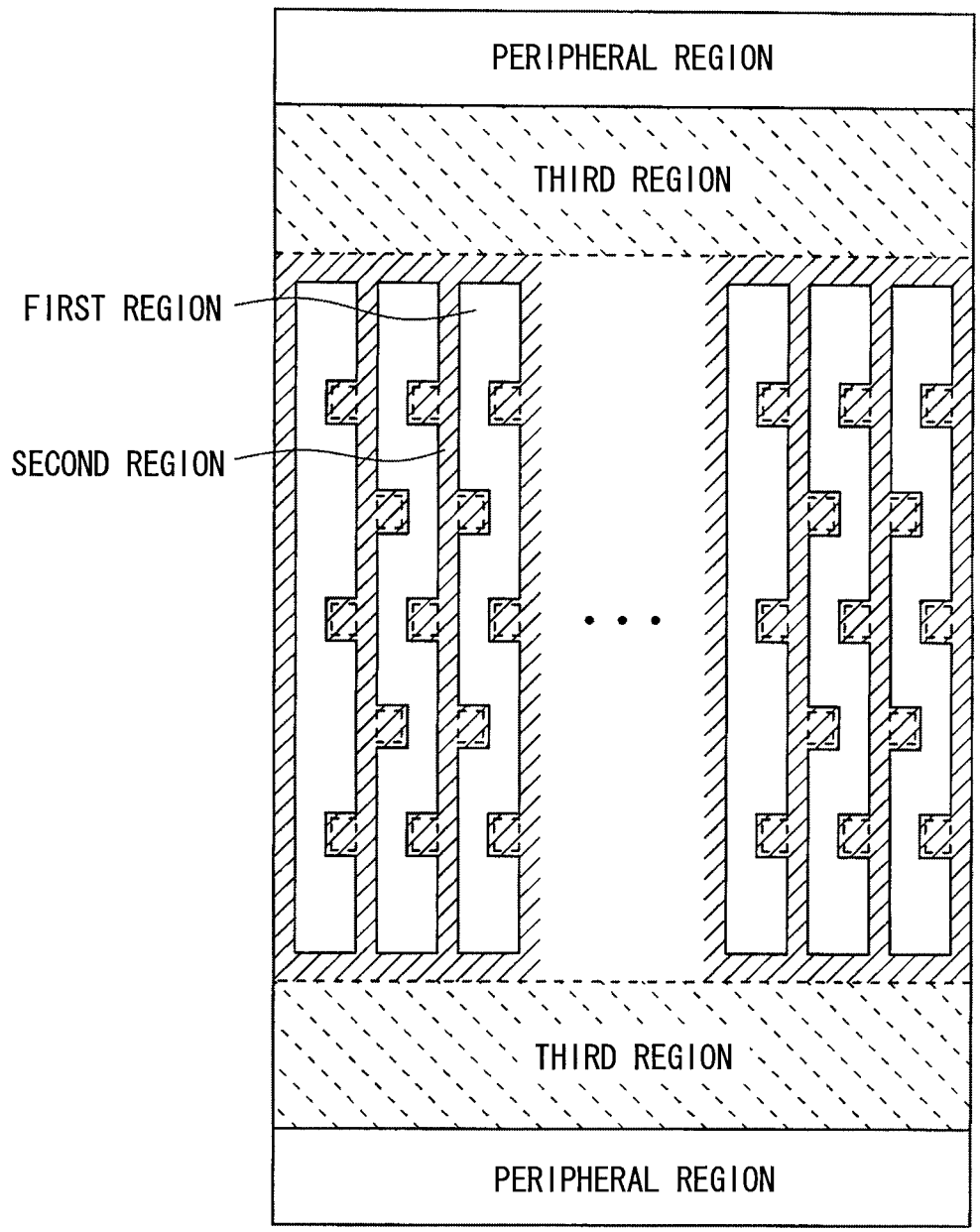
FIG. 19 is a top layout diagram of a semiconductor device in accordance with an eighth embodiment of the present invention.

FIG. 19 is a top layout diagram of a semiconductor device in accordance with the present embodiment. FIG. 19 is not a cross-sectional diagram, but is partly hatched for easy understanding. As shown in the drawing, even in the present embodiment, the opposed sides of adjacent first regions are partially recessed to form the second region. However, unlike the fourth embodiment, the opposed sides of the adjacent first regions are recessed at different positions so that the second regions can be alternately arranged. Even in this structure, the FWD 200 formed in the second region can easily perform a diode action. Since the area of the FWD 200 increases, and this region plays an auxiliary role for the third region, the current density of the FWD 200 can be more efficiently improved. Eventually, a snapback voltage of the entire semiconductor device can be reduced.

Ninth Embodiment

The ninth embodiment of the present invention will be described below. The present embodiment is provided by modifying the layout of the first to the third regions in the second embodiment. The others are the same as those of the second embodiment. Only the difference from the second embodiment will be described below.

Figure 20:
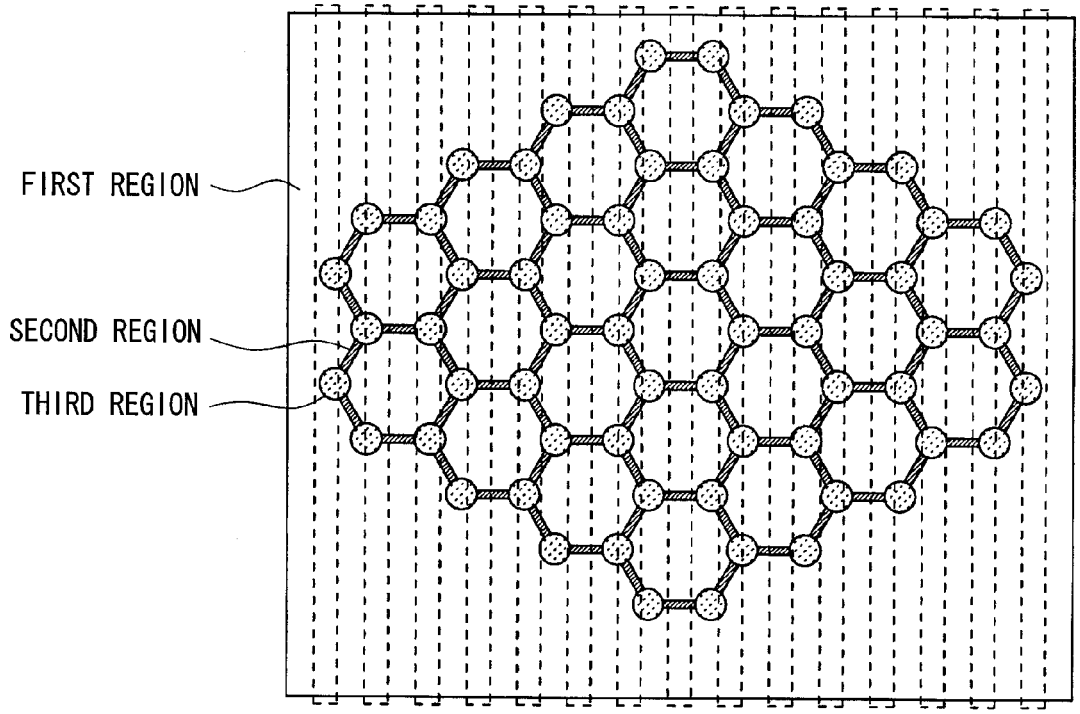
FIG. 20 is a top layout diagram of a semiconductor device in accordance with a ninth embodiment of the present invention.

FIG. 20 is a top layout diagram of a semiconductor device in accordance with the present embodiment. FIG. 20 is not a cross-sectional diagram, but is partly hatched for easy understanding. As shown in the drawing, in the present embodiment, the third region is not located in the outer edge of the cell region, but is scattered in the center of the cell region. In addition, the second region is located to link the third regions.

Specifically, each third region has a circular shape and is arranged at a corresponding corner of a regular hexagon. Thus, the third regions are arranged in the form of a honeycomb. Each second region is arranged at a corresponding side of the hexagon to link the third regions. A broken line in the drawing indicates the trench gate structure. Multiple trench gate structures are arranged, and each trench gate structure has a longitudinal direction in the up-and-down direction of the paper. The first to the third regions are laid out so that the trench gate structures can cross the regions. The $n^+$-type impurity region 5 corresponding to an emitter region is formed on the side surface of the trench 6 of the trench gate structure in the first region. However, the $n^+$-type impurity region 5 corresponding to an emitter region is not formed on the side surface of the trench 6 of the trench gate structure in the second region or the third region.

Even when the layout of the first to the third regions is modified in the above manner, the same advantage as that of the second embodiment can be achieved. Since the distance between the third regions gets shorter, the current density of the second region can be more efficiently improved. Accordingly, a snapback voltage of the entire semiconductor device can be further reduced.

Tenth Embodiment

The tenth embodiment of the present invention will be described below. The present embodiment is provided by modifying the layout of the first to the third regions in the ninth embodiment. The others are the same as those of the ninth embodiment. Only the difference from the ninth embodiment will be described below.

Figure 21:
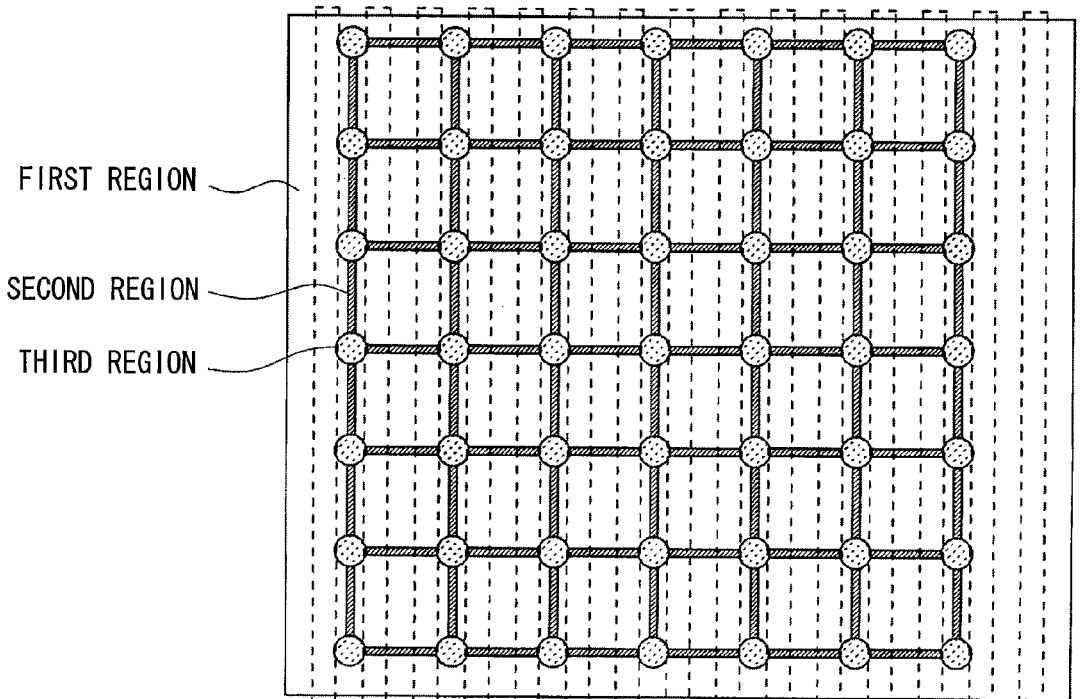
FIG. 21 is a top layout diagram of a semiconductor device in accordance with a tenth embodiment of the present invention.

FIG. 21 is a top layout diagram of a semiconductor device in accordance with the present embodiment. FIG. 21 is not a cross-sectional diagram, but is partly hatched for easy understanding. As shown in the drawing, even in the present embodiment, the third region is not located in the outer edge of the cell region, but is scattered in the center of the cell region. The second region is located to link the third regions. Each third region has a circular shape and is arranged at a corresponding corner of a square. Thus, the third regions are arranged in the form of a matrix. Each second region is arranged at a corresponding side of the square to link the third regions.

Even when the layout of the first to the third regions is modified in the above manner, the same advantage as that of the ninth embodiment can be achieved.

Eleventh Embodiment

The eleventh embodiment of the present invention will be described below. The present embodiment is provided by modifying the layout of the first to the third regions in the ninth embodiment. The others are the same as those of the ninth embodiment. Only the difference from the ninth embodiment will be described below.

Figure 22:
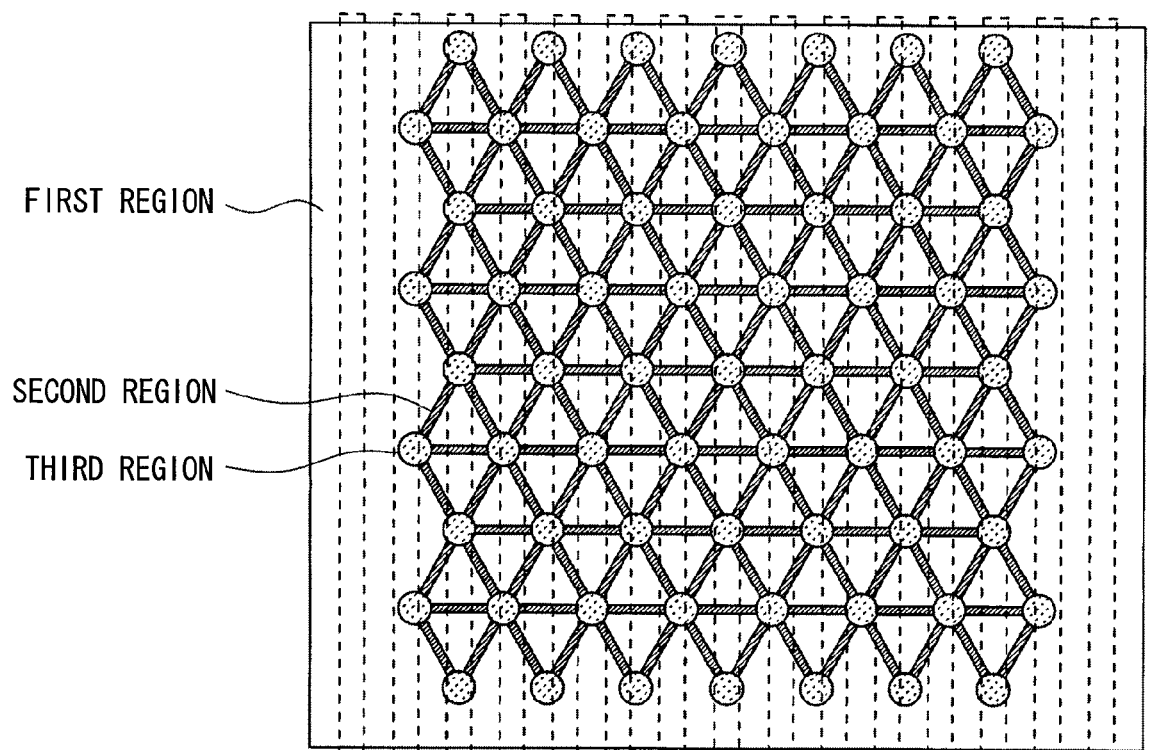
FIG. 22 is a top layout diagram of a semiconductor device in accordance with an eleventh embodiment of the present invention.

FIG. 22 is a top layout diagram of a semiconductor device in accordance with the present embodiment. FIG. 22 is not a cross-sectional diagram, but is partly hatched for easy understanding. As shown in the drawing, even in the present embodiment, the third region is not located in the outer edge of the cell region, but is scattered in the center of the cell region. The second region is located to link the third regions. Each third region has a circular shape and is arranged at a corresponding corner of a triangle. Each second region is arranged at a corresponding side of the triangle to link the third regions.

Even when the layout of the first to the third regions is modified in the above manner, the same advantage as that of the ninth embodiment can be achieved.

Twelfth Embodiment

The twelfth embodiment of the present invention will be described below. The present embodiment takes account of the layout on the back side of the substrate of the semiconductor device of the second embodiment. The others are the same as those of the second embodiment. Only the difference from the second embodiment will be described below.

Figure 23:
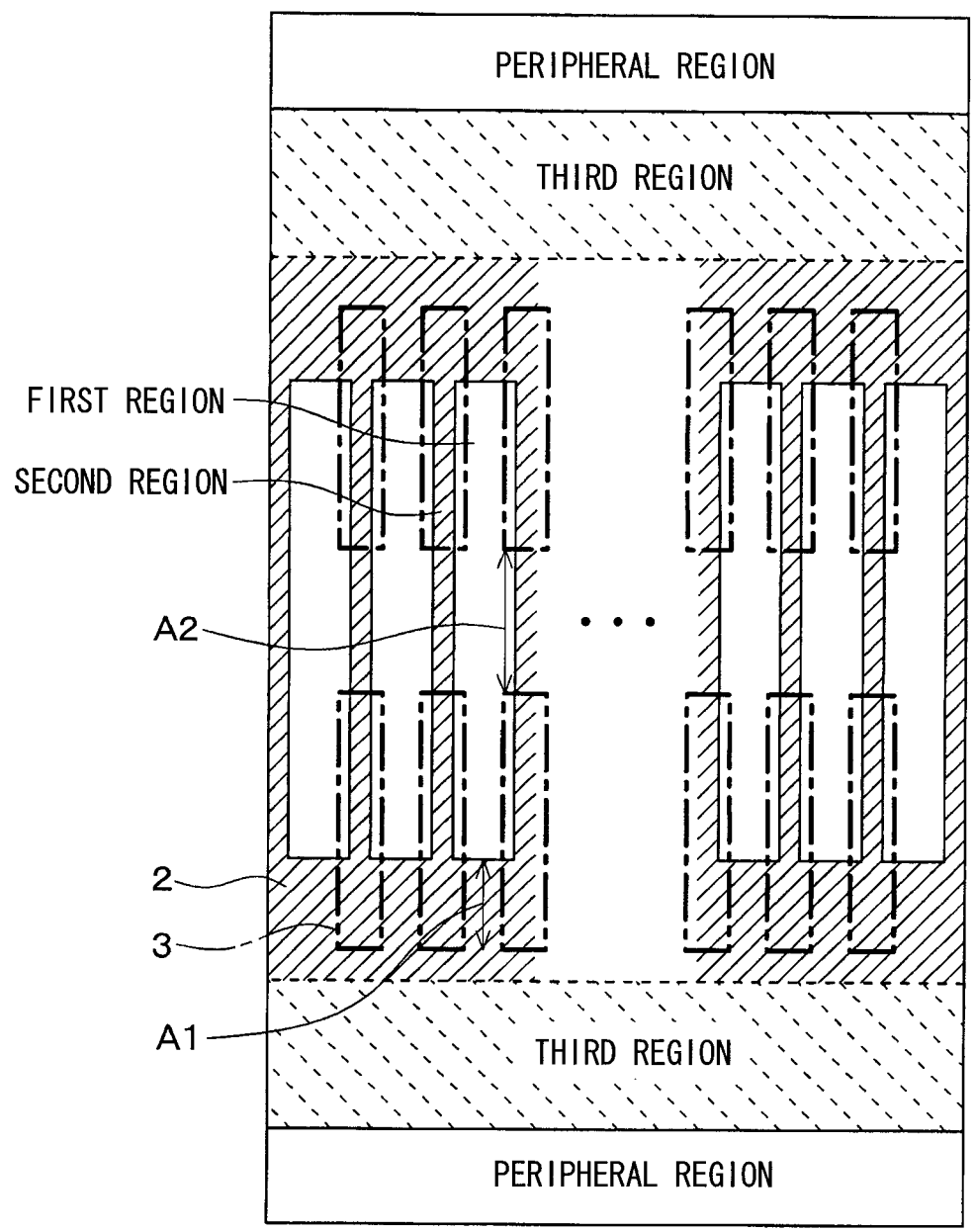
FIG. 23 is a top layout diagram of a semiconductor device in accordance with a twelfth embodiment of the present invention.

FIG. 23 is a top layout diagram of a semiconductor device in accordance with the present embodiment. FIG. 23 is not a cross-sectional diagram, but is partly hatched for easy understanding. As shown in the drawing, according to the present embodiment, in the structure provided with the first to the third regions as it is in the second embodiment, the $n^+$-type impurity region 3 (region enclosed by a with a dot-dash line in the drawing) corresponding to a cathode region extends beyond an end of the first region in the longitudinal direction as indicated by an arrow A1 in the drawing. In such a structure, there is a concern that a snapback voltage VSB in the IGBT 100 may become larger. In the present embodiment, as indicated by an arrow A2 in the drawing, the $n^+$-type impurity region 3 is divided in the longitudinal direction so that the $p^+$-type impurity region 2 corresponding to a collector region can be located between the divided $n^+$-type impurity regions 3. Thus, the IGBT 100 is formed between the divided $n^+$-type impurity regions 3.

In such an approach, the IGBT 100 formed with the $p^+$-type impurity region 2 located between the divided $n^+$-type impurity regions 3 performs an IGBT action. Thus, a current flows so that a current density can be increased. Then, the IGBT 100 in the other portion performs an IGBT action. This makes it possible to reduce a snapback voltage of the IGBT.

In this way, both a decrease in the snapback voltage due to an increase in the area of the FWD 200 and a decrease in the snapback voltage VSB due to facilitation of the IGBT action of the IGBT 100 can be achieved.

In the present embodiment, the $n^+$-type impurity region 3 is divided in two in the longitudinal direction. Alternatively, the $n^+$-type impurity region 3 can be divided in three or more in the longitudinal direction.

Thirteenth Embodiment

The thirteenth embodiment of the present invention will be described below. The present embodiment takes account of the layout on the back side of the substrate of the semiconductor device of the twelfth embodiment. The others are the same as those of the twelfth embodiment. Only the difference from the twelfth embodiment will be described below.

Figure 24:
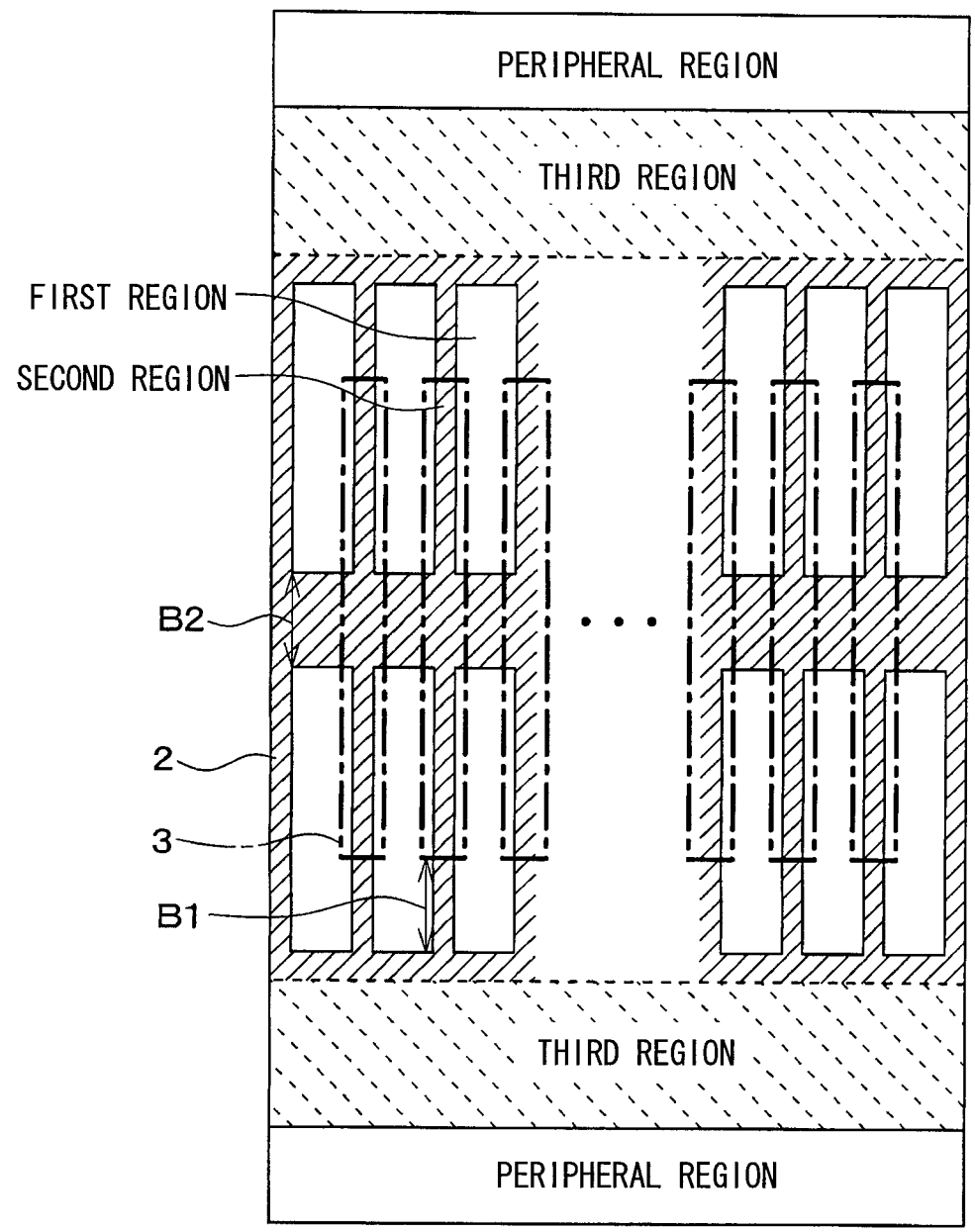
FIG. 24 is a top layout diagram of a semiconductor device in accordance with a thirteenth embodiment of the present invention.

FIG. 24 is a top layout diagram of a semiconductor device in accordance with the present embodiment. FIG. 24 is not a cross-sectional diagram, but is partly hatched for easy understanding. As shown in the drawing, in the present embodiment, in the structure where the first region is divided in two in the longitudinal direction as it is in the third embodiment, the first region extends beyond an end of the $n^+$-type impurity region 3 (region enclosed by a with a dot-dash line in the drawing) corresponding to a cathode region in the longitudinal direction as indicated by an arrow B1 in the drawing. In such a structure, there is a concern that a snapback voltage VSB may become larger in the center of the $n^+$-type impurity region 3. However, since the first region extends beyond the end of the $n^+$-type impurity region 3, the IGBT is formed in this region. When the IGBT 100 in the region performs an IGBT action, a current flows so that a current density can be increased. Accordingly, the IGBT 100 in the other portion can perform an IGBT action. Thus, the snapback voltage VSB of the IGBT 100 can be reduced.

Even in the above structure, both a decrease in the snapback voltage due to an increase in the area of the FWD 200 and a decrease in the snapback voltage VSB due to facilitation of the IGBT action of the IGBT 100 can be achieved. That is, when the $n^+$-type impurity region 3 extends beyond the end of the first region as indicated by the arrow A1 in the twelfth embodiment, the snapback voltage VSB is reduced by dividing the $n^+$-type impurity region 3 as indicated by the arrow A2 in the drawing to increase the area acing as the IGBT 100. In contrast, when the first region extends beyond the end of the $n^+$-type impurity region 3 as indicated by the arrow B1 in the thirteenth embodiment, the snapback voltage VSB of the FWD 200 is reduced by dividing the first region as indicated by an arrow B2 in the drawing to form the third region in this region. In this case, it is preferable that the distance B2 be two or more times larger than W2 indicated by the formula 10.

Fourteenth Embodiment

The fourteenth embodiment of the present invention will be described below. The present embodiment takes account of the layout on the back side of the substrate of the semiconductor device of the thirteenth embodiment. The others are the same as those of the thirteenth embodiment. Only the difference from the thirteenth embodiment will be described below.

Figure 25:
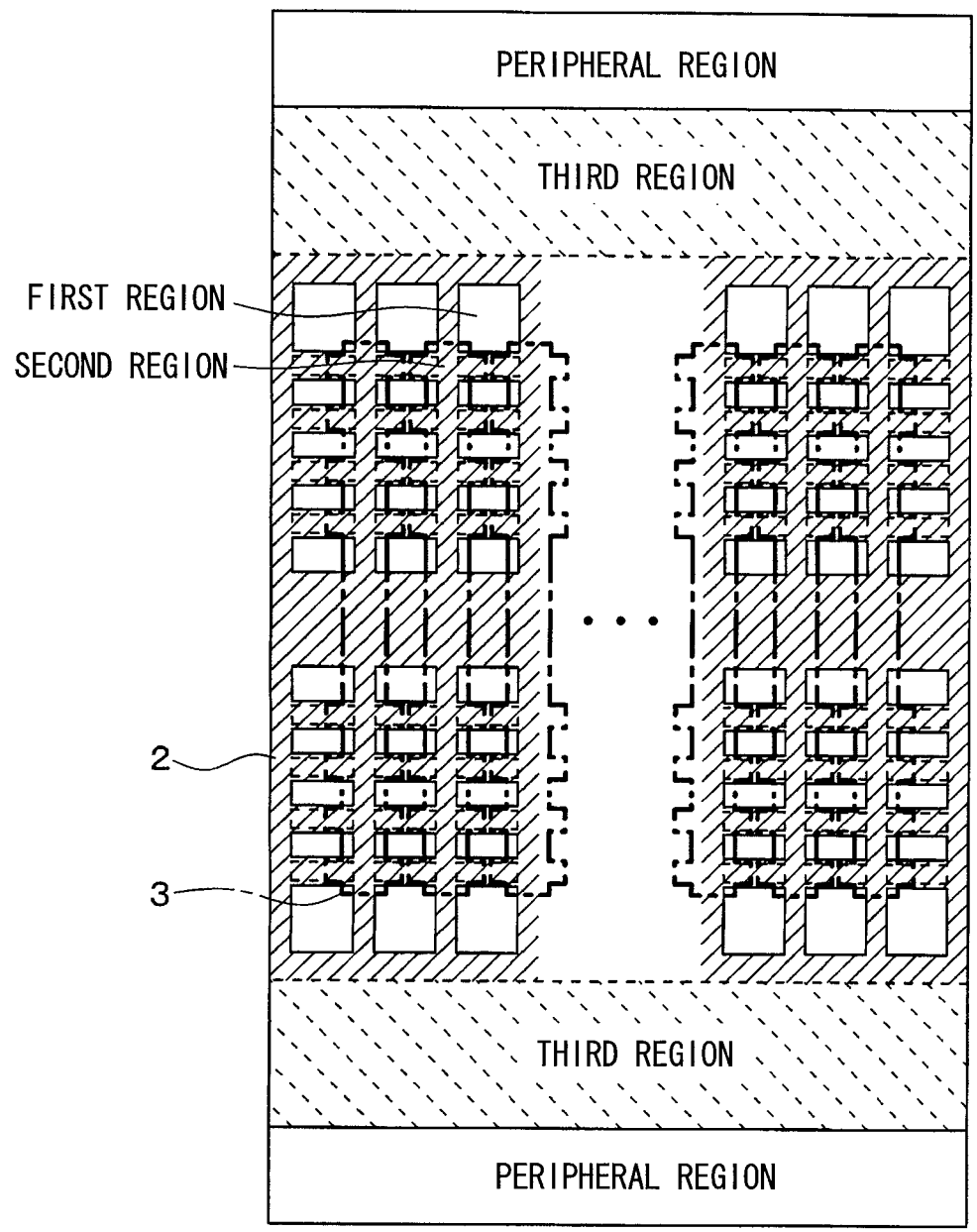
FIG. 25 is a top layout diagram of a semiconductor device in accordance with a fourteenth embodiment of the present invention.

FIG. 25 is a top layout diagram of a semiconductor device in accordance with the present embodiment. FIG. 25 is not a cross-sectional diagram, but is partly hatched for easy understanding. As shown in the drawing, in the present embodiment, the first region is divided in the same manner as in the thirteenth embodiment so that the wide second region can be located between the divided first regions. Further, each divided first region is further divided at multiple positions in the longitudinal direction. The $n^+$-type impurity region 5 corresponding to an emitter region is not formed in a region, enclosed by a broken line in the drawing, located between the further divided first regions. In the present embodiment, this region is configured as the second region. Further, the $n^+$-type impurity region 3 (region enclosed by a dot-dash line in the drawing) is wider at a position corresponding to the second region between the divided first regions than at the other position.

In such a structure, the area of the FWD 200 increases between the divided first regions, and this region plays an auxiliary role for the third region. Thus, the current density of the FWD 200 is more efficiently improved so that the snapback voltage VSB of the FWD 200 can be more reduced.

Fifteenth Embodiment

The fifteenth embodiment of the present invention will be described below. The present embodiment takes account of the layout on the back side of the substrate of the semiconductor device of the fourth embodiment. The others are the same as those of the fourth embodiment. Only the difference from the fourth embodiment will be described below.

Figure 26:
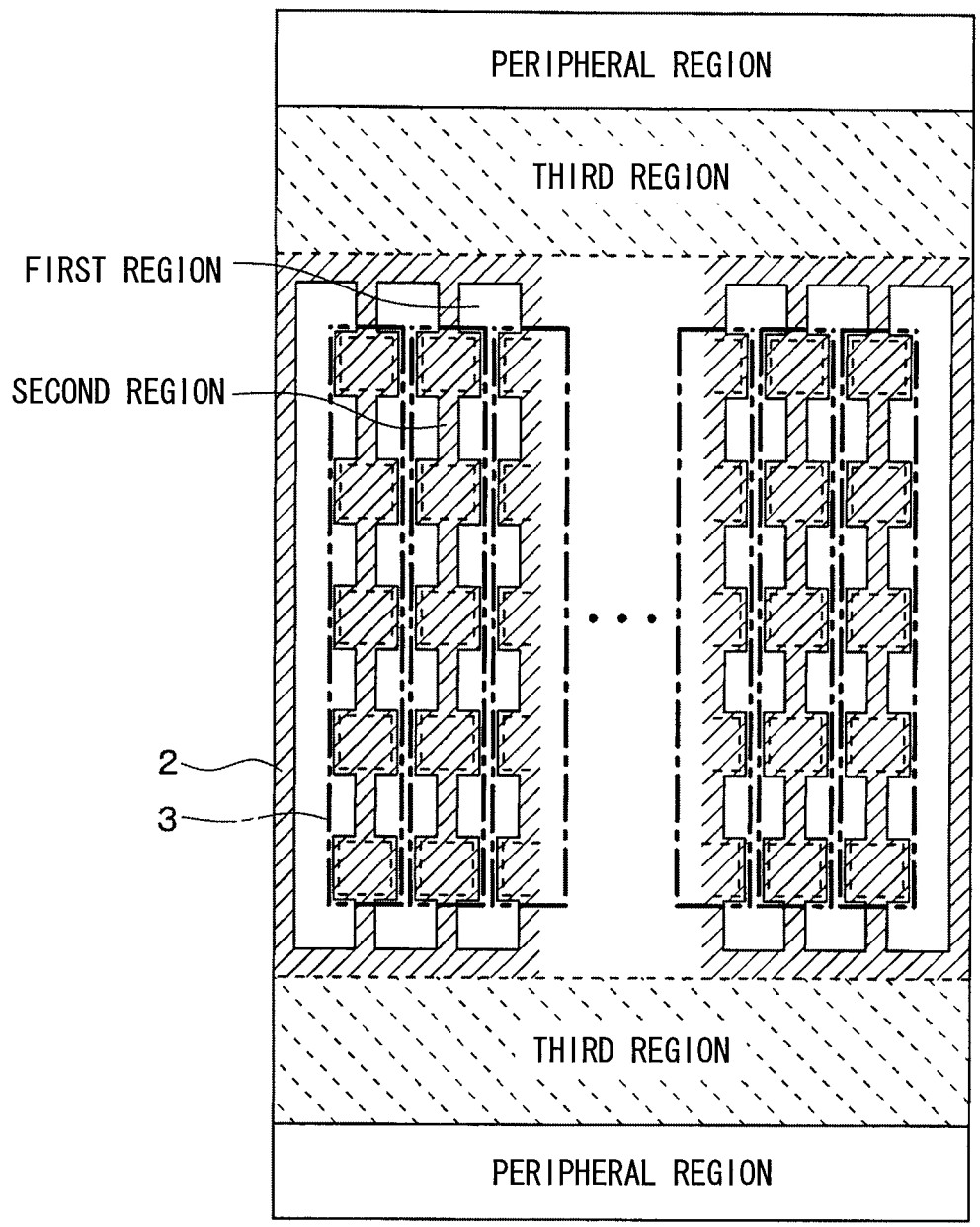
FIG. 26 is a top layout diagram of a semiconductor device in accordance with a fifteenth embodiment of the present invention.

FIG. 26 is a top layout diagram of a semiconductor device in accordance with the present embodiment. FIG. 26 is not a cross-sectional diagram, but is partly hatched for easy understanding. As shown in the drawing, even in the present embodiment, the first regions are partially recessed to form a recess region, enclosed by a broken line in the drawing, where the $n^+$-type impurity region 5 corresponding to an emitter region is not formed. The recess region is configured as the second region so that the width of the second region can be increased. The $n^+$-type impurity region 3 has the same width as the second region.

In such a structure, the wider second region and the $n^+$-type impurity region 3 are laid out to face each other so that this region can play an auxiliary role for the third region. Thus, the current density of the entire FWD 200 is more efficiently improved so that the snapback voltage VSB of the FWD 200 can be more reduced. Therefore, the same advantage as that of the twelfth embodiment can be achieved.

Sixteenth Embodiment

The sixteenth embodiment of the present invention will be described below. The present embodiment takes account of the layout on the back side of the substrate of the semiconductor device of the ninth embodiment. The others are the same as those of the ninth embodiment. Only the difference from the ninth embodiment will be described below.

Figure 27:
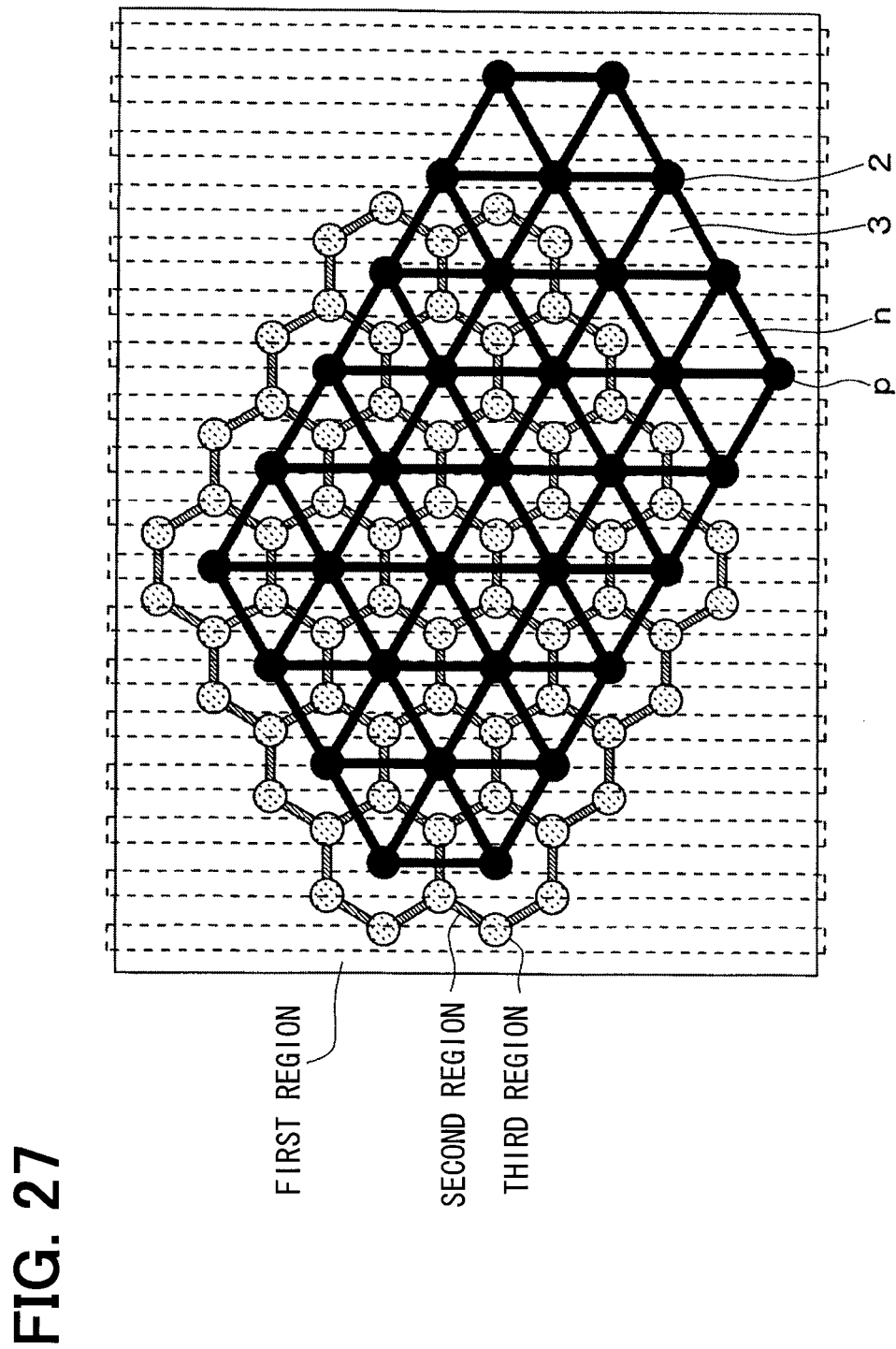
FIG. 27 is a top layout diagram of a semiconductor device in accordance with a sixteenth embodiment of the present invention.

FIG. 27 is a top layout diagram of a semiconductor device in accordance with the present embodiment. FIG. 27 is not a cross-sectional diagram, but is partly hatched for easy understanding. As shown in the drawing, even in the present embodiment, each third region has a circular shape and is arranged at a corresponding corner of a regular hexagon. Thus, the third regions are arranged in the form of a honeycomb. Each second region is arranged at a corresponding side of the hexagon to link the third regions. Further, the p-type impurity region 2 corresponding to a collector region is arranged on a center point of the hexagon and on a line linking the center points. Thus, the p-type impurity region 2 is arranged to form multiple regular triangles. The $n^+$-type impurity region 3 corresponding to a cathode region is arranged inside the hexagon.

As mentioned above, the first to the third regions, that is, the components acting as the IGBT 100 and the FWD 200 on the front side of the substrate are laid out in accordance with the $p^+$-type impurity region 2 serving as a collector region of the IGBT 100 and the $n^+$-type impurity region 3 serving as a cathode region of the FWD 200 on the front side of the substrate. In such an approach, the distance between the third regions becomes shorter so that an IGBT action or diode action can be efficiently performed. Thus, the snapback voltage VSB of the FWD 200 can be further reduced. Therefore, the same advantage as that of the twelfth embodiment can be achieved.

Seventeenth Embodiment

The seventeenth embodiment of the present invention will be described below. The present embodiment takes account of the layout on the back side of the substrate of the semiconductor device of the tenth embodiment. The others are the same as those of the tenth embodiment. Only the difference from the tenth embodiment will be described below.

Figure 28:
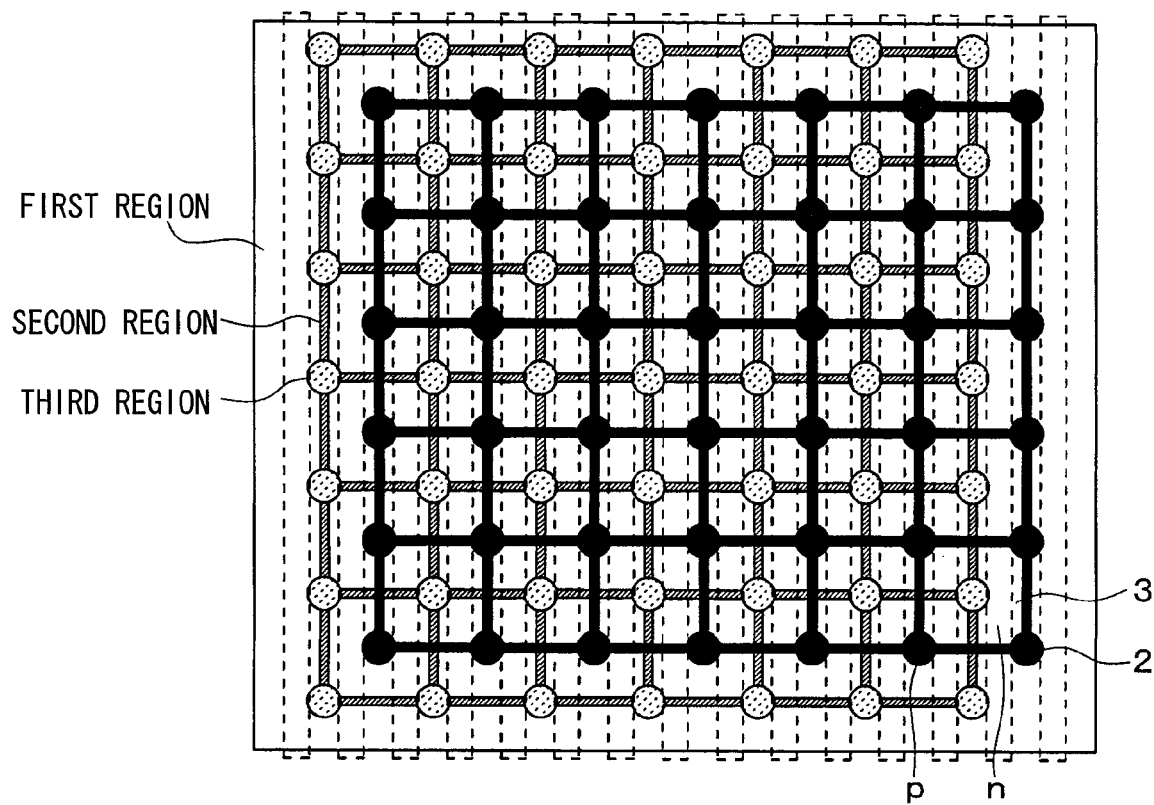
FIG. 28 is a top layout diagram of a semiconductor device in accordance with a seventeenth embodiment of the present invention.

FIG. 28 is a top layout diagram of a semiconductor device in accordance with the present embodiment. FIG. 28 is not a cross-sectional diagram, but is partly hatched for easy understanding. As show in the drawing, even in the present embodiment, each third region has a circular shape and is arranged at a corresponding corner of a square. Thus, the third regions are arranged in the form of a matrix. Each second region is arranged at a corresponding side of the square to link the third regions. Further, the p-type impurity region 2 corresponding to a collector region is arranged on a center point of the square and on a line linking the center points. Thus, the p-type impurity region 2 is arranged to form multiple squares. The $n^+$-type impurity region 3 corresponding to a cathode region is arranged inside the square.

As mentioned above, the first to the third regions, that is, the components acting as the IGBT 100 and the FWD 200 on the front side of the substrate are laid out in accordance with the $p^+$-type impurity region 2 serving as a collector region of the IGBT 100 and the $n^+$-type impurity region 3 serving as a cathode region of the FWD 200 on the front side of the substrate. Therefore, the same advantage as that of the sixteenth embodiment can be achieved.

Eighteenth Embodiment

The eighteenth embodiment of the present invention will be described below. The present embodiment takes account of the layout on the back side of the substrate of the semiconductor device of the eleventh embodiment. The others are the same as those of the eleventh embodiment. Only the difference from the eleventh embodiment will be described below.

Figure 29:
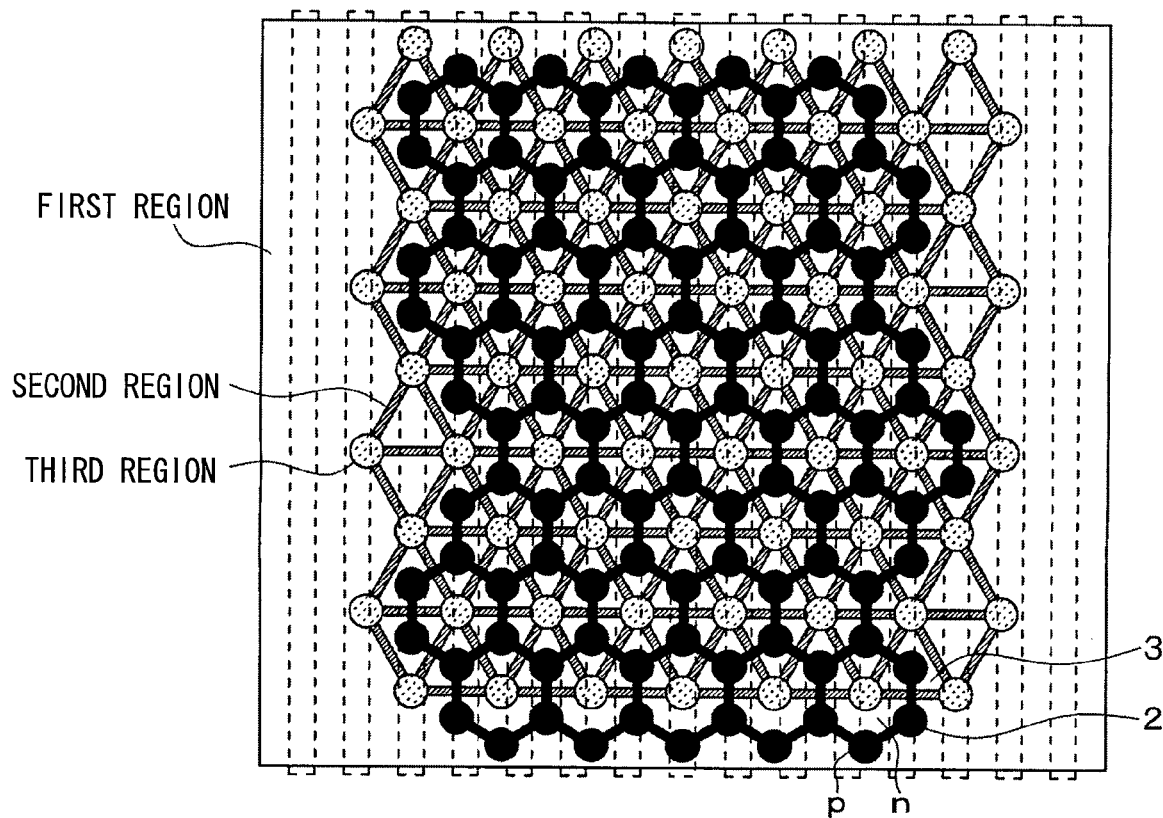
FIG. 29 is a top layout diagram of a semiconductor device in accordance with an eighteenth embodiment of the present invention.

FIG. 29 is a top layout diagram of a semiconductor device in accordance with the present embodiment. FIG. 29 is not a cross-sectional diagram, but is partly hatched for easy understanding. As shown in the drawing, even in the present embodiment, each third region has a circular shape and is arranged at a corresponding corner of a triangle. Each second region is arranged at a corresponding side of the triangle to link the third regions. Further, the p-type impurity region 2 corresponding to a collector region is arranged on a center point of the triangle and on a line linking the center points. Thus, the p-type impurity region 2 is arranged to form multiple regular hexagons. The $n^+$-type impurity region 3 corresponding to a cathode region is arranged inside the hexagon.

As mentioned above, the first to the third regions, that is, the components acting as the IGBT 100 and the FWD 200 on the front side of the substrate are laid out in accordance with the $p^+$-type impurity region 2 serving as a collector region of the IGBT 100 and the $n^+$-type impurity region 3 serving as a cathode region of the FWD 200 on the front side of the substrate. Therefore, the same advantage as that of the sixteenth embodiment can be achieved.

Nineteenth Embodiment

The nineteenth embodiment of the present invention will be described below. The present embodiment adopts a layout that makes it possible to reduce a switching loss in the twelfth embodiment. The others are the same as those of the twelfth embodiment. Only the difference from the twelfth embodiment will be described below.

Figure 30:
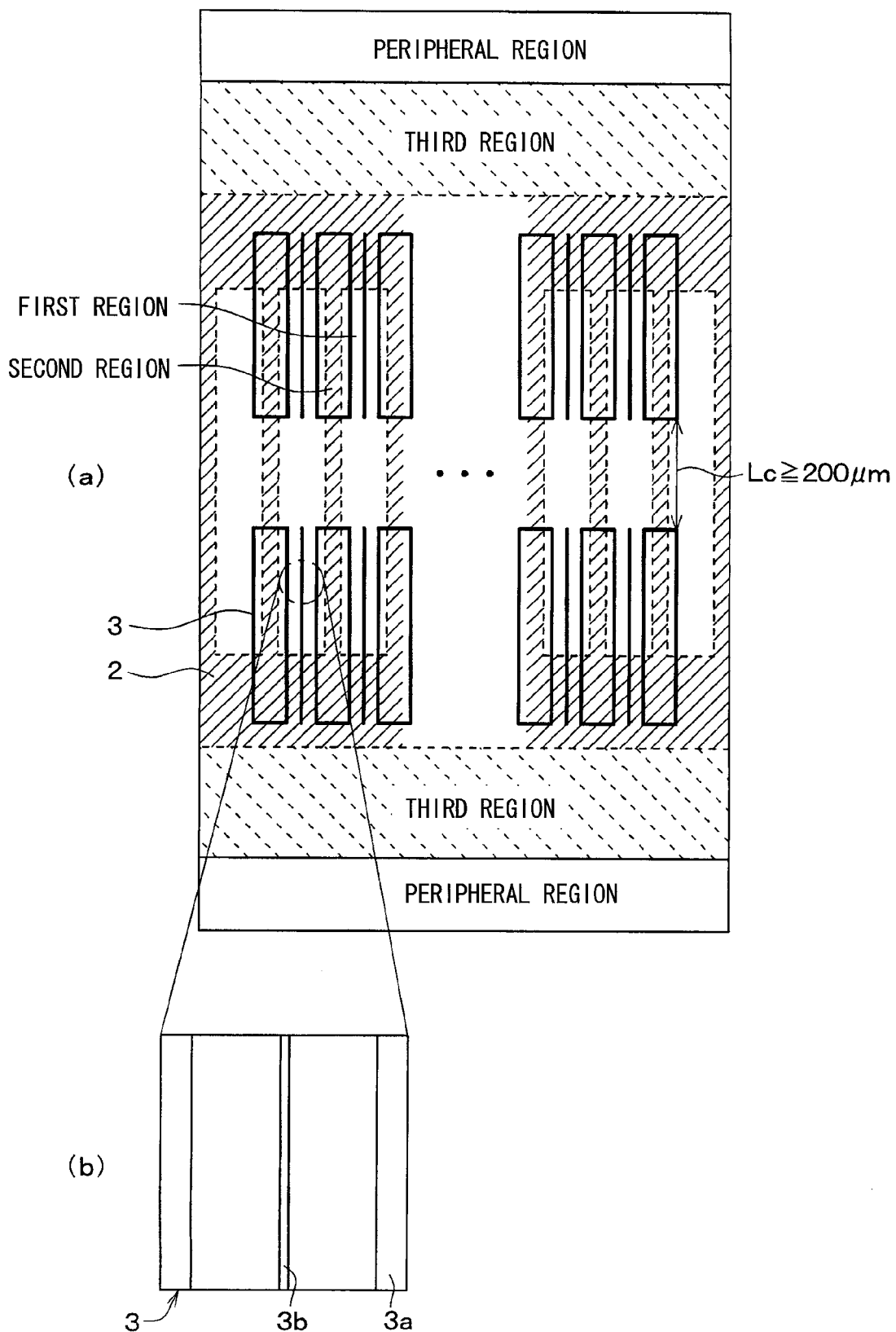
FIG. 30(a) is a top layout diagram of a semiconductor device in accordance with an embodiment.
FIG. 30(b) is a partial enlarged diagram of a region enclosed with an alternate long and two short dashes line in FIG. 30(a)

FIG. 30(a) is a top layout diagram of a semiconductor device in accordance with the present embodiment, and FIG. 30(b) is a partly enlarged diagram of an area enclosed by an alternate long and two short dashes line in FIG. 30(a). FIG. 30(a) is not a cross-sectional diagram, but is partly hatched for easy understanding. As shown in the drawing, even in the present embodiment, in the structure including the first to the third regions, the $n^+$-type impurity region 3 extends beyond the end of the first region in the longitudinal direction and is divided in the longitudinal direction. Further, a distance Lc between the divided $n^+$-type impurity region 3 is set to satisfy Lc≥200 µm. The $n^+$-type impurity region has a region 3a and a region 3b. The region 3a is located at a position corresponding to the second region. The region 3b is located at a position corresponding to the first region.

The region 3a has the same width as the second region. The region 3b is located in the middle between adjacent regions 3a. The width of the region 3b is narrower than the width of each of the first region and the region 3a. The region 3b has a longitudinal direction parallel to the longitudinal direction of the first region.

In a semiconductor device having the above structure, the region 3a of the $n^+$-type impurity region 3 performs a diode action, and the region 3b of the $n^+$-type impurity region 3 performs a MOS action. Specifically, the region 3a, which is located at a position corresponding to the second region acting as the FWD 200, serves as a cathode region so that a diode action can be performed. The region 3b, which is located at a position corresponding to the first region acting as the IGBT 100, serves as a drain region so that a MOS action can be performed. Accordingly, the following advantages can be achieved.

Figure 31:
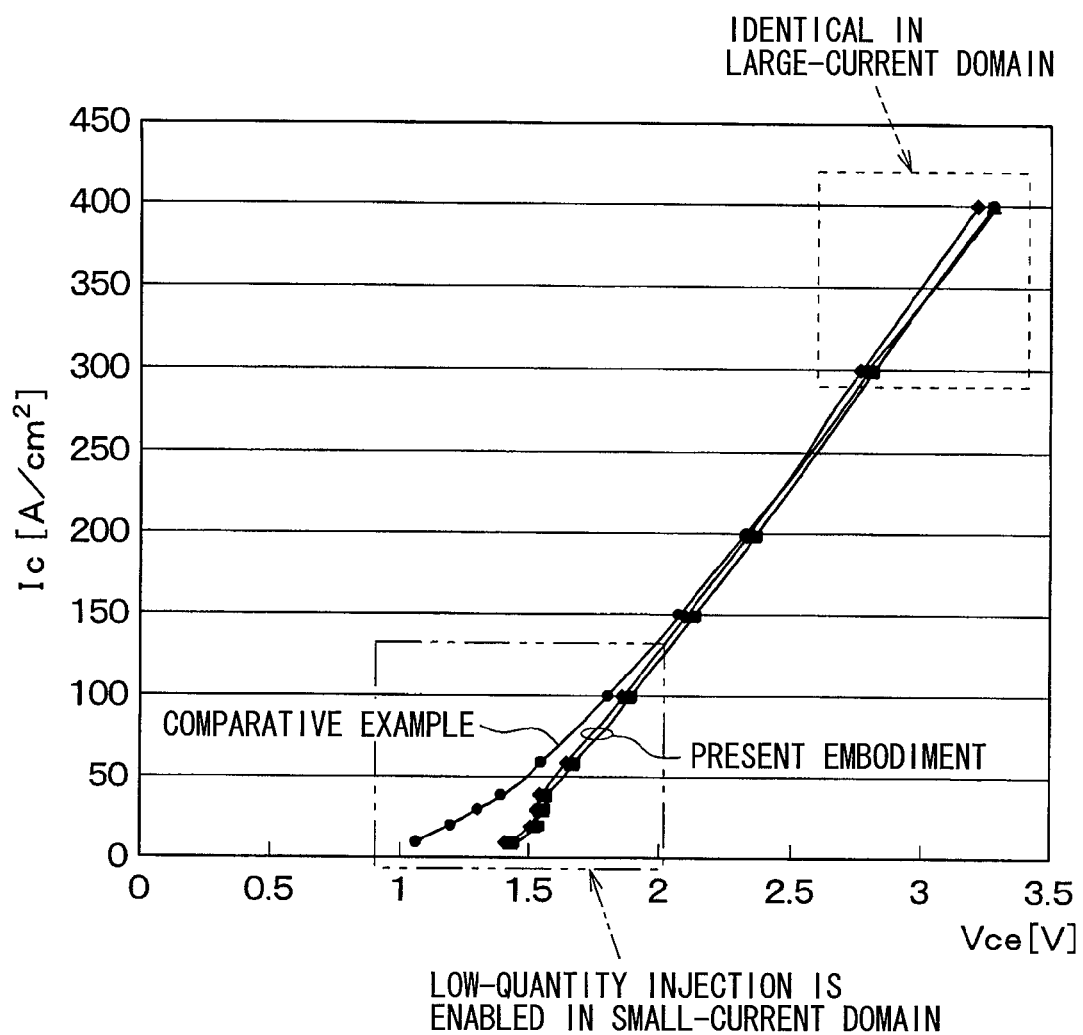
FIG. 31 is a diagram of a Vce-Ic characteristic of the semiconductor device shown in FIG. 30(a)

FIG. 31 is a diagram illustrating a result of an investigation on the Vce-Ic characteristic of the semiconductor device in accordance with the present embodiment. FIG. 31 also illustrates, as a comparative example, the Vce-Ic characteristic of the semiconductor device of the twelfth embodiment having no region 3b. As can be seen from a small current domain in the drawing, in the case of the semiconductor device of the twelfth embodiment, Ic gradually increases with an increase in Vce from around 1V. In contrast, in the case of the semiconductor device of the present embodiment, Ic abruptly increases when Vce is around 1.5V. Then, Ic gradually increases with an increase in Vce in the same manner as in the semiconductor device of the twelfth embodiment. In the case of the semiconductor device of the present embodiment, compared with the semiconductor device of the twelfth embodiment, low-quantity injection is enabled so that switching can be achieved more quickly. Eventually, a switching loss can be reduced.

In general, a MOSFET performs a switching action more quickly than an IGBT, and a switching loss of a MOSFET is smaller than a switching loss of an IGBT. In the semiconductor device of the present embodiment, a MOS action can be performed with an IGBT action as a fundamental. Therefore, the switching loss can be reduced. The effect of reduction in the switching loss will prove useful in an application where switching is frequently carried out, for example, in an application where the semiconductor device is used to drive an inverter.

As for a large current domain in the drawing, the Vce-Ic characteristic of the semiconductor device of the present embodiment is almost the same as the Vce-Ic characteristic of the semiconductor device of the twelfth embodiment. Therefore, according to the semiconductor device of the present embodiment, while a switching loss is reduced in the small current domain of a high switching frequency, the same current characteristic as that of the semiconductor device of the twelfth embodiment can be exhibited in the large current domain that determines a heat rating.

Figure 32:
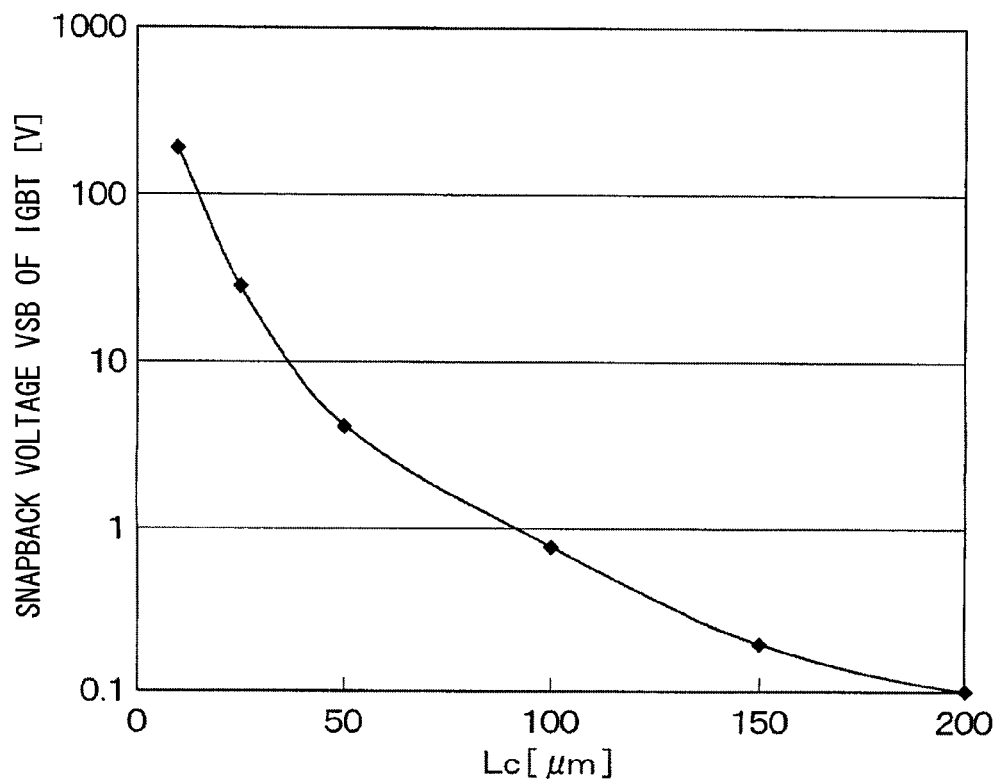
FIG. 32 is a graph showing a result of a measurement on a relationship between a distance Lc and a snapback voltage VSB of an IGBT 100.

Further, in the present embodiment, the distance Lc between the divided $n^+$-type impurity regions 3 is set to 200 μm or more. FIG. 32 is a graph illustrating the result of an experiment conducted to evaluate a relationship between the distance Lc and a snapback voltage VSB of the IBGT 100 under conditions that the sheet resistance of the FS layer is 2.5E-5[Ω/□], the thickness of the substrate is 50 μm, and the specific resistance of the substrate is 65 [Ωcm]. As shown in the drawing, as the distance Lc becomes longer, that is, as the area acting as an IGBT becomes larger, the snapback voltage VSB becomes smaller. When the distance Lc is 200 μm or more, the snapback voltage VSB is reduced to 0.1V or less, which can be ignored with respect to VAK(th)=0.8[V] at −40° C. By setting the distance Lc to 200 μm or more, the snapback voltage VSB can reduced to a sufficient small value.

Figure 33:
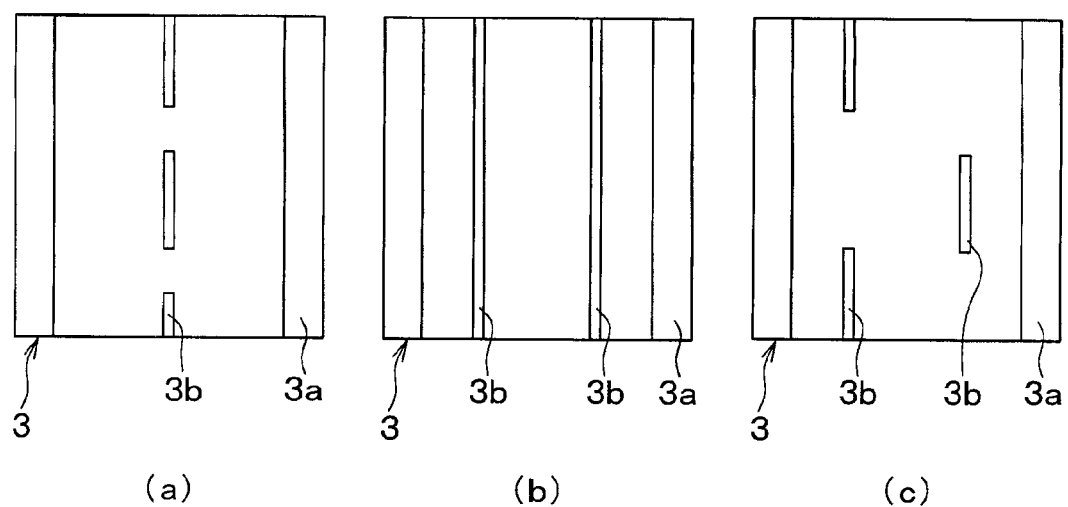
FIGS. 33(a)-33(c) are diagrams showing other layouts of a region 3b.

In the present embodiment, although the region 3b is formed in the middle between adjacent regions 3a, the region 3b can have other structure. FIG. 33(a) to FIG. 33(c) correspond to FIG. 30(b) and illustrates other layouts of the region 3b. As shown in FIG. 33(a), the region 3b can be divided in the longitudinal direction. As shown in FIG. 33(b), two regions 3b can be arranged. Further, as shown in FIG. 33(c), two regions 3b can be arranged and divided in the longitudinal direction so that the divided regions 3b can be alternately arranged.

Figure 34:
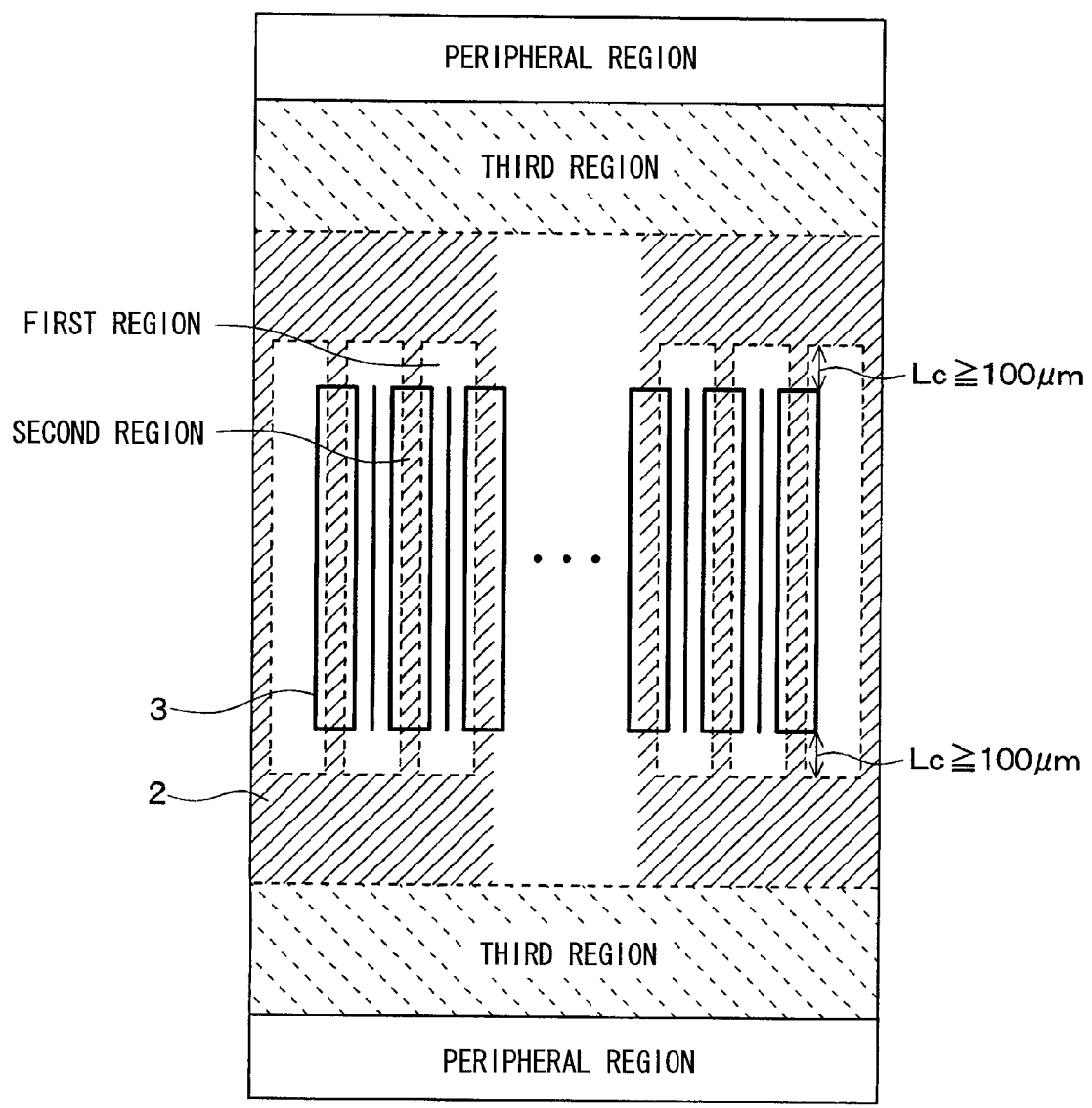
FIG. 34 is a layout diagram of a semiconductor device when a $n^+$-type impurity region 3 has another structure.
Figure 35:
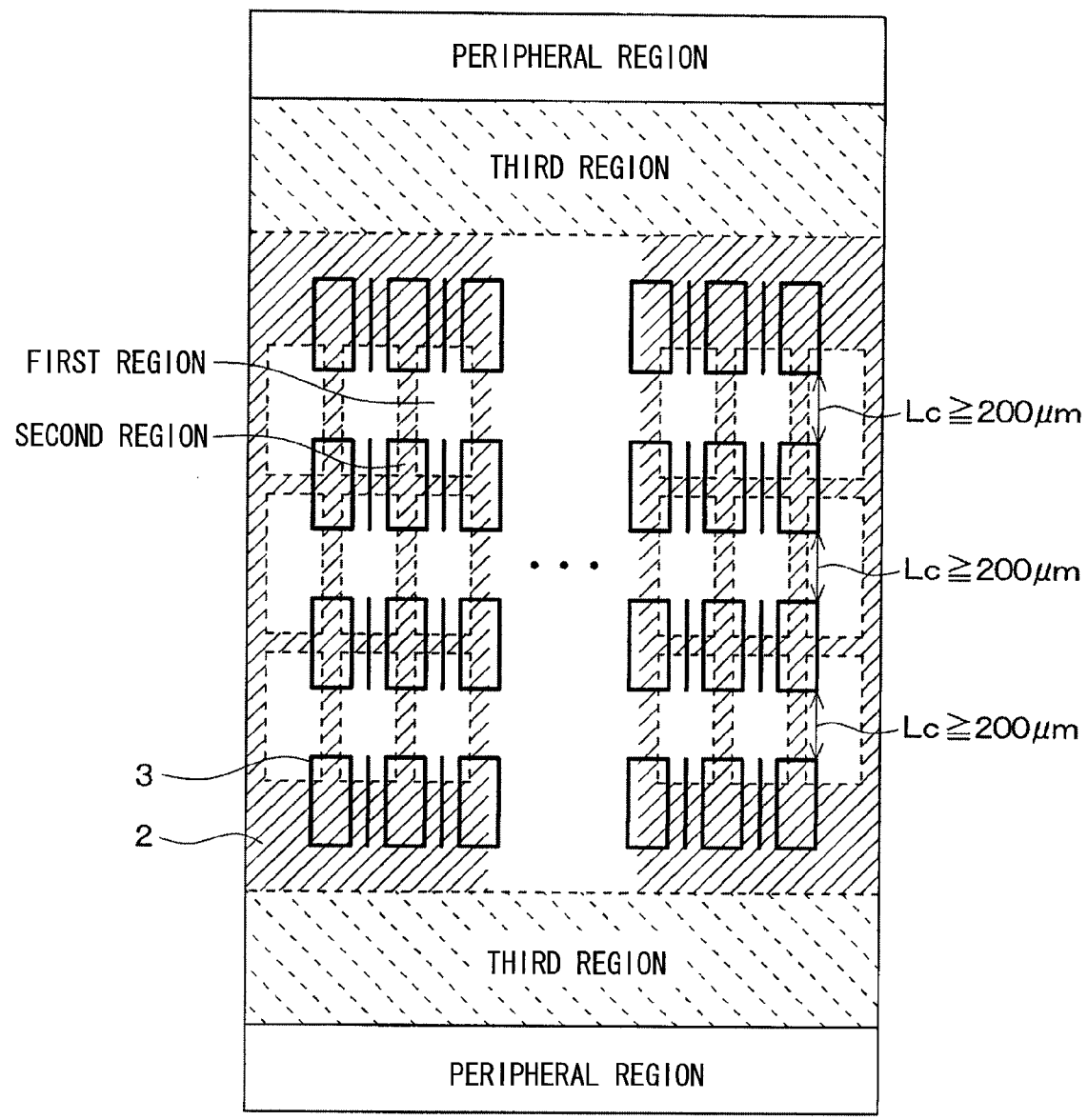
FIG. 35 is a layout diagram of a semiconductor device when the $n^+$-type impurity region 3 has another structure.
Figure 36:
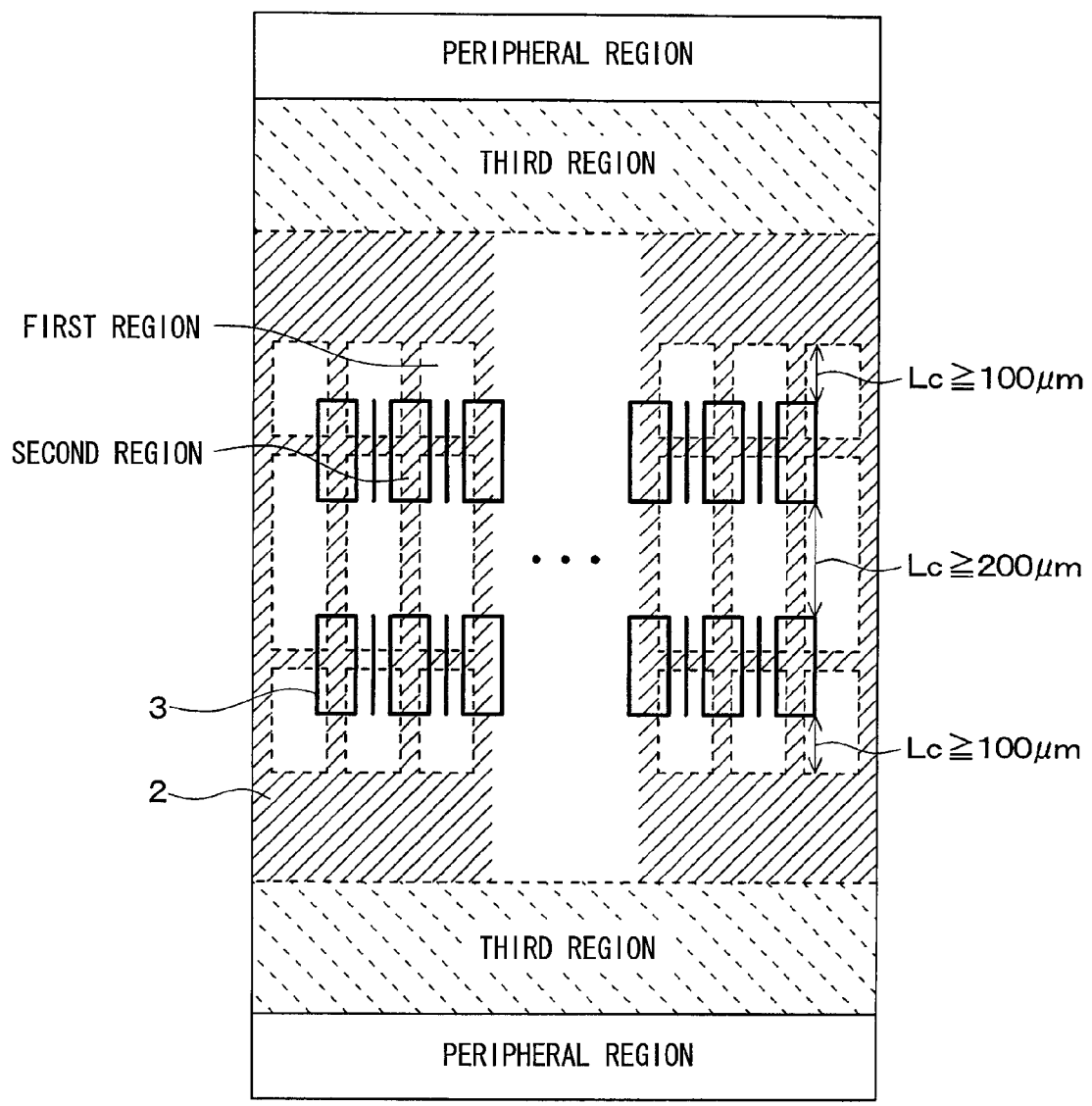
FIG. 36 is a layout diagram of a semiconductor device when the $n^+$-type impurity region 3 has another structure.

In the present embodiment, the $n^+$-type impurity region 3 is divided in two in the longitudinal direction. Alternatively, the $n^+$-type impurity region 3 can have other structure. FIG. 34 to FIG. 36 are layout diagrams for the semiconductor device in a case where the $n^+$-type impurity regions 3 have other structures. A region enclosed by an alternate long and two short dashes line in FIG. 34 to FIG. 36 has the structure shown in FIG. 30(b) or FIG. 33(a) to FIG. 33(c).

As shown in FIG. 34, like in the thirteenth embodiment, it is possible that the $n^+$-type impurity regions 3 is not divided. Even in this case, the first region extends beyond the end of the $n^+$-type impurity region 3 in the longitudinal direction. Since the area extending beyond the end of the $n^+$-type impurity region 3 can perform an IGBT action, a snapback voltage VSB of the IGBT 100 can be reduced. In the case, when a distance Lc, by which the first region extends beyond the end of the $n^+$-type impurity region 3 in the longitudinal direction, is 100 μm or more, the snapback voltage VSB can reduced to a sufficient small value.

As shown in FIG. 35, the $n^+$-type impurity region 3 can divided in the longitudinal direction. Even in this case, when a distance Lc between the divided $n^+$-type impurity regions 3 is 200 μm or more, the snapback voltage VSB can be reduced to a sufficient small value.

Further, as shown in FIG. 36, even when the first region extends beyond the end of the $n^+$-type impurity regions 3 in the longitudinal direction, the $n^+$-type impurity region 3 can be divided in the longitudinal direction. Even in this case, when the distance Lc, by which the first region extends beyond the end of the $n^+$-type impurity region 3 in the longitudinal direction, is 100 μm or more, and when the distance Lc between the divided $n^+$-type impurity regions 3 is 200 μm or more, the snapback voltage VSB can reduced to a sufficient small value.

Twentieth Embodiment

The twentieth embodiment of the present invention will be described below. The present embodiment adopts a layout to reduce switching loss in the twelfth embodiment. The others are the same as those of the twelfth embodiment. Only the difference from the twelfth embodiment will be described below.

Figure 37:
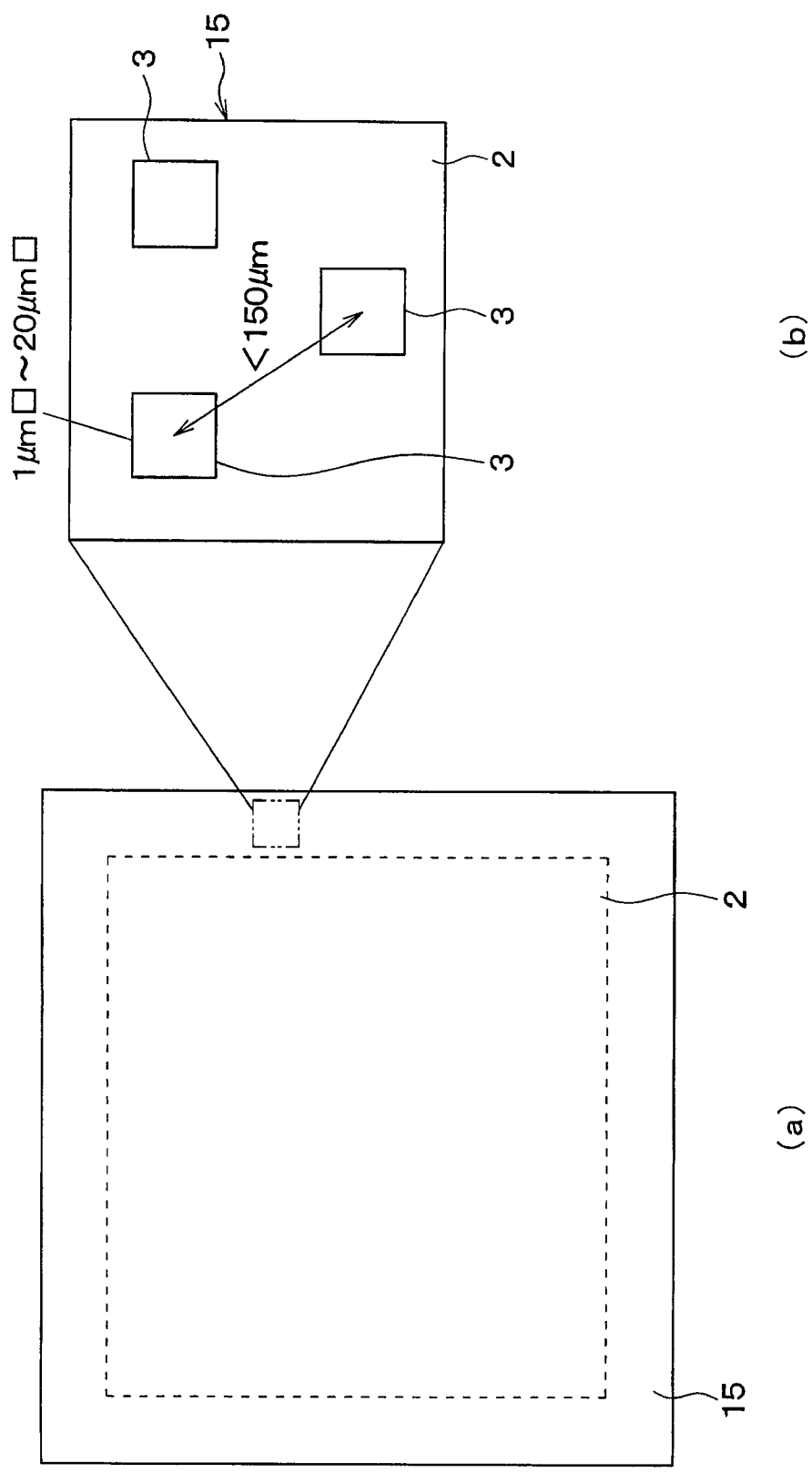
FIG. 37(a) is a diagram showing a layout of a back side of a substrate in a cell region.
FIG. 37(b) is a partial enlarged diagram of FIG. 37(a)

FIG. 37(a) is a diagram showing the layout on the back side the substrate in the cell region, and FIG. 37(b) is a partly enlarged diagram of FIG. 37(a). Actually, the $n^+$-type impurity region 3 corresponding to a cathode region is formed in the cell region indicated by a broken line in the drawing. However, since various layouts described in relation to, for example, the twelfth to nineteenth embodiments can be adopted, illustration of the $n^+$-type impurity region 3 is omitted from FIG. 37(a).

As shown in FIG. 37(a), a mixed region 15 is formed in the outer edge of the cell region. In the mixed region 15, both the $p^+$-type impurity region 2 corresponding to a collector region and the $n^+$-type impurity regions 3 corresponding to cathode regions are formed. The mixed region 15 is almost entirely occupied by the $p^+$-type impurity region 2 and partially occupied by the $n^+$-type impurity region 3. Specifically, as shown in FIG. 37(b), each of the $n^+$-type impurity regions 3 has a square shape and is scattered. The dimension ranges from 1 μm□ to 20 μm□ and thus can be equal to or smaller than a diffusion length defined by a diffusion coefficient ($=d\tau^{1/2}$). Further, the distance between the scattered $n^+$-type impurity regions 3 is set to a value less than 150 μm. In such an approach, a significant increase in a current density during steady-state or during switching is prevented so that the IGBT 100 in the mixed region 15 can be less likely to be turned ON.

Figure 38:
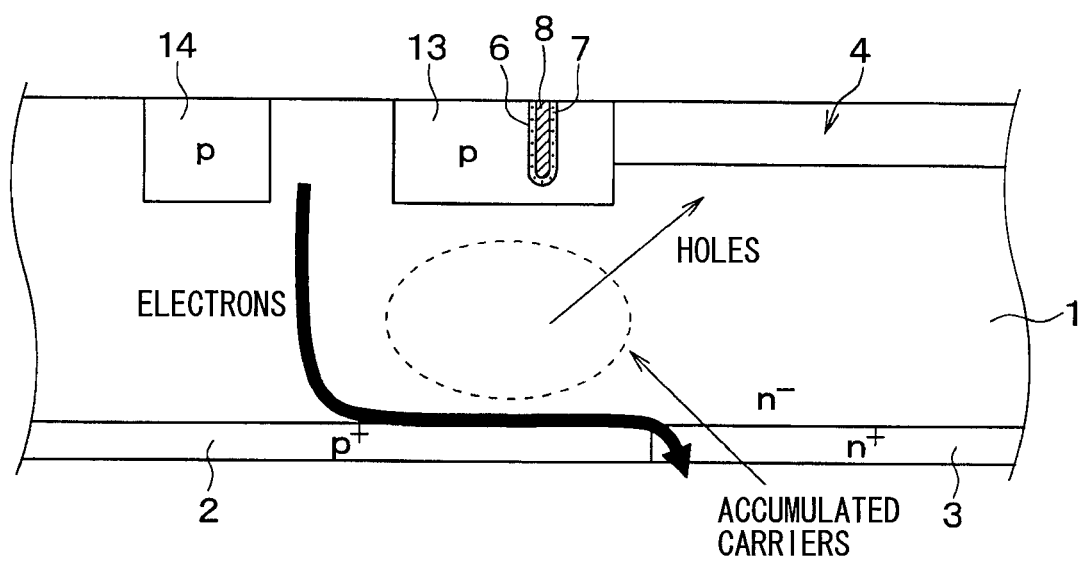
FIG. 38 is an explanatory diagram showing a principle on which a semiconductor device is broken.

As can be seen from the cross-sectional diagram of FIG. 38, during operation, carriers are accumulated between the p-type deep well layer 13 and the $p^+$-type impurity region 2 located below the p-type deep well layer 13. Therefore, as indicated by an arrow in the drawing, electronic current flows into the $n^+$-type impurity region 3 through the surface of the $p^+$-type impurity region 2 during switching. Accordingly, a parasitic PNP transistor formed with the p-type deep well layer 13, the $n^-$-type drift layer 1, and the $p^+$-type impurity region 2 is turned ON. Therefore, holes are re-injected into between the p-type deep well layer 13 and the $p^+$-type impurity region 2. As a result, the current may be concentrated so that the semiconductor device may be broken.

To prevent this, according to the present embodiment, the mixed region 15 having the $n^+$-type impurity regions 3 scattered in the $p^+$-type impurity region 2 is formed in the outer edge of the cell region. In such an approach, the parasitic PNP transistor is less likely to be turned ON. Accordingly, the tolerance of the semiconductor device can be improved. In addition, since re-injection of holes can be reduced, a switching loss can be reduced.

Twenty-First Embodiment

The twenty-first embodiment of the present invention will be described below. The present embodiment is provided by modifying the structure of the mixed region 15 in the twentieth embodiment. The others are the same as those of the twentieth embodiment. Only the difference from the twentieth embodiment will be described below.

Figure 39:
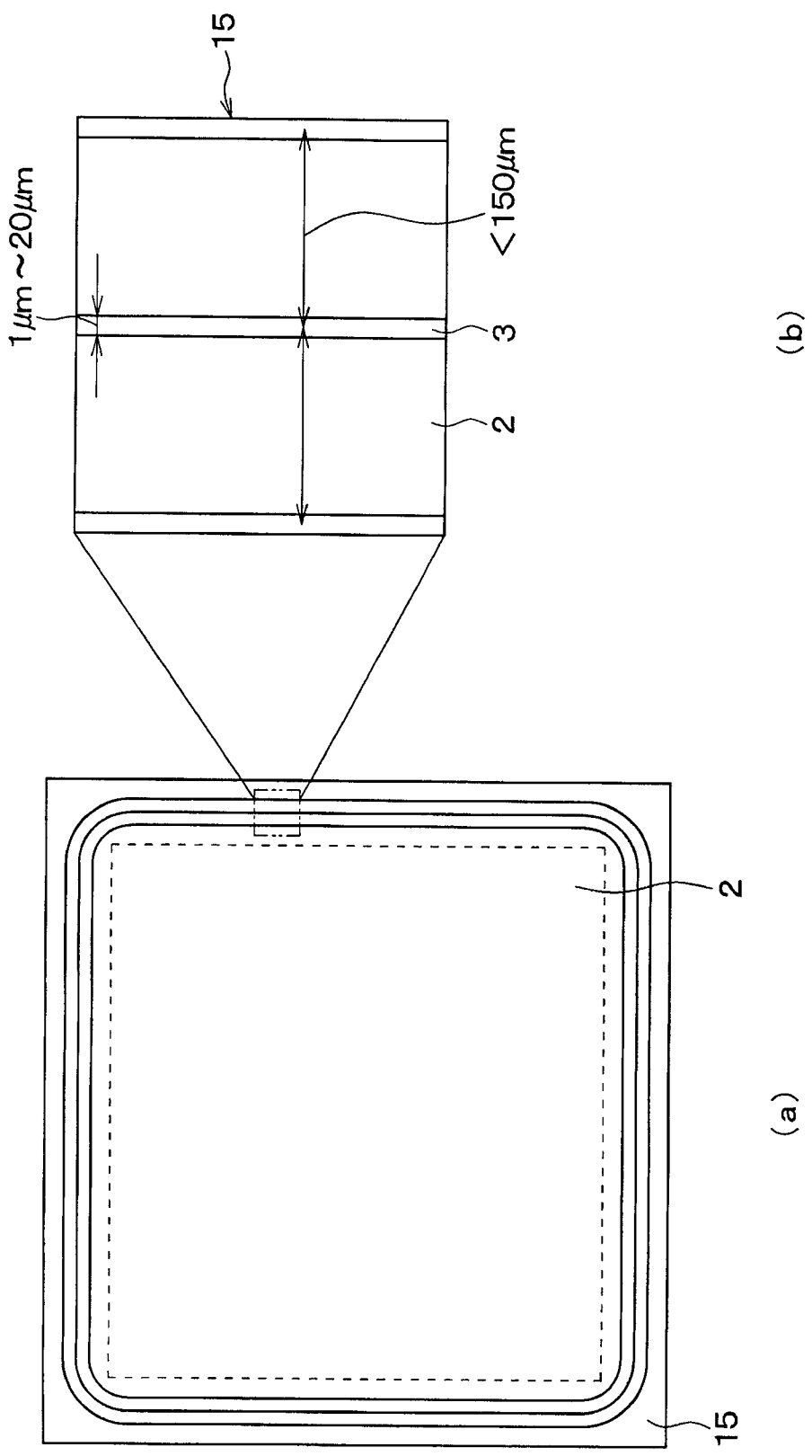
FIG. 39(a) is a diagram showing a layout of a back side of a substrate in a cell region.
FIG. 39(b) is a partial enlarged diagram of FIG. 39(a)

FIG. 39(a) is a diagram showing the layout on the back side of the substrate in the cell region, and FIG. 39(b) is a partly enlarged diagram of FIG. 39(a). Actually, the $n^+$-type impurity region 3 corresponding to a cathode region is formed in the cell region. However, since various layouts described in relation to, for example, the twelfth to nineteenth embodiments can be adopted, illustration of the n$^+$-type impurity region 3 is omitted from FIG. 39(a).

As shown in FIGS. 39(a) and 39(b), in the present embodiment, the periphery of the cell region is surrounded by the n$^+$-type impurity regions 3 formed in the mixed region 15. The width of the n$^+$-type impurity region 3 formed in the mixed region 15 is set to 20 μm or less and thus can be equal to or smaller than the diffusion length defined by the diffusion coefficient (=dτ$^{1/2}$). Further, the distance between adjacent n$^+$-type impurity regions 3 is set to a value less than 150 μm. In such an approach, a significant increase in a current density during steady-state or during switching is prevented so that the IGBT 100 in the mixed region 15 can be less likely to be turned ON. Thus, the same advantage as that of the twentieth embodiment can be achieved.

Twenty-Second Embodiment

The twenty-second embodiment of the present invention will be described below. The present embodiment is also provided by modifying the structure of the mixed region 15 in the twentieth embodiment. The others are the same as those of the twentieth embodiment. Only the difference from the twentieth embodiment will be described below.

Figure 40:
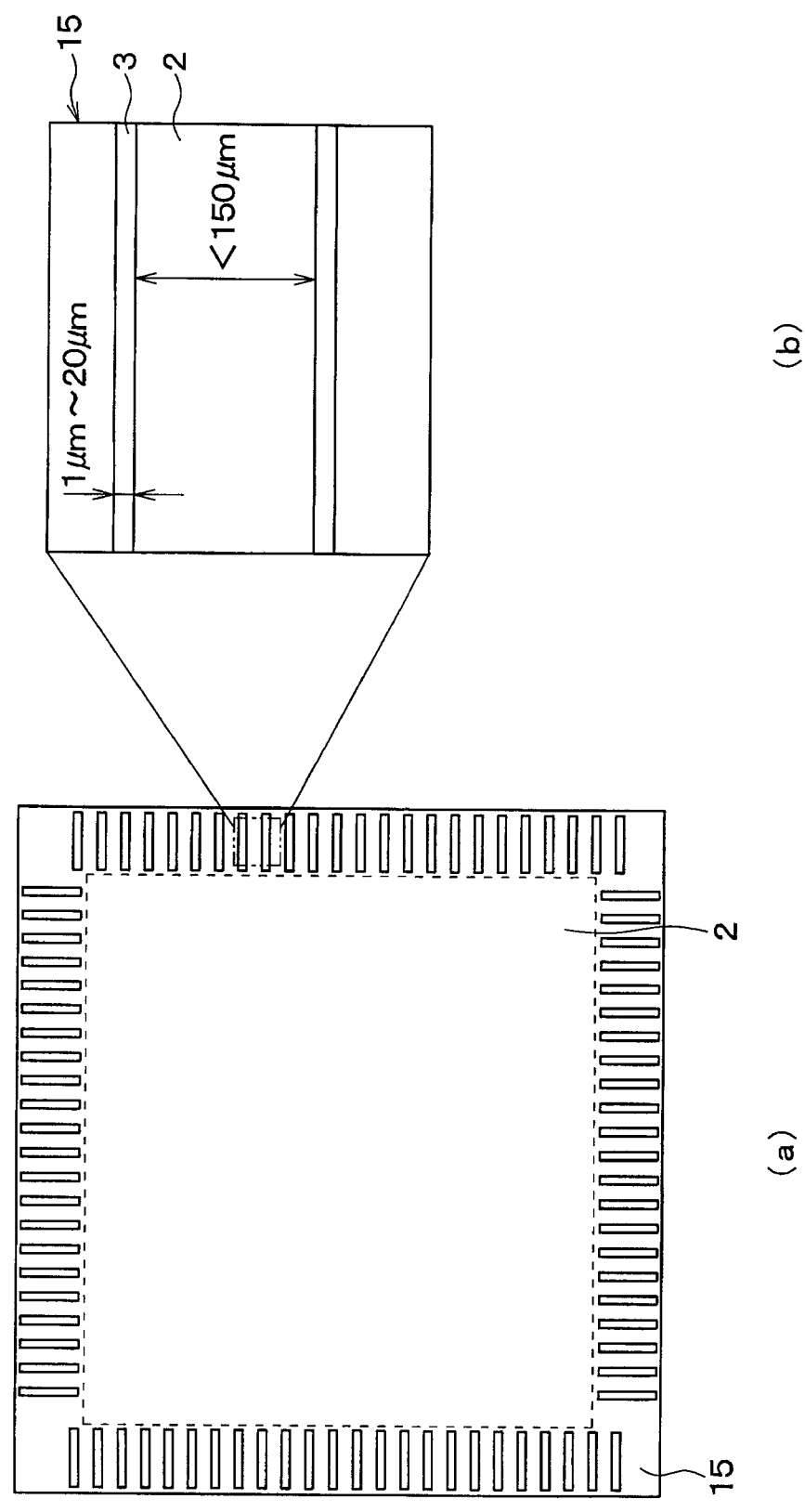
FIG. 40(a) is a diagram showing a layout of a back side of a substrate in a cell region.
FIG. 40(b) is a partial enlarged diagram of FIG. 40(a)

FIG. 40(a) is a diagram showing the layout on the back side of the substrate in the cell region, and FIG. 40(b) is a partly enlarged diagram of FIG. 40(a). Actually, the n$^+$-type impurity region 3 corresponding to a cathode region is formed in the cell region. However, since various layouts described in relation to, for example, the twelfth to nineteenth embodiments can be adopted, illustration of the n$^+$-type impurity region 3 is omitted from FIG. 40(a).

As shown in FIG. 40(a) and FIG. 40(b), in the present embodiment, the cell region is shaped like a rectangular, and the n$^+$-type impurity region 3 formed in the mixed region 15 extends perpendicular to the side of the cell region. The width of the n$^+$-type impurity regions 3 formed in the mixed region 15 ranges from 1 μm to 20 μm and thus can be equal to or smaller than the diffusion length defined by a diffusion coefficient (=dτ$^{1/2}$). Further, the distance between adjacent n$^+$-type impurity regions 3 is set to a value less than 150 μm. In such an approach, a significant increase in a current density during steady-state or during switching is prevented so that the IGBT 100 in the mixed region 15 can be less likely to be turned ON. Thus, the same advantage as that of the twentieth embodiment can be achieved.

Twenty-Third Embodiment

The twenty-third embodiment of the present invention will be described below. The present embodiment is provided by modifying the structure of the mixed region 15 in the twenty-first embodiment. The others are the same as those of the twenty-first embodiment. Only the difference from the twenty-first embodiment will be described below.

Figure 41:
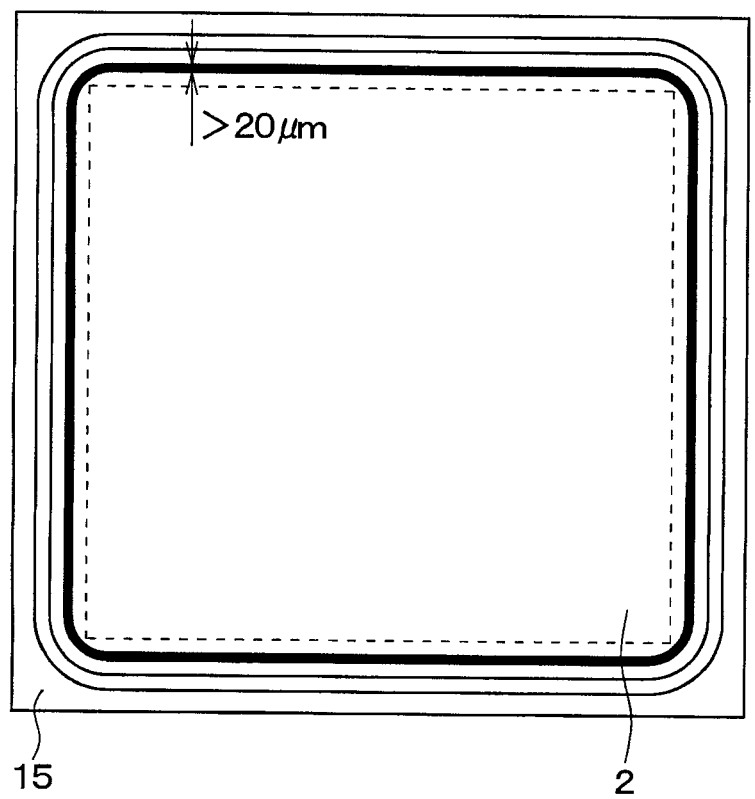
FIG. 41 is a diagram showing a layout of a back side of a substrate in a cell region.

FIG. 41 is a diagram showing the layout on the back side of the substrate in the cell region. Actually, the n$^+$-type impurity region 3 corresponding to a cathode region is formed in the cell region. However, since various layouts described in relation to, for example, the twelfth to nineteenth embodiments can be adopted, illustration of the n$^+$-type impurity region 3 is omitted from FIG. 41.

As shown in the drawing, in the present embodiment, the periphery of the cell region is surrounded by multiple n$^+$-type impurity regions 3 formed in the mixed region 15. The width of the innermost n$^+$-type impurity region 3 is larger than the width of the other n$^+$-type impurity regions 3 that are located far away form the cell region than the innermost n$^+$-type impurity region 3. Specifically, the width of the innermost n$^+$-type impurity region 3 is large than 20 μm and thus can be larger than the diffusion length defined by the diffusion coefficient (=dτ$^{1/2}$).

When the distance between the n$^+$-type impurity regions 3 formed in the mixed region 15 is large, the IGBT 100 will be likely to be turned ON during steady-state or during switching due to a larger current density. To prevent this, the width of the innermost n$^+$-type impurity region 3 is made larger so that the current density in a region outside the innermost n$^+$-type impurity region 3 can be reduced. In such an approach, a significant increase in a current density during steady-state or during switching is prevented so that the IGBT 100 in the mixed region 15 can be less likely to be turned ON.

Other Embodiments (1) In the embodiments, examples of the semiconductor device including the IGBT 100 and the FWD 200 are described. The embodiments can be modified, for example, by modifying the shape of components. For example, in the second to the twenty-third embodiments, the structure including the first to the third regions has been described. In the fourth to eighth embodiments, the region, enclosed by the broken line in the drawing, having no n$^+$-type impurity region 5 corresponding to an emitter region is formed to have the same structure as the second region. However, the structures described in relation to the embodiments are mere examples. The structures of the first to the third regions, or the structure of the region in the fourth to the eighth embodiments, enclosed by the broken line in the drawings, can be modified.

Figure 42:
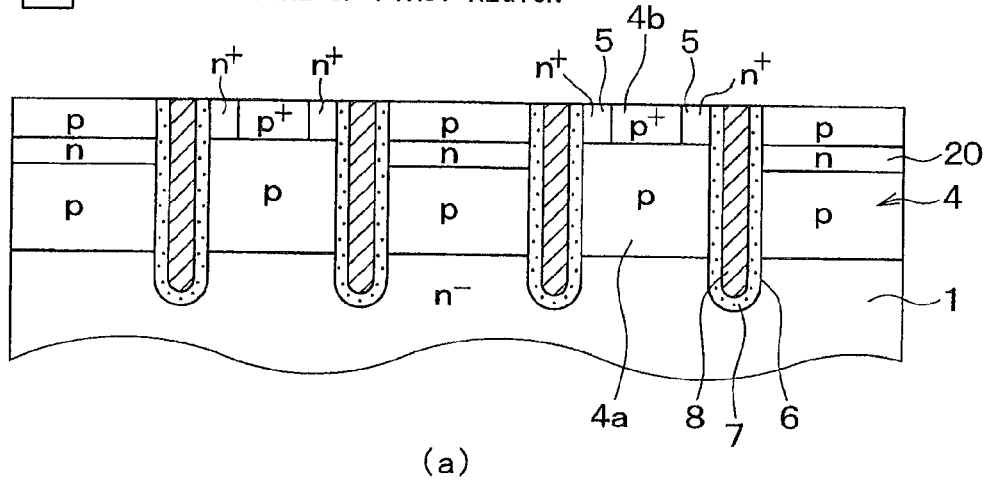
FIGS. 42(a)-42(c) are cross-sectional diagrams showing examples of a cell structure of first regions and a cell structure of second and third regions.
Figure 42:
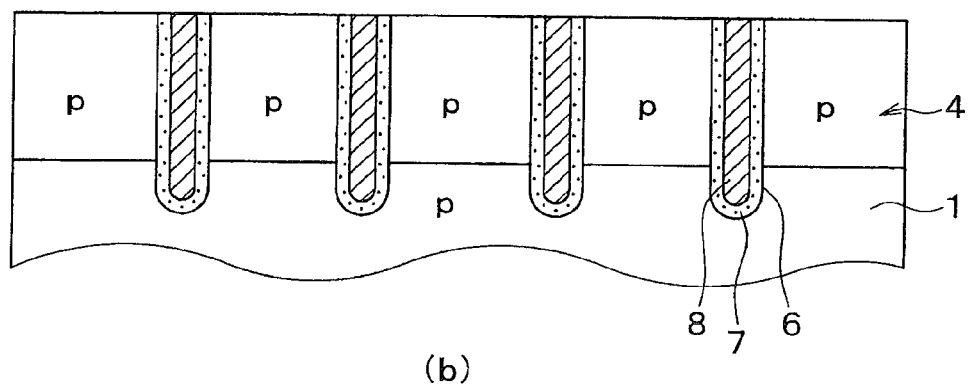
Figure 42:
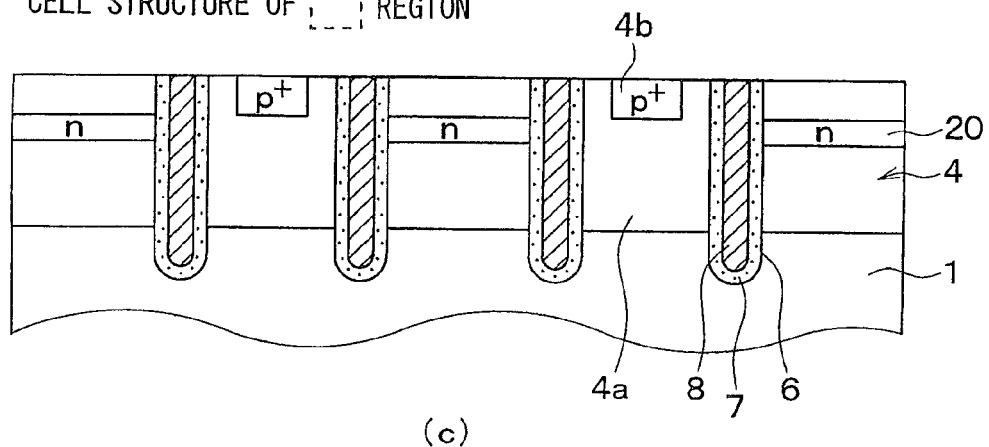

FIG. 42(a) to FIG. 42(c) are cross-sectional diagrams showing examples of a cell structure of the first region, a cell structure of the second and third regions, and a cell structure of the region enclosed by the broken line in the drawing in relation to the fourth to the eighth embodiments.

As shown in FIG. 42(a), the first region can have the spaced structure, where the region acting as the IGBT is reduced, by not forming a n$^+$-type impurity region 5 corresponding to an emitter region. A n-type region (hole stopper layer) 20 can be formed in the p-type base region 4 in the spaced portion so that the n-type region 20 can link adjacent trench gate structures.

In such a structure, when the IGBT 100 performs an IGBT action, carriers are accumulated at a position below the n-type region 20 in the p-type base region 4. That is, if the n-type region 20 is not formed, holes flow toward the upper electrode 10 through the p-type base region 4 so that the ON-voltage can be increased. In order to reduce the ON-voltage, it is preferable that carriers be accumulated during an IGBT action as much as possible so that conductivity modulation can occur. To this end, the n-type region 20 is formed so that carriers can be accumulated at the position below the n-type region 20 in the p-type base region 4. Thus, conductivity modulation is induced so that the ON-voltage can be reduced. Further, since the hole injection in the IGBT formation region during the diode action is reduced, a recovery property can be improved.

It is noted that a portion of the p-type base region 4 in the spaced portion above the n-type region 20 is grounded. When the IGBT 100 near the spaced portion performs an IGBT action, a short-circuit occurs between the collector and the emitter. Therefore, there is a possibility that the FWD 200 formed in the spaced portion may not perform a diode action.

To prevent this, the p-type base region 4 is grounded so that the FWD 200 formed in the spaced portion can surely perform a diode action.

As shown in FIG. 42(b), all of the second and third regions can be configured as the spaced portion. Further, as shown in FIG. 42(c), the region enclosed by the broken line in the drawing in relation to the fourth to eighth embodiments can have a structure obtained by merely removing the n⁺-type impurity region 5 corresponding to an emitter region from the structure of the first region shown in FIG. 42(a). In this case, if the second region has the structure shown in FIG. 42(b), the region enclosed by the broken line in the drawing in relation to any of the fourth to eighth embodiments has a structure different from the structure of the second region. However, no problem occurs.

(2) In the embodiments, a description has been made by citing, fundamentally, a n-channel type IGBT that exhibit an n-type as the first conductivity type and a p-type as the second conductivity type. Alternatively, a p-channel type IGBT whose regions exhibit reverse conductivity types may be adopted. In this case, components other than the IGBT are structured to exhibit the reverse conductivity types. In the first embodiment, a trench gate structure has been described. Even in the case of an IGBT having a lateral gate structure, if the distances W1 to W3 have the same relationship as described in the first embodiment, the same advantage as the first embodiment can be achieved. Further, some embodiments can be applied to a DMOS.

(3) In the first embodiment, a structure having the FS layer 1a has been cited as an example. Alternatively, only the p⁺-type impurity region 2 and the n⁺-type impurity region 3 without the FS layer 1a can be formed on the back side of the n⁻-type drift layer 1.

What is claimed is:

1. A semiconductor device including a cell region and a peripheral region, the cell region having a freewheeling diode and a vertical insulated gate bipolar transistor surrounded by the freewheeling diode, the peripheral region having a peripheral dielectric-strength structure that surrounds the cell region, the semiconductor device comprising:
   a first conductivity type drift layer;
   a second conductivity type collector region located on a back side of the drift layer in the cell region and peripheral region;
   a first conductivity type cathode region located on the back side of the drift layer in the cell region at a position where the collector region is not located;
   a second conductivity type base region located in a superficial part of a front side of the drift layer in the cell region at positions where the insulated gate bipolar transistor and the freewheeling diode are located;
   a first conductivity type emitter region located in a superficial part of the base region;
   a gate insulating film located on a surface of the base region between the emitter region and the drift layer;
   a gate electrode located on the gate insulating film;
   a second conductivity type deep well layer located in the superficial part of the front side of the drift layer in the cell region at the position where the freewheeling diode is located, the deep well layer located to surround a periphery of the base region and connected to the base region, the deep well layer being deeper than the base region and having an impurity concentration greater than that of the base region;
   an upper electrode electrically connected to the emitter region, the base region, and the deep well layer; and
   a lower electrode electrically connected to the collector region and the cathode region, wherein
   the emitter region is not formed in at least one region between a plurality of gate structures to define a first region and a second region,
   the emitter region is formed in the first region so that the first region acts as the insulated gate bipolar transistor,
   the emitter region is not formed in the second region so that the second region acts as the freewheeling diode,
   a portion located to surround the insulated gate bipolar transistor is defined as a third region acting as the freewheeling diode,
   each of the first region and the second region has a longitudinal direction in a planar surface of the drift layer parallel to the longitudinal direction in the planar surface of the drift layer of the plurality of gate structures and,
   the first region is divided in the longitudinal direction into multiple regions,
   the second region is located adjacent to the first region, $W \geq 2 \times L1/K^{1/2}$, where $K \geq 2.5$, W denotes a distance between the multiple regions
   L1 denotes a thickness of the drift layer,
   k1 denotes a parameter that depends on structures of the insulated gate bipolar transistor and the freewheeling diode, and
   K denotes a value calculated by multiplying the parameter k1 by a ratio of a snapback voltage to a built-in potential between the deep well layer and the drift layer.

2. The semiconductor device according to claim 1, wherein a width of the second region is 20 μm or more.

3. The semiconductor device according to claim 1, wherein a region adjacent to the first region is filled with the base region and acts as the freewheeling diode.

4. The semiconductor device according to claim 1, wherein the cathode region has a longitudinal direction parallel to the longitudinal direction of the first region, and
the first region extends beyond an end of the cathode region in the longitudinal direction.

5. The semiconductor device according to claim 1, wherein the multiple regions are further divided in the longitudinal direction,
a region adjacent to the further divided multiple regions has no emitter region and acts as the freewheeling diode, and
the cathode region is wider at a position corresponding to the region adjacent to the further divided multiple regions than at a position corresponding to the further divided multiple regions themselves.

6. The semiconductor device according to claim 1, wherein the cathode region has a region which is located at a position corresponding to the second region, and
the cathode region has a region which is located at a position corresponding to the first region and narrower than the region located at the position corresponding to the second region.

7. The semiconductor device according to claim 1, wherein a mixed region is located on the back side of the drift layer on an outer edge of the cell region, and
the mixed region has both the collector region and the cathode region.

8. The semiconductor device according to claim 1, further comprising:
a first conductivity type field stop layer located on the back side of the drift layer in the cell region and the peripheral region, wherein
an impurity concentration of the field stop layer is greater than that of the drift layer, and the collector region and the cathode region are located in a superficial part of the field stop layer.

9. The semiconductor device according to claim 1, further comprising:
a plurality of trenches penetrating the base region, wherein
the plurality of trenches have a longitudinal direction and are arranged at a predetermined interval, and
the gate insulating film and the gate electrode are located in each trench to form a trench gate structure.

* * * * *